United States Patent
Shirakawa et al.

(10) Patent No.: US 12,334,171 B2
(45) Date of Patent: Jun. 17, 2025

(54) CONTROLLING MEMORY INCLUDING MANAGING A CORRECTION VALUE TABLE

(71) Applicant: KIOXIA CORPORATION, Tokyo (JP)

(72) Inventors: Masanobu Shirakawa, Chigasaki (JP);
Hideki Yamada, Yokohama (JP);
Marie Takada, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/453,567

(22) Filed: Aug. 22, 2023

(65) Prior Publication Data

US 2023/0395178 A1 Dec. 7, 2023

Related U.S. Application Data

(62) Division of application No. 17/202,432, filed on Mar. 16, 2021, now Pat. No. 11,776,651.

(30) Foreign Application Priority Data

Sep. 18, 2020 (JP) .................................. 2020-157850

(51) Int. Cl.
*G11C 29/42* (2006.01)
*G11C 29/12* (2006.01)
(Continued)

(52) U.S. Cl.
CPC ........ *G11C 29/42* (2013.01); *G11C 29/12005* (2013.01); *G11C 29/20* (2013.01);
(Continued)

(58) Field of Classification Search
CPC ... G11C 29/42; G11C 29/12005; G11C 29/20; G11C 2029/1202; G11C 2029/1204; G11C 2029/1802
See application file for complete search history.

(56) References Cited

U.S. PATENT DOCUMENTS 10,158,380 B2   12/2018  Sharon et al.
2017/0243654 A1*  8/2017  Abe ....................... H10B 43/27
                          (Continued)

FOREIGN PATENT DOCUMENTS

JP    2016-51486 A    4/2016
JP    2020-047312 A   3/2020
(Continued)

*Primary Examiner* — Alfredo Bermudez Lozada
(74) *Attorney, Agent, or Firm* — Oblon, McClelland, Maier & Neustadt, L.L.P.

(57) ABSTRACT

A memory system according to an embodiment includes a memory device, and a memory controller. The memory device includes first and second memory cells, a first word line, and first and second bit lines. The first and second memory cells are provided in first and second layers, respectively. The first word line is coupled to the first memory cell and the second memory cell. The first bit line is coupled to the first memory cell. The second bit line is coupled to the second memory cell. The memory controller includes a storage circuit capable of storing a correction value table. The correction value table is configured to store a first correction value of a read voltage associated with the first layer and a second correction voltage of a read voltage associated with the second layer.

15 Claims, 41 Drawing Sheets

(51) Int. Cl.
   *G11C 29/20* (2006.01)
   *G11C 29/18* (2006.01)
(52) U.S. Cl.
   CPC ............... *G11C 2029/1202* (2013.01); *G11C 2029/1204* (2013.01); *G11C 2029/1802* (2013.01)

(56) References Cited

U.S. PATENT DOCUMENTS

| | | |
|---|---|---|
| 2020/0050513 A1 | 2/2020 | Kim et al. |
| 2020/0090761 A1 | 3/2020 | Ando et al. |
| 2020/0090763 A1 | 3/2020 | Tokutomi et al. |
| 2022/0068402 A1 | 3/2022 | Yamada et al. |

FOREIGN PATENT DOCUMENTS

| | | |
|---|---|---|
| JP | 2020-047318 A | 3/2020 |
| JP | 2022-41503 A | 3/2022 |

* cited by examiner

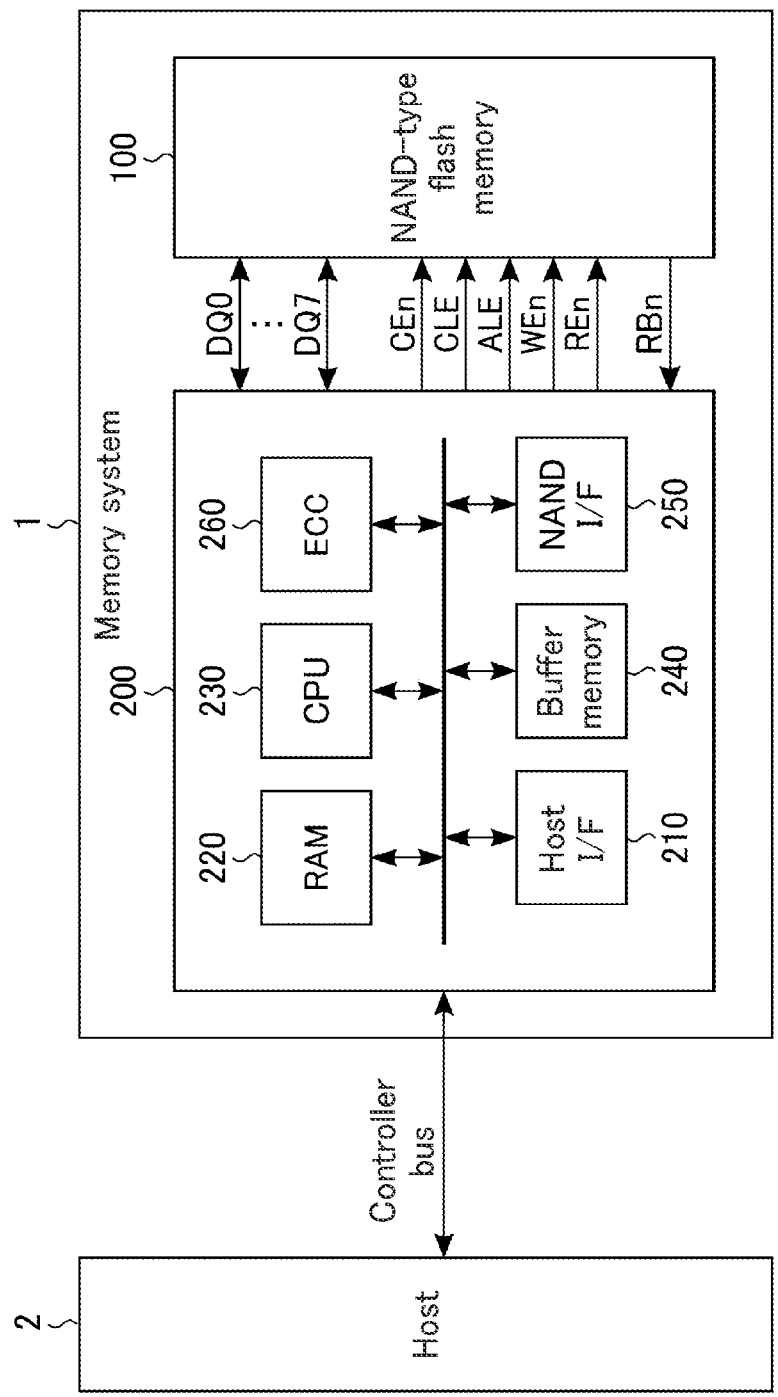
F I G. 1

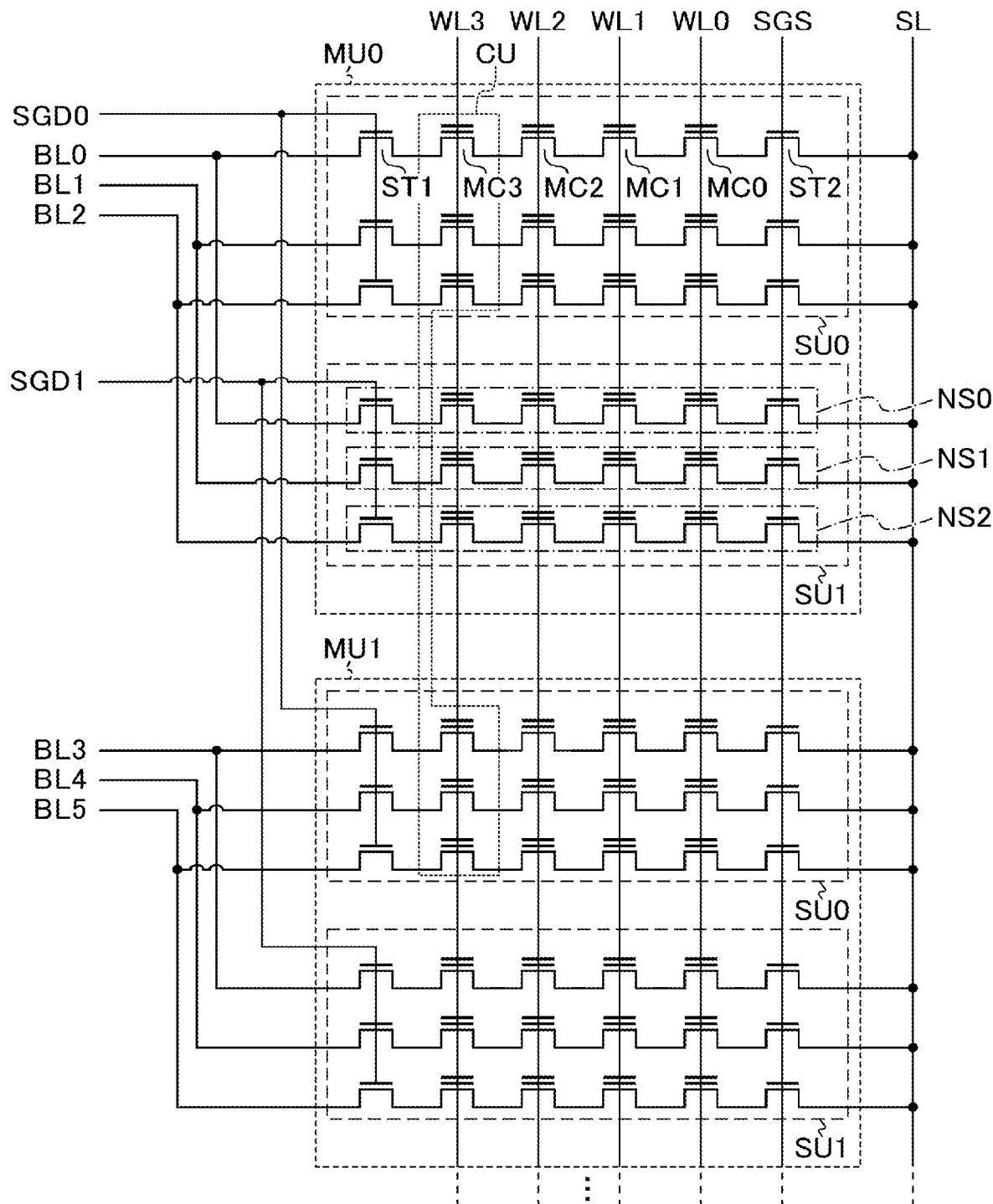
F I G. 3

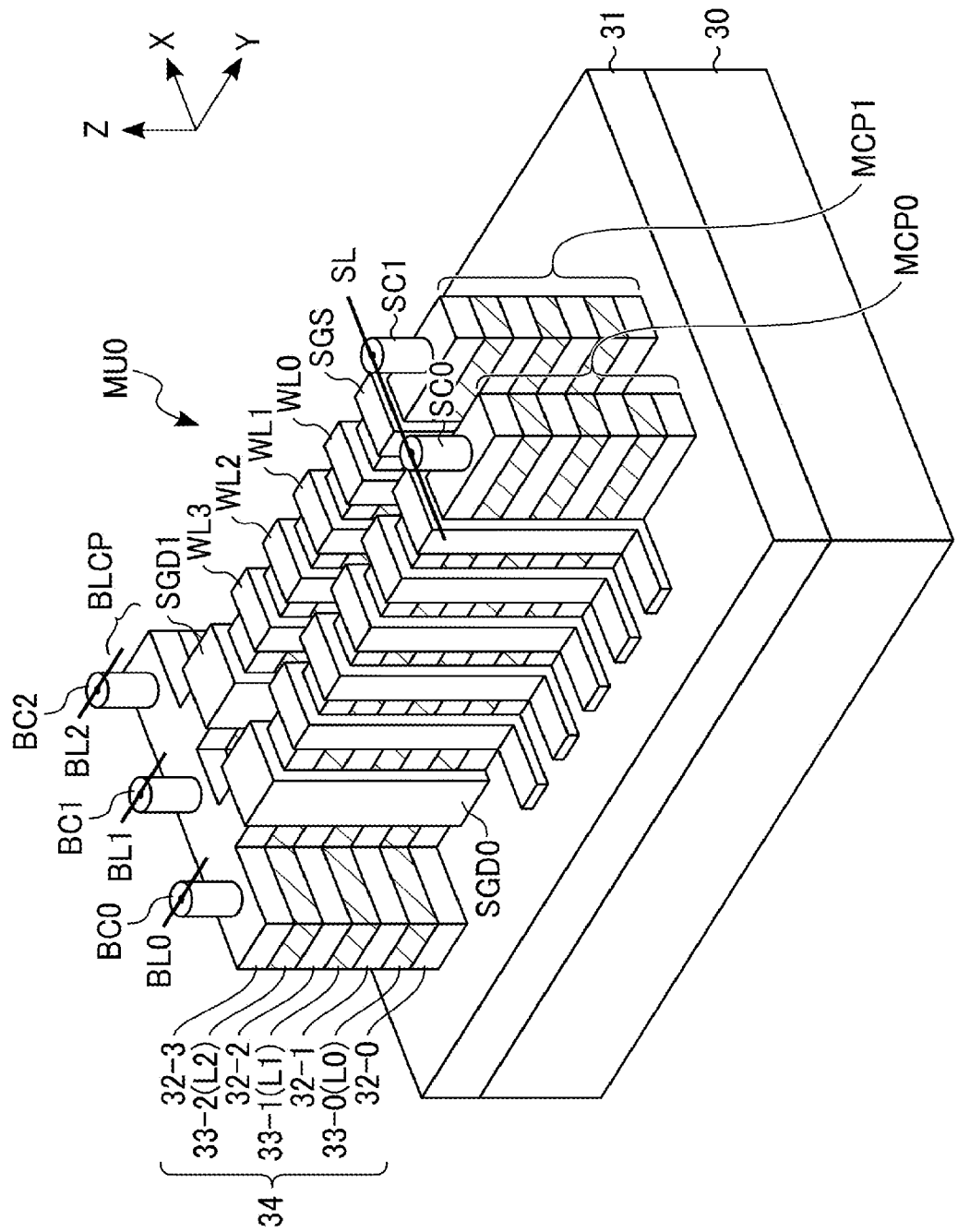
F I G. 4

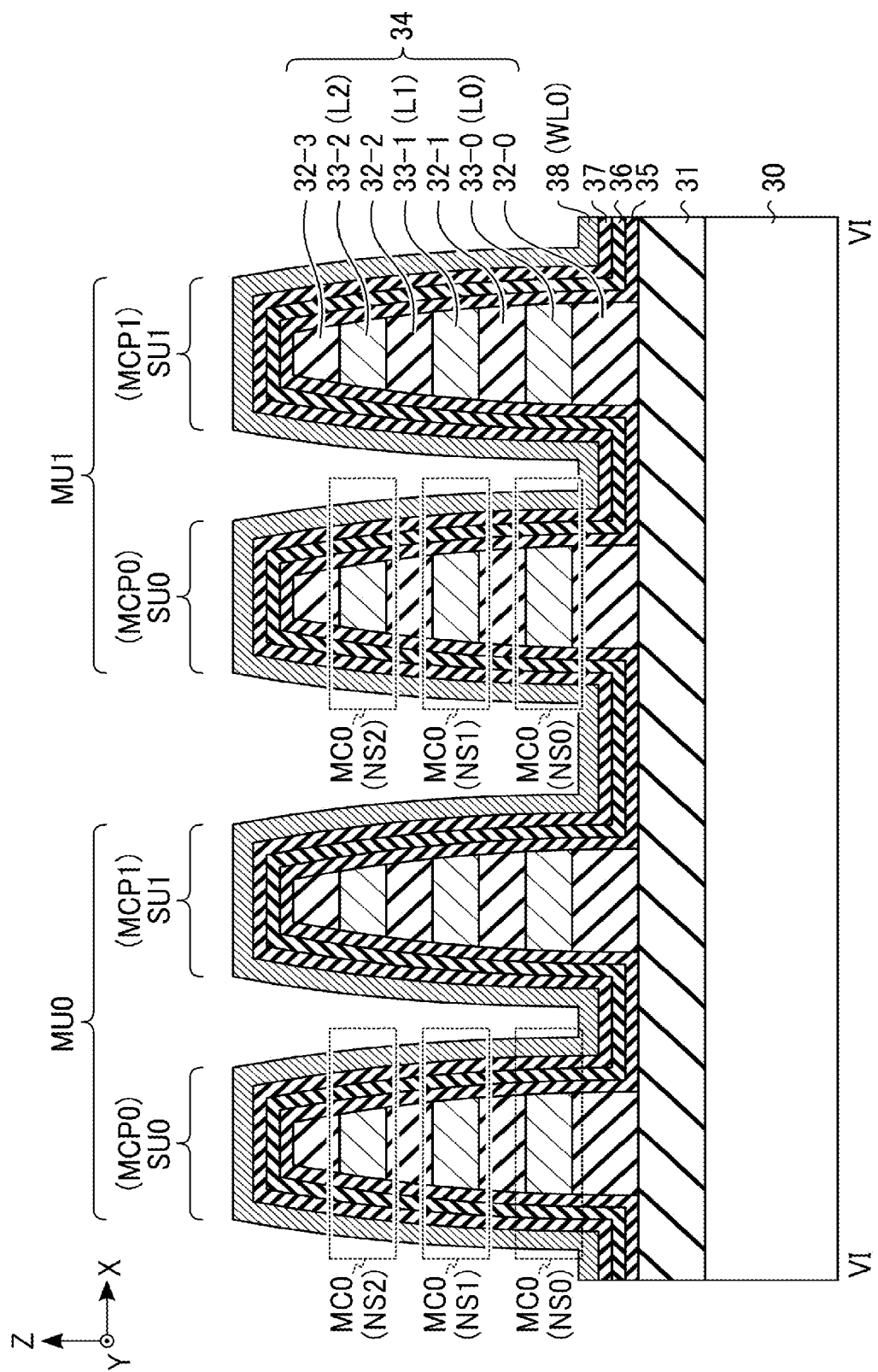
F I G. 6

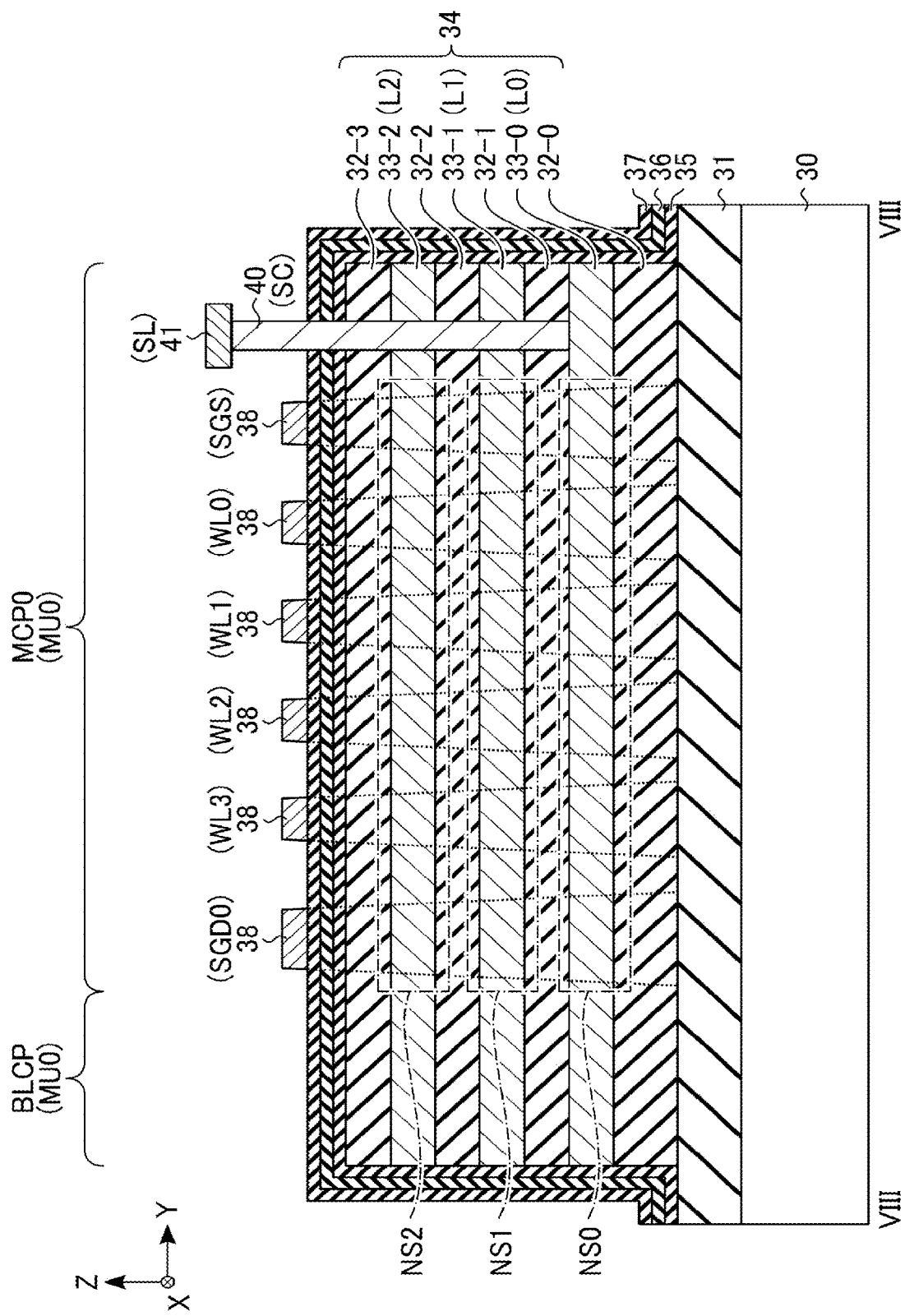
F I G. 8

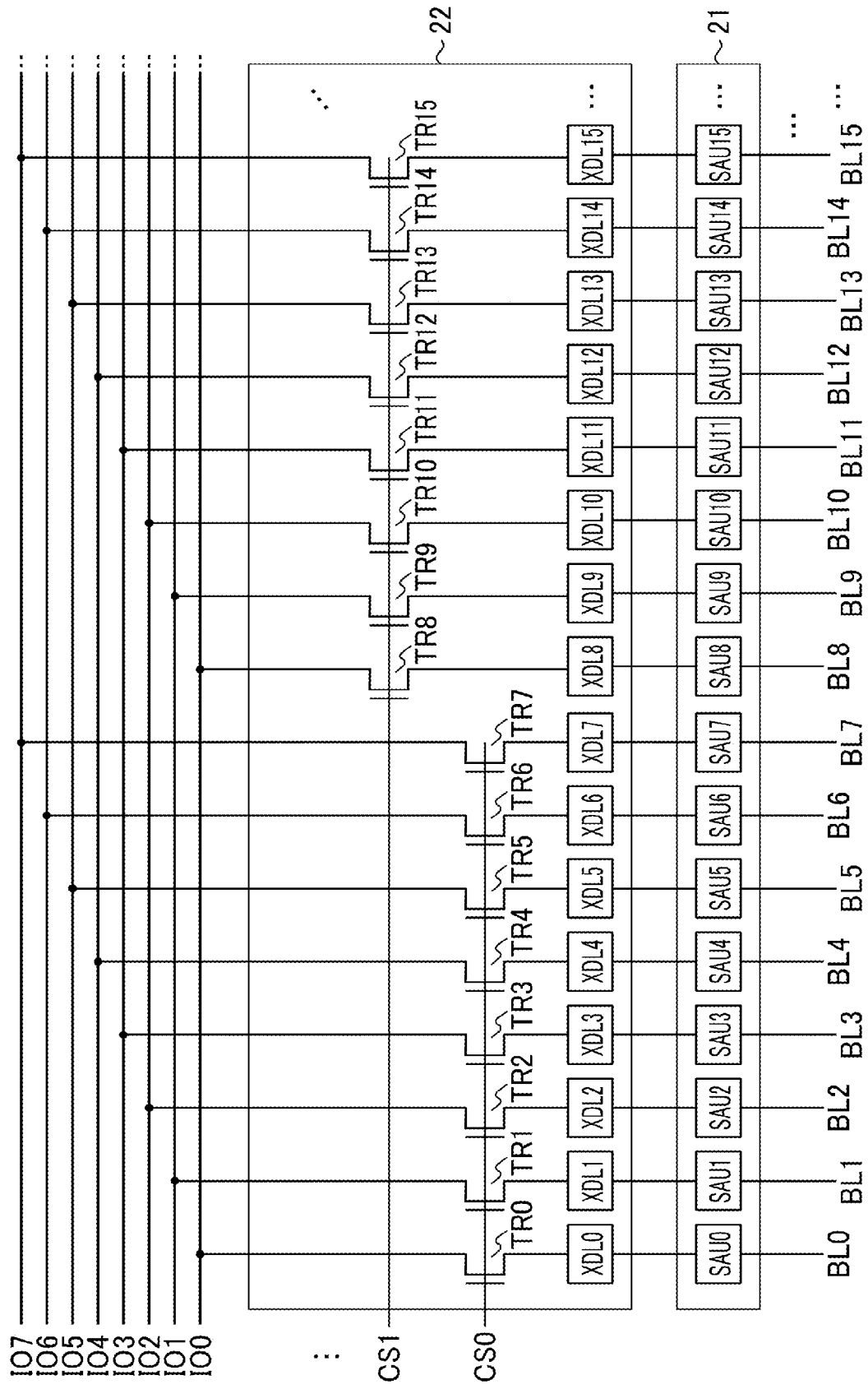
F I G. 12

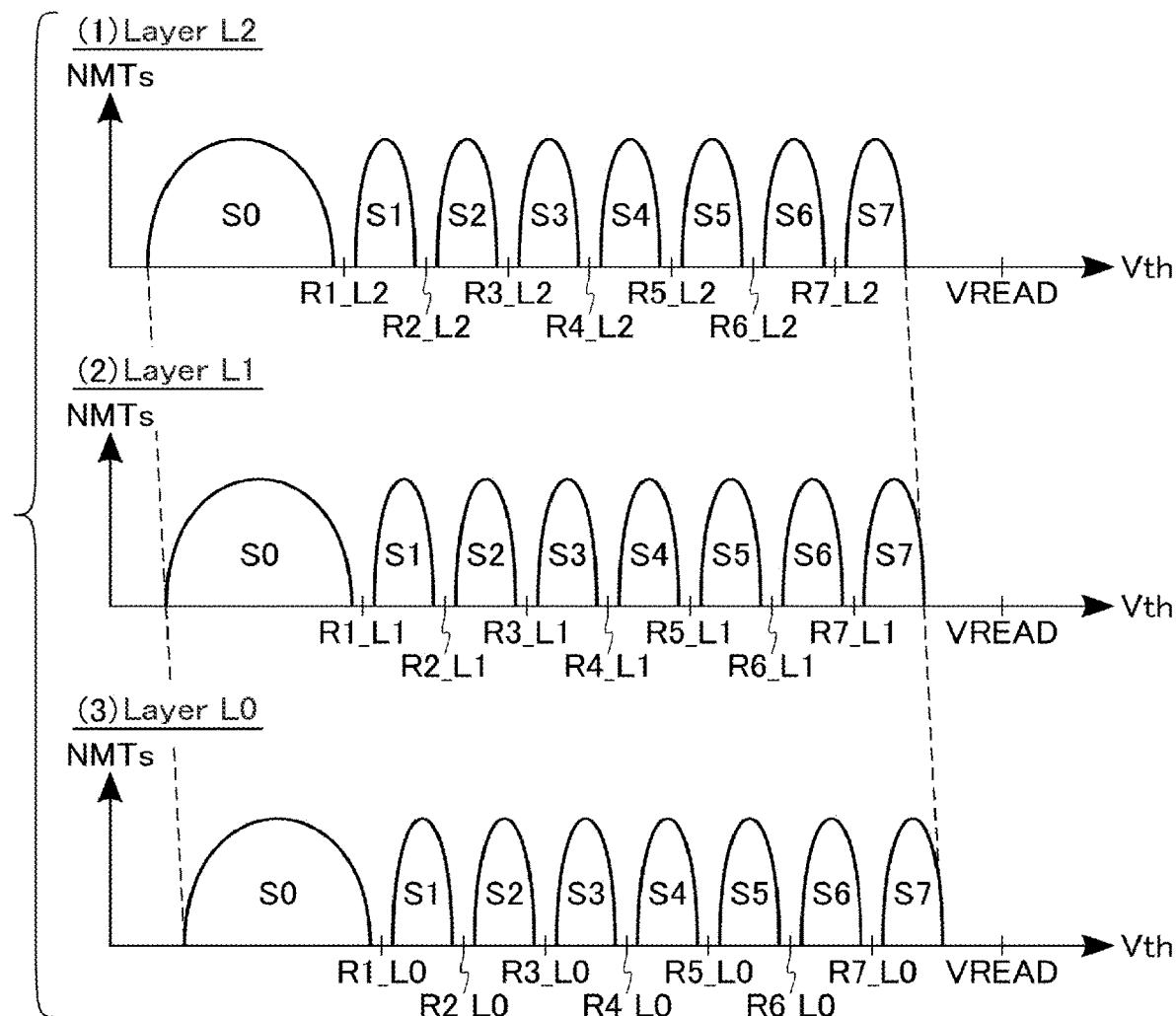
F I G. 15

(1) Lower-page read
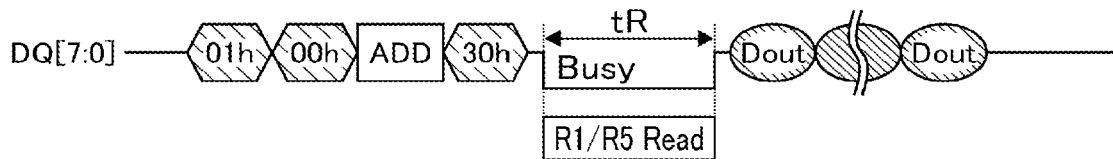
(2) Middle-page read
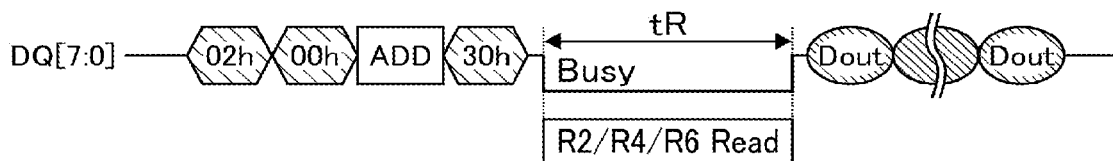
(3) Upper-page read
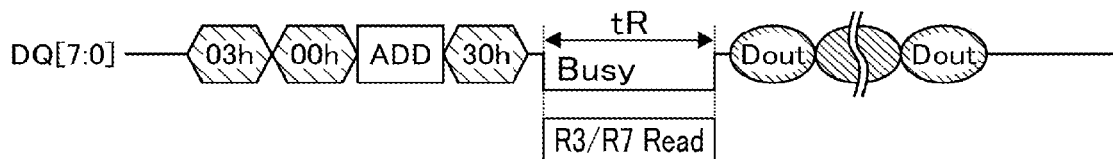
F I G. 16
Shift read
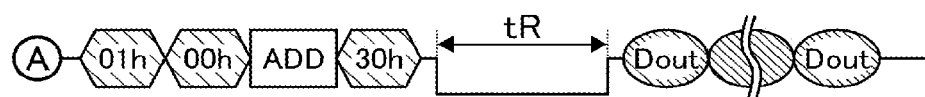
F I G. 17

| Target of operation | Allocation of parameters | | | |
|---|---|---|---|---|
| | P0 | P1 | P2 | P3 |
| Lower-page read | 00h | ΔR1 | ΔR5 | - |
| Middle-page read | 01h | ΔR2 | ΔR4 | ΔR6 |
| Upper-page read | 02h | ΔR3 | ΔR7 | - |

F I G. 18

▨ Layer L0    ▱ Layer L1    ☐ Layer L2

| Output cycle of read data | Output signals | | | | | | | |
|---|---|---|---|---|---|---|---|---|
| | DQ0 | DQ1 | DQ2 | DQ3 | DQ4 | DQ5 | DQ6 | DQ7 |
| 1 | D0 | D1 | D2 | D3 | D4 | D5 | D6 | D7 |
| 2 | D8 | D9 | D10 | D11 | D12 | D13 | D14 | D15 |
| 3 | D16 | D17 | D18 | D19 | D20 | D21 | D22 | D23 |
| 4 | D24 | D25 | D26 | D27 | D28 | D29 | D30 | D31 |

F I G. 19

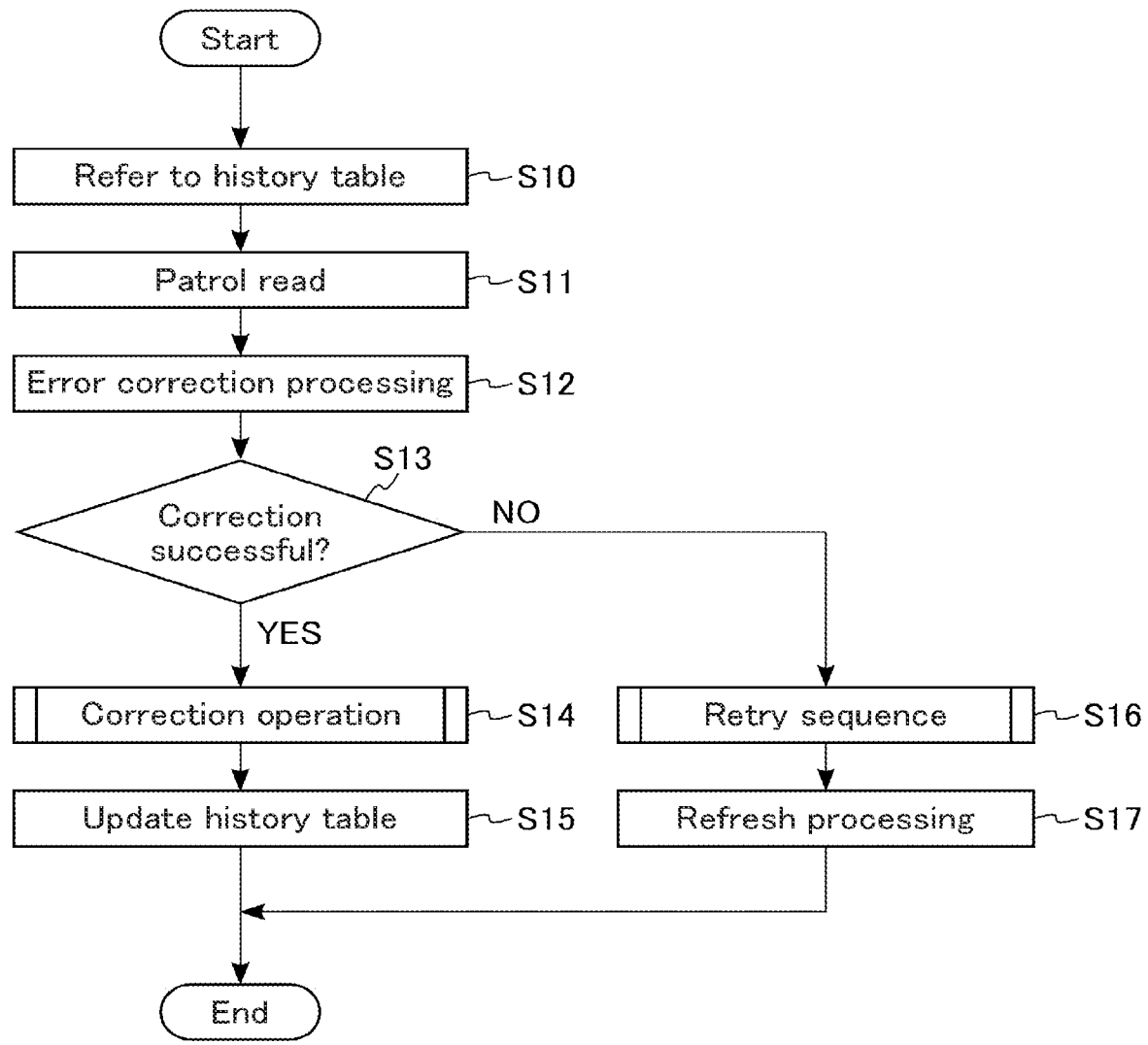
F I G. 20

| Number of failed bits FBC (=BFBC+TFBC) | | Failure ratio RAT (=BFBC/TFBC) | Shift amount DAC |
|---|---|---|---|
| Lower-tail failed bits BFBC | Upper-tail failed bits TFBC | | |
| 10 | 100 | 0.1 | +5 |
| 30 | 60 | 0.5 | +3 |
| 40 | 40 | 1 | 0 |
| 60 | 30 | 2 | -3 |
| 100 | 10 | 10 | -5 |

F I G. 22

| BLK | SU | WL | Layer | Correction values COL ||||||| 
|---|---|---|---|---|---|---|---|---|---|---|
| | | | | R1 | R2 | R3 | R4 | R5 | R6 | R7 |
| 0 | 0 | 0 | L0 | | | | | | | |
| 0 | 0 | 0 | L1 | | | | | | | |
| 0 | 0 | 0 | L2 | | | | | | | |
| 0 | 0 | 1 | L0 | | | | | | | |
| 0 | 0 | 1 | L1 | | | | | | | |
| 0 | 0 | 1 | L2 | | | | | | | |
| 0 | 0 | 2 | L0 | | | | | | | |
| 0 | 0 | 2 | L1 | | | | | | | |
| 0 | 0 | 2 | L2 | | | | | | | |
| 0 | 0 | 3 | L0 | | | | | | | |
| 0 | 0 | 3 | L1 | | | | | | | |
| 0 | 0 | 3 | L2 | | | | | | | |
| 0 | 1 | 0 | L0 | | | | | | | |
| 0 | 1 | 0 | L1 | | | | | | | |
| 0 | 1 | 0 | L2 | | | | | | | |
| 0 | 1 | 1 | L0 | | | | | | | |
| 0 | 1 | 1 | L1 | | | | | | | |
| 0 | 1 | 1 | L2 | | | | | | | |
| 0 | 1 | 2 | L0 | | | | | | | |
| 0 | 1 | 2 | L1 | | | | | | | |
| 0 | 1 | 2 | L2 | | | | | | | |
| 0 | 1 | 3 | L0 | | | | | | | |
| 0 | 1 | 3 | L1 | | | | | | | |
| 0 | 1 | 3 | L2 | | | | | | | |
| 1 | 0 | 0 | L0 | | | | | | | |
| 1 | 0 | 0 | L1 | | | | | | | |
| 1 | 0 | 0 | L2 | | | | | | | |
| 1 | 0 | 1 | L0 | | | | | | | |

FIG. 23

Correction operation: Lower page (Criteria: FBC<30 or 0.7<RAT<1.5)

(a) Result of first read operation

| Read voltage | R1 | R5 |
|---|---|---|
| Correction value COL | 0 | 0 |
| Number of failed bits FBC | 60 | 80 |
| Failure ratio RAT | 0.5 | 2 |

↓ +2DAC    ↓ −5DAC (b) Result of second read operation

| Read voltage | R1 | R5 |
|---|---|---|
| Correction value COL | +2 | −5 |
| Number of failed bits FBC | 25 | 50 |
| Failure ratio RAT | 0.8 | 0.5 |

"S1" pass

↓ +1DAC    ↓ +3DAC (c) Result of third read operation

| Read voltage | R1 | R5 |
|---|---|---|
| Correction value COL | +3 | −2 |
| Number of failed bits FBC | 20 | 40 |
| Failure ratio RAT | 1 | 1.2 |

"S5" pass

↓ −1DAC (d) Corrected read voltages

| Read voltage | R1 | R5 |
|---|---|---|
| Correction value COL | +3 | −3 |

F I G. 25

| Target of operation | Allocation of parameters | | | |
|---|---|---|---|---|
| | P0 | P1 | P2 | P3 |
| R1 read | 00h | – | – | – |
| R2 read | 01h | – | – | – |
| R3 read | 02h | – | – | – |
| R4 read | 03h | – | – | – |
| R5 read | 04h | – | – | – |
| R6 read | 05h | – | – | – |
| R7 read | 06h | – | – | – |

| Section | (1) | (2) | (3) | (4) | (5) | (6) | (7) | (8) | (9) | (10) | (11) | (12) |
|---|---|---|---|---|---|---|---|---|---|---|---|---|
| R3 | 0 | 0 | 0 | 0 | 0 | 0 | 1 | 1 | 1 | 1 | 1 | 1 |
| SFT1 | 1 | 0 | 0 | 0 | 0 | 0 | 0 | 1 | 1 | 1 | 1 | 1 |
| SFT2 | 1 | 1 | 0 | 0 | 0 | 0 | 0 | 0 | 1 | 1 | 1 | 1 |
| SFT3 | 1 | 1 | 1 | 0 | 0 | 0 | 0 | 0 | 0 | 1 | 1 | 1 |
| SFT4 | 1 | 1 | 1 | 1 | 0 | 0 | 0 | 0 | 0 | 0 | 1 | 1 |
| SFT5 | 1 | 1 | 1 | 1 | 1 | 0 | 0 | 0 | 0 | 0 | 0 | 1 |

| Output cycle of read data | Output signals | | | | | | | |
|---|---|---|---|---|---|---|---|---|
| | DQ0 | DQ1 | DQ2 | DQ3 | DQ4 | DQ5 | DQ6 | DQ7 |
| 1 | D0 | D1 | D2 | D3 | D4 | D5 | D6 | D7 |
| 2 | D8 | D9 | D10 | D11 | D12 | D13 | D14 | D15 |
| 3 | D16 | D17 | D18 | D19 | D20 | D21 | D22 | D23 |
⇩
| Layer targeted for counting | Read data targeted for counting | | | | | | | |
|---|---|---|---|---|---|---|---|---|
| | 1 | 2 | 3 | 4 | 5 | 6 | 7 | 8 |
| Layer L0 | D0 | D3 | D6 | D9 | D12 | D15 | D18 | D21 |
| Layer L1 | D1 | D4 | D7 | D10 | D13 | D16 | D19 | D22 |
| Layer L2 | D2 | D5 | D8 | D11 | D14 | D17 | D20 | D23 |
F I G. 34
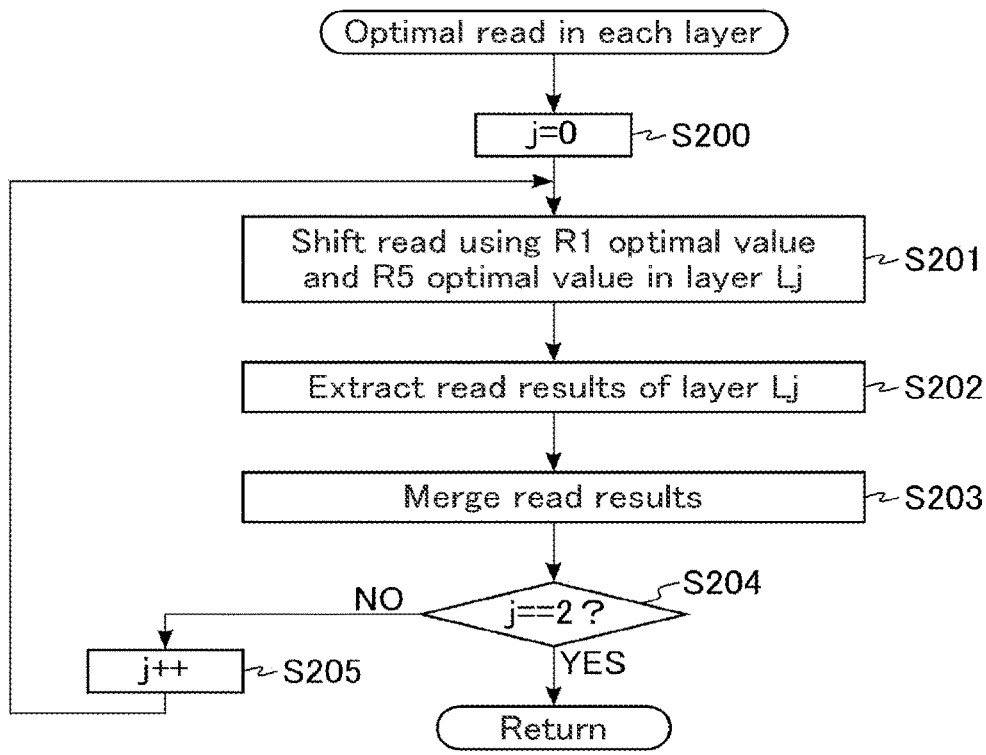
F I G. 35

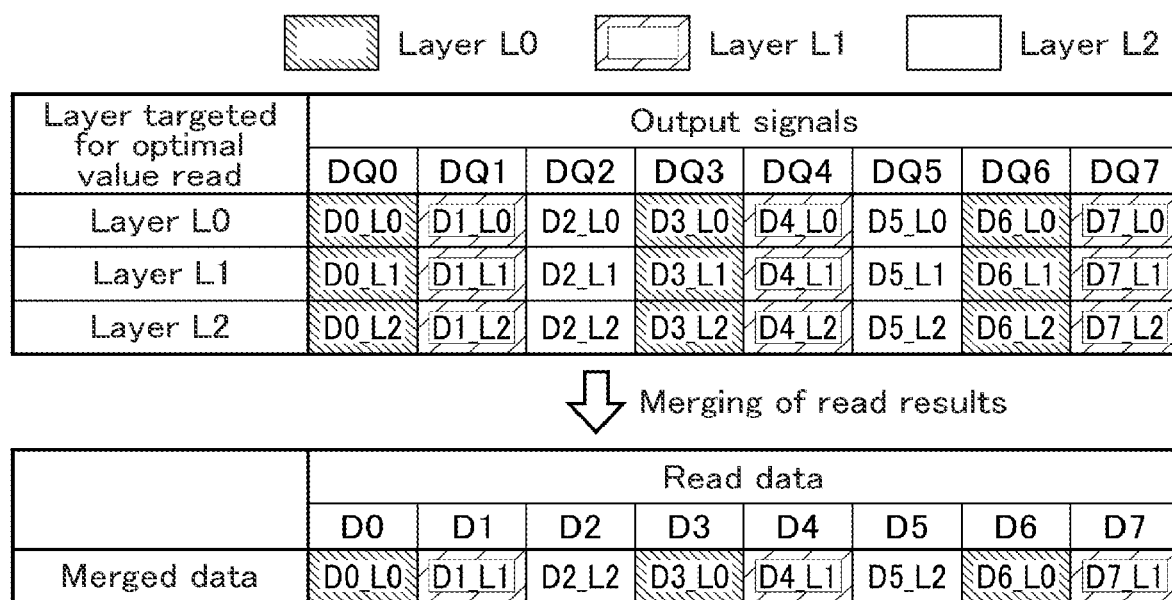
F I G. 36

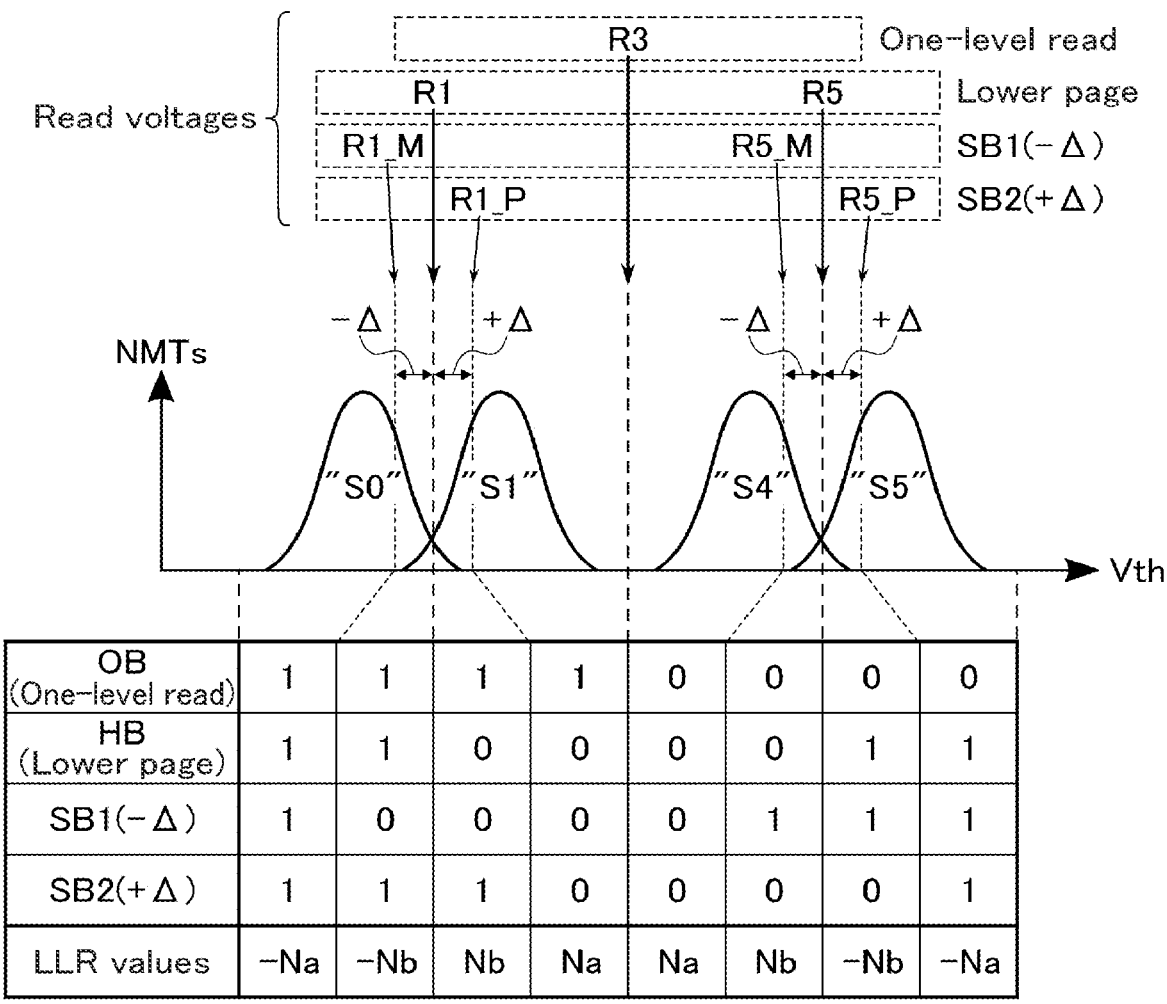
F I G. 39

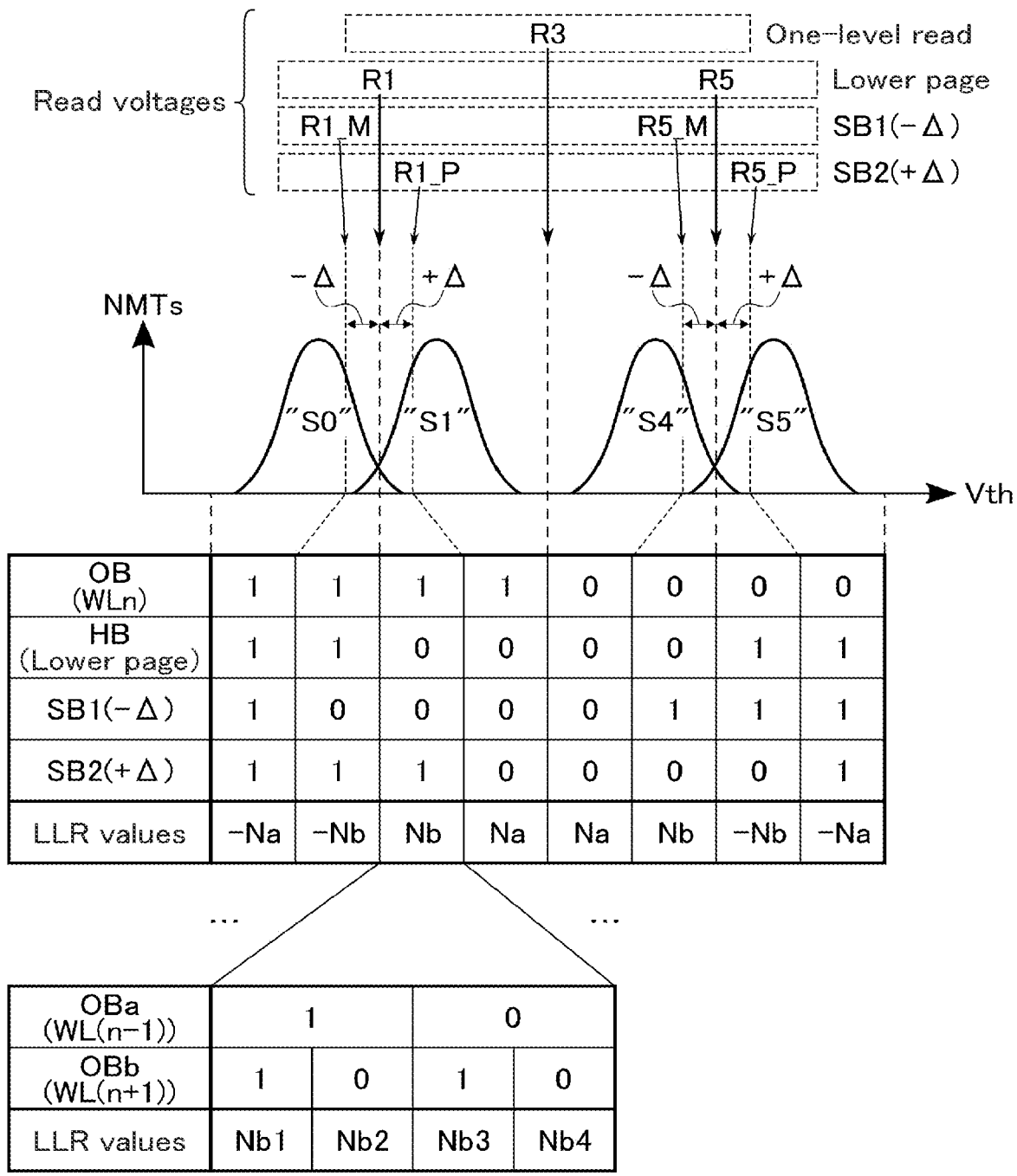
F I G. 42

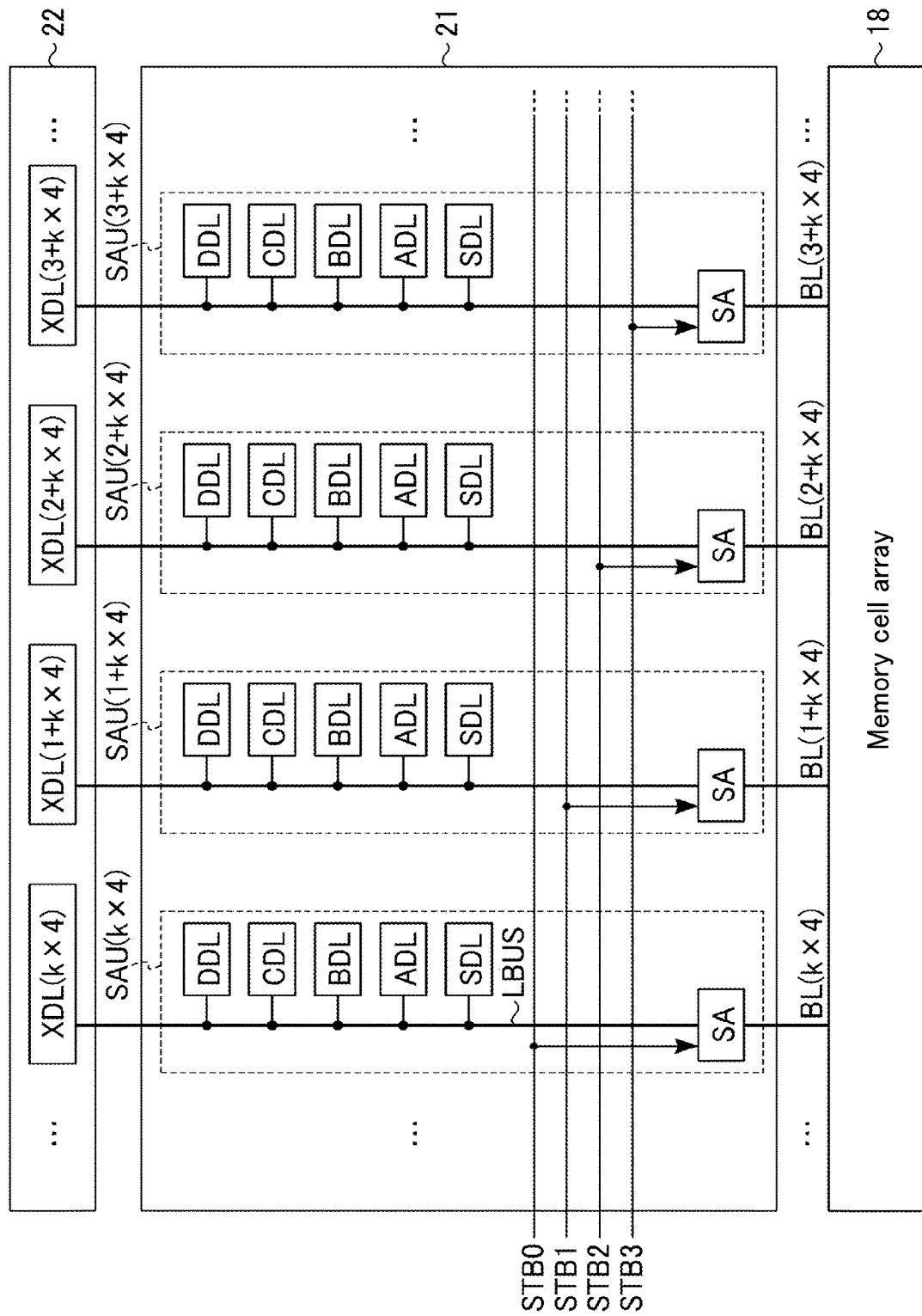
F I G. 44

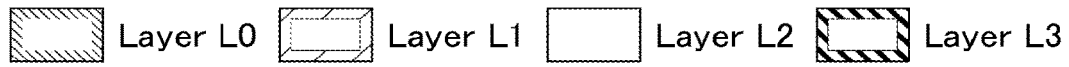

| Output cycle of read data | Output signals | | | | | | | |
|---|---|---|---|---|---|---|---|---|
| | DQ0 | DQ1 | DQ2 | DQ3 | DQ4 | DQ5 | DQ6 | DQ7 |
| 1 | D0 | D1 | D2 | D3 | D4 | D5 | D6 | D7 |
| 2 | D8 | D9 | D10 | D11 | D12 | D13 | D14 | D15 |
| 3 | D16 | D17 | D18 | D19 | D20 | D21 | D22 | D23 |
| 4 | D24 | D25 | D26 | D27 | D28 | D29 | D30 | D31 |
| 5 | D32 | D33 | D34 | D35 | D36 | D37 | D38 | D39 |

F I G. 45

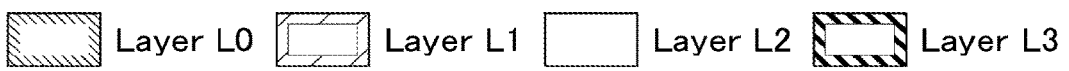

| Output cycle of read data | Output signals | | | | | | | |
|---|---|---|---|---|---|---|---|---|
| | DQ0 | DQ1 | DQ2 | DQ3 | DQ4 | DQ5 | DQ6 | DQ7 |
| 1 | D0 | D1 | D2 | D3 | D4 | D5 | D6 | D7 |
| 2 | D8 | D9 | D10 | D11 | D12 | D13 | D14 | D15 |
| 3 | D16 | D17 | D18 | D19 | D20 | D21 | D22 | D23 |
| 4 | D24 | D25 | D26 | D27 | D28 | D29 | D30 | D31 |

| Layer targeted for counting | Read data targeted for counting | | | | | | | |
|---|---|---|---|---|---|---|---|---|
| | 1 | 2 | 3 | 4 | 5 | 6 | 7 | 8 |
| Layer L0 (Extracting DQ0,4) | D0 | D4 | D8 | D12 | D16 | D20 | D24 | D28 |
| Layer L1 (Extracting DQ1,5) | D1 | D5 | D9 | D13 | D17 | D21 | D25 | D29 |
| Layer L2 (Extracting DQ2,6) | D2 | D6 | D10 | D14 | D18 | D22 | D26 | D30 |
| Layer L3 (Extracting DQ3,7) | D3 | D7 | D11 | D15 | D19 | D23 | D27 | D31 |

F I G. 46

| Layer targeted for optimal read | Output signals | | | | | | | |
|---|---|---|---|---|---|---|---|---|
| | DQ0 | DQ1 | DQ2 | DQ3 | DQ4 | DQ5 | DQ6 | DQ7 |
| Layer L0 | D0_L0 | D1_L0 | D2_L0 | D3_L0 | D4_L0 | D5_L0 | D6_L0 | D7_L0 |
| Layer L1 | D0_L1 | D1_L1 | D2_L1 | D3_L1 | D4_L1 | D5_L1 | D6_L1 | D7_L1 |
| Layer L2 | D0_L2 | D1_L2 | D2_L2 | D3_L2 | D4_L2 | D5_L2 | D6_L2 | D7_L2 |
| Layer L3 | D0_L3 | D1_L3 | D2_L3 | D3_L3 | D4_L3 | D5_L3 | D6_L3 | D7_L3 |

⇩ Merging read results

| | Read data | | | | | | | |
|---|---|---|---|---|---|---|---|---|
| | D0 | D1 | D2 | D3 | D4 | D5 | D6 | D7 |
| Merged data | D0_L0 | D1_L1 | D2_L2 | D3_L3 | D4_L0 | D5_L1 | D6_L2 | D7_L3 |

F I G. 47

CONTROLLING MEMORY INCLUDING MANAGING A CORRECTION VALUE TABLE

CROSS-REFERENCE TO RELATED APPLICATIONS

This application is a divisional of and claims benefit under 35 U.S.C. § 120 to U.S. application Ser. No. 17/202,432, filed Mar. 16, 2021, and is based upon and claims the benefit of priority under 35 U.S.C. § 119 from Japanese Patent Application No. 2020-157850, filed Sep. 18, 2020, the entire contents of each of which are incorporated herein by reference.

FIELD

Embodiments described herein relate generally to a memory system.

BACKGROUND

A NAND-type flash memory capable of storing data in a non-volatile manner is known.

BRIEF DESCRIPTION OF THE DRAWINGS

FIG. 1 is a block diagram showing a configuration example of a memory system according to a first embodiment.

FIG. 3 is a circuit diagram showing a circuit configuration example of a memory cell array included in the memory device of the memory system according to the first embodiment.

FIG. 4 is a perspective view showing a configuration example of the memory cell array included in the memory device of the memory system according to the first embodiment.

FIG. 6 is a cross-sectional view showing an example of a cross-sectional structure of the memory cell array included in the memory device of the memory system according to the first embodiment, along line VI-VI in FIG. 5.

FIG. 8 is a cross-sectional view showing an example of a cross-sectional structure of the memory cell array included in the memory device of the memory system according to the first embodiment, along line VIII-VIII in FIG. 5.

FIG. 12 is a circuit diagram showing an example of a coupling relationship between the data register and an input/output circuit in the memory device of the memory system according to the first embodiment.

FIG. 15 is a schematic diagram showing an example of distribution of threshold voltages of memory cell transistors in each layer in the memory system according to the first embodiment.

FIG. 16 is a schematic diagram showing an example of a command sequence of a TLC-mode read operation in the memory system according to the first embodiment.

FIG. 17 is a schematic diagram showing an example of a command sequence of a shift read operation in the memory system according to the first embodiment.

FIG. 18 is a table showing an example of the allocation of parameters used in a shift read operation in the memory system according to the first embodiment.

FIG. 19 is a table showing an example of output signals output from the memory device to the memory controller in a read operation in the memory system according to the first embodiment.

FIG. 20 is a flowchart showing an example of the processing in the patrol operation in the memory system according to the first embodiment.

FIG. 22 is a table showing an example of shift amounts of the read voltages in the correction operation in the memory system according to the first embodiment.

FIG. 23 is a table showing an example of the correction value table used in the memory system according to the first embodiment.

FIG. 25 is a table showing an example of the correction values, the fail bit count, and the failure ratio in the correction operation in the memory system according to the first embodiment.

FIG. 34 is a table showing an example of read data targeted for counting in each layer in the memory system according to the second embodiment.

FIG. 35 is a flowchart showing an example of the optimal value read process in each layer in the memory system according to the second embodiment.

FIG. 36 is a table showing an example of read data merged by a read operation in the memory system according to the second embodiment.

FIG. 39 is a schematic diagram showing an example of setting of the LLR table in the memory system according to the third embodiment.

FIG. 42 is a schematic diagram showing an example of setting of an LLR table in the memory system according to the fourth embodiment.

FIG. 44 is a block diagram showing an example of configurations of a sense amplifier module and a data register included in a memory device of the memory system according to the fifth embodiment.

FIG. 45 is a table showing an example of output signals output from the memory device to the memory controller in a read operation in the memory system according to the fifth embodiment.

FIG. 46 is a table showing an example of read data targeted for counting in each layer in the memory system according to the fifth embodiment.

FIG. 47 is a table showing an example of read data merged by a read operation in the memory system according to the fifth embodiment.

DETAILED DESCRIPTION

Figure 2:
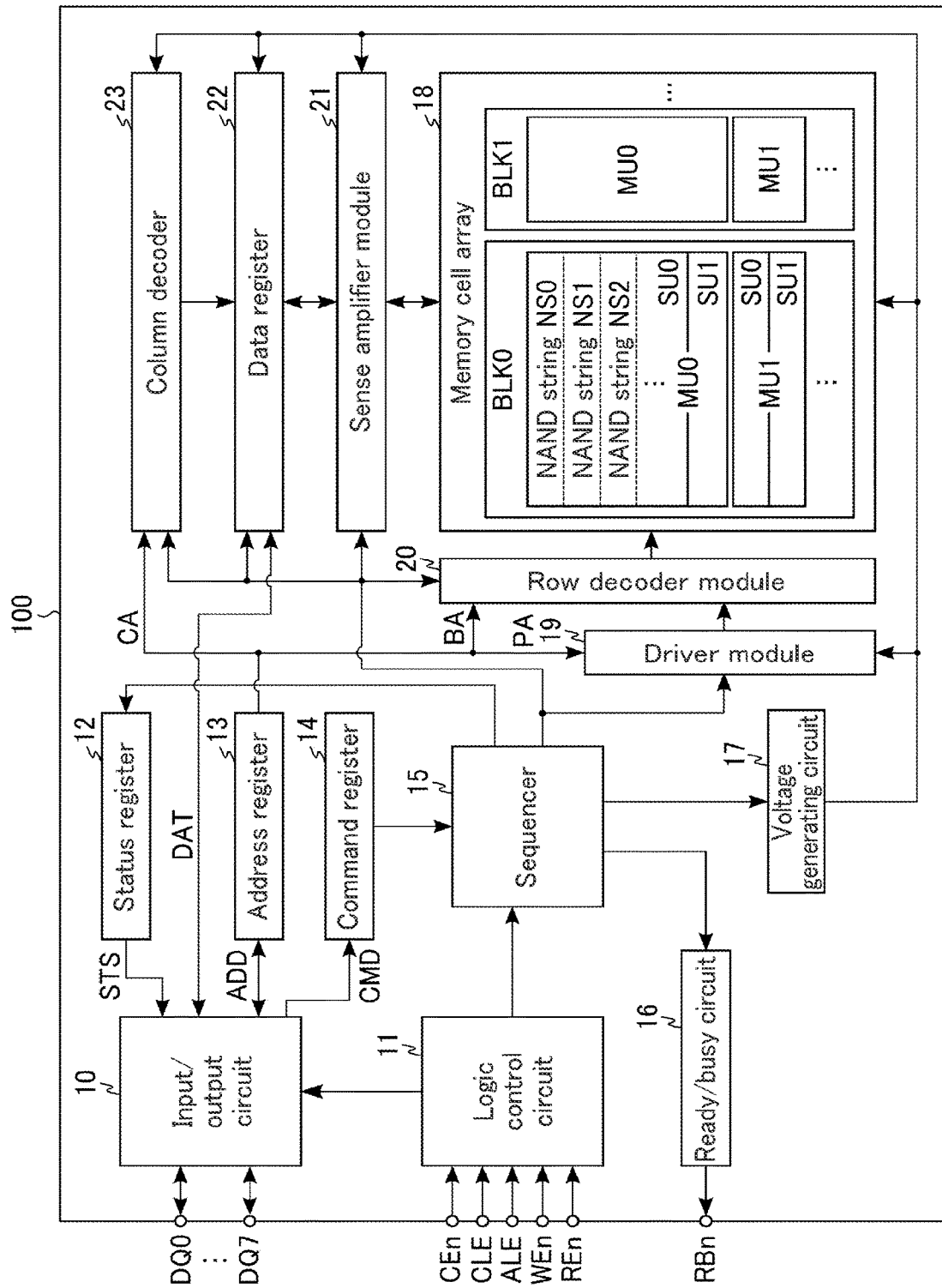
FIG. 2 is a block diagram showing a configuration example of a memory device of the memory system according to the first embodiment.

In general, according to one embodiment, a memory system according to an embodiment includes a memory device, and a memory controller. The memory device includes first and second memory cells, a first word line, and first and second bit lines. The first memory cell and the second memory cell are stacked above a substrate. The first memory cell is provided in a first layer. The second memory cell is provided in a second layer. The first word line is coupled to the first memory cell and the second memory cell. The first bit line is coupled to the first memory cell. The second bit line is coupled to the second memory cell. The memory controller is configured to control the memory device. The memory controller includes a storage circuit capable of storing a correction value table. The correction value table is configured to store a first correction value of a read voltage associated with the first layer and a second correction voltage of a read voltage associated with the second layer. The memory controller is configured to: select the first word line and instruct the memory device to read first-page data which is a set of first-bit data; perform hard bit decoding on the first-page data read from the memory device; calculate a first shift amount of a read voltage optimized for the first layer and a second shift amount of a read voltage optimized for the second layer based on the read first-page data and the first-page data corrected by the hard-bit decoding; and update the first correction value and the second correction value of the correction value table based on the first shift amount and the second shift amount.

Hereinafter, embodiments will be described with reference to the accompanying drawings. The embodiments illustrate devices and methods for embodying the technical concept of the invention. The drawings are schematic or conceptual ones. The dimensions, ratios, etc. in the drawings do not necessarily agree with the actual ones. The technical concept of the present invention is not specified by shapes, structures, dispositions, etc. of structural elements.

In the following explanation, the same reference numerals denote constituent elements having almost the same functions and arrangements. A number just after a character constituting a reference numeral is referred to by the reference numeral containing the same character and is used for distinguishing the components having a similar configuration. Similarly, character just after a number constituting a reference numeral is referred to by the reference numeral containing the same number and is used for distinguishing the components having a similar configuration.

[1] First Embodiment

A memory system 1 according to the first embodiment is described.

[1-1] Configuration

[1-1-1] Overall Configuration of Memory System 1

FIG. 1 is a block diagram showing a configuration example of the memory system 1 according to the first embodiment. As shown in FIG. 1, the memory system 1 includes a NAND-type flash memory 100 and a memory controller 200, for example. A combination of the memory controller 200 and the NAND-type flash memory 100 may constitute one semiconductor memory device. Such a semiconductor memory device includes, for example, a memory card, such as an SD™ card, and a solid state drive (SSD). The NAND-type flash memory 100 will be referred to as "memory device 100" hereinafter.

The memory device 100 includes a plurality of memory cell transistors and stores data in a non-volatile manner. The memory device 100 is a three-dimensionally stacked type NAND flash memory in which memory cell transistors are three-dimensionally stacked above a semiconductor substrate. The memory device 100 is coupled to the memory controller 200 via NAND buses and operates based on an order from the memory controller 200. For example, an eight-bit signal DQ[7:0] is transmitted and received between the memory device 100 and the memory controller 200. The signal DQ[7:0] includes data, an address, and a command, for example.

The memory device 100 receives from the memory controller 200, for example, a chip enable signal CEn, a command latch enable signal CLE, an address latch enable signal ALE, a write enable signal WEn, and a read enable signal REn. The chip enable signal CEn is a signal for enabling the memory device 100, and is asserted, for example, at a low ("L") level. The command latch enable signal CLE is a signal indicating that signal DQ is a command, and is asserted, for example, at a high ("H") level. The address latch enable signal ALE is a signal indicating that signal DQ is an address, and is asserted, for example, at the "H" level. The write enable signal WEn is a signal for taking a received signal into the memory device 100, and is asserted, for example, at the "L" level whenever a command, an address, data, or the like is received from the memory controller 200. In other words, the signal DQ[7:0] is taken into the memory device 100 whenever the write enable signal WEn is toggled. The read enable signal REn causes the memory controller 200 to read data from the memory device 100 and is asserted at the "L" level, for example.

The memory device 100 sends the ready/busy signal RBn to the memory controller 200. The ready/busy signal RBn indicates whether the memory device 100 is in a ready state or a busy state. The ready state is a state in which the memory device 100 can receive a command from the memory controller 200. The busy state is a state in which the memory device 100 cannot receive a command from the memory controller 200. For example, the "H" level of the ready/busy signal RBn indicates that the memory device 100 is in the ready state, and the "L" level of the ready/busy signal RBn indicates that the memory device 100 is in the busy state.

The memory controller 200 instructs, in response to a request (order) from the host device 2, the memory 100 to perform a data read operation, a data write operation, a data erase operation, etc. The memory controller 200 manages a storage space of the memory device 100. The memory controller 200 includes a host interface circuit 210, a built-in memory (random access memory, RAM) 220, a processor (central processing unit, CPU) 230, a buffer memory 240, a NAND interface circuit 250, and an ECC (error check and correction) circuit 260.

The host interface circuit 210 is coupled to the host device 2 via a controller bus and manages communications with the host device 2. The host interface circuit 210 transfers a request and data received from the host device 2 to the CPU 230 and the buffer memory 240. The host interface circuit 210 transfers data in the buffer memory 240 to the host device 2 in response to an order from the CPU 230.

The RAM 220 is used as a workspace of the CPU 230, for example. The RAM 220 holds firmware for managing the memory device 100 and various management tables. As the RAM 220, a semiconductor memory such as a static random access memory (SRAM) or a dynamic random access memory (DRAM) is used.

The CPU 230 controls the operation of the entire memory controller 200. For example, upon receipt of a write request from the host device 2, including a command, a logical address, and data, the CPU 230 issues a write order including a command, a logical address, and data in response to the received write request. Then, the issued write order is transferred to the memory device 100, and the memory device 100 performs a write operation based on the write order. The CPU 230 may perform a read operation or an erase operation in a manner similar to the write operation. The CPU 230 may perform various processes to manage the memory 100, such as wear leveling. The CPU 230 may also perform various computing processes, such as data encryption and randomization.

The buffer memory 240 temporarily holds read data received by the memory controller 200 from the memory device 100. The buffer memory 240 temporarily holds write data received by the memory controller 200 from the host device 2. As the buffer memory 240, a semiconductor memory such as a DRAM may be used. The buffer memory 240 may be externally coupled to the memory controller 200 or integrated into the RAM 220.

The NAND interface circuit 250 is coupled to the memory device 100 via a NAND bus and governs communications between the memory device 100 and the memory controller 200. The NAND interface circuit 250 transfers an order issued from the CPU 230 to the memory device 100. When a write operation is performed, the NAND interface circuit 250 transfers the write data held in the buffer memory 240 to the memory device 100. When a read operation is performed, the NAND interface circuit 250 transfers, to the buffer memory 240, the read data received from the memory device 100.

The ECC circuit 260 performs processing related to error correction of data stored in the memory device 100. In a write operation, the ECC circuit 260 generates parity based on the write data received from the host device 2 and adds the generated parity to the write data. In a read operation, the ECC circuit 260 generates a syndrome based on the read data received from the memory device 100, and detects and corrects errors in the read data based on the generated syndrome.

[1-1-2] Configuration of Memory Device 100

FIG. 2 is a block diagram showing a configuration example of the memory device 100 of the memory system 1 according to the first embodiment. In FIG. 2, the couplings between the blocks are indicated by arrows; however, the couplings between the blocks are not limited to those shown in FIG. 2. As shown in FIG. 2, the memory device 100 includes an input/output circuit 10, a logic control circuit 11, a status register 12, an address register 13, a command register 14, a sequencer 15, a ready/busy circuit 16, a voltage generating circuit 17, a memory cell array 18, a drive module 19, a row decoder module 20, a sense amplifier module 21, a data register 22, and a column decoder 23.

The input/output circuit 10 controls input and output of the signal DQ [7:0] transmitted between the memory device 100 and the memory controller 200. The input/output circuit 10 sends to the data register 22 the data DAT (write data) received from the memory controller 200. The input/output circuit 10 sends to the address register 13 an address ADD received from the memory controller 200. The input/output circuit 10 sends to the command register 14 a command CMD received from the memory controller 200. The input/output circuit 10 sends, to the memory controller 200, status information STS received from the status register 12, the data DAT (read data) received from the data register 22, and the address ADD received from the address register 13.

The logic control circuit 11 receives from the memory controller 200, for example, a chip enable signal CEn, a command latch enable signal CLE, an address latch enable signal ALE, a write enable signal WEn, and a read enable signal REn. Then, the logic control circuit 11 controls the input/output circuit 10 and the sequencer 15 in accordance with the signal received from the memory controller 200.

The status register 12 temporarily stores, for example, the status information STS received from the sequencer 15 in each of a write operation, a read operation, and an erase operation. The status information STS includes, for example, information notifying the memory controller 200 of whether or not a write operation, a read operation, or an erase operation has been successfully completed.

The address register 13 temporarily holds the address ADD received from the input/output circuit 10. The address ADD may include, for example, a page address PA, a block address BA, and a column address CA. The address register 13 sends the page address PA to the driver module 19, the block address BA to the row decoder module 20, and the column address CA to the column decoder 23, for example.

The command register 14 temporarily holds the command CMD received from the input/output circuit 10. The command CMD is associated with an operation that can be performed by the memory device 100. The command CMD held in the command register 14 is referred to by the sequencer 15.

The sequencer 15 controls an operation of the entire memory device 100. For example, the sequencer 15 may control the status register 12, the ready/busy circuit 16, the voltage generating circuit 17, the driver module 19, the row decoder module 20, the sense amplifier module 21, the data register 22, and the column decoder 23. The sequencer 15 then performs a write operation, a read operation, or an erase operation, etc. in accordance with the command CMD held in the command register 14.

The ready/busy circuit 16 generates a ready/busy signal RBn based on an operation state of the sequencer 15. The ready/busy circuit 16 then sends the generated ready/busy signal RBn to the memory controller 200.

The voltage generating circuit 17 generates voltages required for the write, read and erase operations under the control of the sequencer 15. Then, the voltage generating circuit 17 supplies the generated voltages to the memory cell array 18, the driver module 19, the sense amplifier module 21, the data register 22, and the column decoder 23, etc.

The memory cell array 18 includes a plurality of blocks BLK (BLK1, BLK2, ... ). The block BLK is an assembly of a plurality of memory cell transistors each storing data in a non-volatile manner. A block BLK is used as a unit of data erasure for example. In other words, data stored in the memory cell transistors included in a same block BLK can be erased in a batch. Each block BLK includes a plurality of memory units MU (MU0, MU1, ... ). Each memory unit MU includes a plurality of string units SU (SU0, SU1, ... ). Each string unit SU includes a plurality of NAND strings NS (NS0, NS1, NS2, ... ). Each NAND string NS includes a plurality of memory cell transistors coupled in series. Each memory cell transistor is associated with a single bit line and a single word line.

The driver module 19 generates a voltage to be used in a read operation, a write operation, an erase operation, etc., and applies the generated voltage to the row decoder module 20. Specifically, the driver module 19 and the row decoder module 20 are coupled to each other by a plurality of signal lines. The driver module 19 then applies multiple types of voltages set for a read operation, a write operation, an erase operation, etc. to each of the signal lines based on a page address PA.

The row decoder module 20 is coupled between the signal lines coupled to the driver module 19 and the interconnects provided in each of the blocks BLK in the memory cell array 18. The row decoder module 20 selects one corresponding block BLK in the memory cell array 18 based on the block address BA. For example, the row decoder module 20 transfers, to the word lines, etc. in the selected block BLK, the voltages applied to each of the signal lines by the driver module 19.

The sense amplifier module 21 determines data stored in the memory cell transistor based on the voltage of a bit line, in a read operation. The sense amplifier module 21 then transfers the determination result as read data to the data register 22. In a write operation, the sense amplifier module 21 applies a voltage to each bit line in accordance with the write data received from the data register 22.

The data register 22 includes a plurality of latch circuits. The latch circuits may hold write data and read data, etc. The data register 22 temporarily holds the write data received from the input/output circuit 10 and transfers the data to the sense amplifier module 21 in a write operation. The data register 22 temporarily holds the read data received from the sense amplifier module 21 and transfers the data to the input/output circuit 10 in a read operation. The input/output circuit 10 and the data register 22 are coupled to each other via eight data buses for example.

The column decoder 23 decodes the column address CA in each of a write operation, a read operation, and an erase operation, for example. The column decoder 23 then selects a latch circuit in the data register 22 in accordance with the decoding result.

[1-1-3] Circuit Configuration of Memory Cell Array 18

FIG. 3 is a circuit diagram showing a circuit configuration example of the memory cell array 18 included in the memory device 100 of the memory system 1 according to the first embodiment. FIG. 3 shows a circuit configuration of two memory units MU0 and MU1 included in the memory cell array 18. As shown in FIG. 3, each block BLK includes word lines WL0 through WL3, select gate lines SGD0 and SGD1, and select gate line SGS, for example. In this example, each memory unit MU includes two string units SU0 and SU1. In the example, each string unit SU includes three NAND strings NS0 through NS2.

The word lines WL0 through WL3, the select gate lines SGD0 and SGD1, and the select gate line SGS are coupled to the row decoder module 20. The word lines WL0 through WL3, the select gate lines SGD0 and SGD1, and the select gate line SGS may be independently controlled by the row decoder module 20. A plurality of bit lines BL are allocated to each block BLK. A source line SL is shared among a plurality of blocks BLK, for example. A separate source line may be provided among the blocks BLK.

The NAND strings NS included in the same string unit SU are associated with respective bit lines BL. The NAND strings NS of the same number included in the same memory unit MU are coupled in common to a bit line BL. Specifically, the NAND strings NS0 through NS2 included in the string unit SU0 of the memory unit MU0 are coupled to the bit lines BL0 through BL2 respectively. Similarly, the NAND strings NS0 through NS2 included in the string unit SU1 of the memory unit MU0 are coupled to the bit lines BL0 through BL2 respectively. The NAND strings NS0 through NS2 included in the string unit SU0 of the memory unit MU1 are coupled to the bit lines BL3 through BL5 respectively. Specifically, the NAND strings NS0 through NS2 included in the string unit SU1 of the memory unit MU1 are coupled to the bit lines BL3 through BL5 respectively.

Each NAND string NS includes, for example, four memory cell transistors MC0 through MC3 and select transistors ST1 and ST2. Each memory cell transistor MC includes a control gate and a charge storage layer and stores data in a non-volatile manner. The memory cell transistors MC in the first embodiment are MONOS-type memory cells in which an insulating layer is used as the charge storage layer. The memory cell transistors MC may be a floating gate type in which a conductive layer is used as the charge storage layer. Each of the select transistors ST1 and ST2 is used to select a string unit SU in a write operation and a read operation. Each of the select transistors ST1 and ST2 may be used to set the channels of the NAND strings NS included in a non-selected block BLK to a floating state.

In each NAND string NS, the current paths of the select transistor ST1, the memory cell transistors MC3 through MC0, and the select transistor ST2 are, in this order, coupled in series. Specifically, the drain of the select transistor ST1 is coupled to a corresponding bit line BL. The source of the select transistor ST1 is coupled to the drain of the memory cell transistors MC3 of the memory cell transistors MC3 through MC0 coupled in series. The source of the memory cell transistor MC0 among the memory cell transistors MC3 through MC0 coupled in series is coupled to the drain of the select transistor ST2.

Each of the control gates of the memory cell transistors MC0 included in the same block BLK is coupled to the word line WL0. Each of the control gates of the memory cell transistors MC1 included in the same block BLK is coupled to the word line WL1. Each of the control gates of the memory cell transistors MC2 included in the same block BLK is coupled to the word line WL2. Each of the control gates of the memory cell transistors MC3 included in the same block BLK is coupled to the word line WL3.

Each of the gates of the select transistors ST1 included in the plurality of string units SU0 in the same block BLK is coupled to the select gate line SGD0. Each of the gates of the select transistors ST1 included in the plurality of string units SU1 in the same block BLK is coupled to the select gate line SGD1. Each of the gates of the select transistors ST2 included in the same block BLK is coupled to the select gate line SGS. Each of the sources of the select transistors ST2 included in the same block BLK is coupled to the source line SL. Alternatively, similarly to the coupling to the select gate line SGD, the gates of the select transistors ST2 included in the same-numbered string units SU in the same block BLK may be coupled to a select gate line SGS differing from that coupled to the gates of another set of string units.

In the following description, a set of memory cell transistors MC included in the string unit SU coupled to the common select gate line SGD and coupled in common to a word line WL is called a "cell unit CU". For example, a single cell unit CU includes the memory cell transistors MC3 of the NAND strings NS0 through NS2 included in the string unit SU0 of the memory unit MU0, and the memory cell transistors MC3 of the NAND strings NS0 through NS2 included in the string unit SU0 of the memory unit MU1. For example, a storage capacity of a cell unit CU that includes the memory cell transistors MC each capable of storing 1-bit data is defined as "1-page data". A cell unit CU may have a storage capacity of two or more pages of data, according to the number of bits of data stored in the memory cell transistor MC. Each of a write operation and a read operation are respectively performed in a batch on the memory cell transistors MC included in a single cell unit CU.

The circuit configuration of the memory cell array 18 may be a different one. For example, the number of blocks BLK included in the memory cell array 18 may be different. The number of memory units MU included in each block BLK may be a different number. The number of string units SU included in each memory unit MU may be a different number. The number of NAND strings NS included in each string unit SU may be changed as appropriate in accordance with the number of stacked semiconductor layers 33 (which will be described later). The number of memory cell transistors MC included in each NAND string NS may be a different number. The number of each of the select transistors ST1 and ST2 included in each NAND string NS may be a different number.

[1-1-4] Structure of Memory Cell Array 18

An exemplary structure of the memory cell array 18 in the memory device 100 of the memory system 1 according to the first embodiment will be described below. The X-, Y-, and Z-directions used in the following descriptions intersect with each other. The X-direction is substantially parallel to the surface of the semiconductor substrate 30 that constitutes the memory device 100 and corresponds to the direction in which the word lines WL extend. The Y-direction is substantially parallel to the surface of the semiconductor substrate 30 and corresponds to the direction in which the bit lines BL extend. The Z-direction corresponds to a direction perpendicular to the surface of the semiconductor substrate 30. In the drawings referred to hereinafter, structural elements, such as insulating layers, are omitted for easier understanding.

FIG. 4 is a perspective view showing a configuration example of the memory cell array 18 included in the memory device 100 of the memory system 1 according to the first embodiment. FIG. 4 shows an area that includes a structural body corresponding to a single memory unit MU0. As shown in FIG. 4, the memory device 100 includes, for example, the semiconductor substrate 30, the insulating layer 31, a plurality of insulating layers 32, a plurality of semiconductor layers 33, the contact plugs BC0 through BC2, and the contact plugs SC0 and SC1.

The insulating layer 31 is provided on the semiconductor substrate 30. The insulating layer 31 contains, for example, silicon oxide ($SiO_2$). A structural body corresponding to the memory unit MU0 is provided on the insulating layer 31. Specifically, the insulating layer 32 and the semiconductor layer 33 are alternately stacked on the insulating layer 31. The insulating layer 32 contains, for example, silicon oxide ($SiO_2$). The semiconductor layer 33 is made of silicon doped with impurities, for example. Hereinafter, the alternately stacked insulating layers 32 and the semiconductor layers 33 may be altogether referred to as "multi-layer body 34".

In this example, the multi-layer body 34 includes four insulating layers 32 and three semiconductor layers 33. Hereinafter, four insulating layer 32 will be referred to as insulating layers 32-0 through 32-3, from the semiconductor substrate 30 side. Three semiconductor layers 33 will be referred to as semiconductor layers 33-0 through 33-2, from the semiconductor substrate 30 side. The interconnect layer including the semiconductor layer 33-0 will be referred to as "layer L0". The interconnect layer including the semiconductor layer 33-1 will be referred to as "layer L1". The interconnect layer including the semiconductor layer 33-2 will be referred to as "layer L2".

A single multi-layer body 34 corresponds to a single memory unit MU. The multi-layer body 34 includes a bit-line connecting part BLCP and memory cell units MCP0 and MCP1. The bit line connecting part BLCP has a part extending in the X-direction. Each of the memory cell units MCP0 and MCP1 has a part extending in the Y-direction. One end of each of the memory cell part MCP0 and MCP1 is coupled to the bit-line connecting part BLCP. In other words, the insulating layers 32 and the semiconductor layers 33 stacked in each memory cell part MCP continue to those stacked in the bit-line connecting part BLCP.

A single memory cell part MCP corresponds to a single string unit SU. Specifically, the memory cell part MCP0 and MCP1 correspond to the string units SU0 and SU1, respectively. The semiconductor layers 33-0 through 33-2 of each memory cell part MCP correspond to the NAND strings NS0 through NS2, respectively. In other words, the number of NAND strings NS included in each string unit SU corresponds to the number of stacked semiconductor layers 33. The semiconductor layer 33 included in the memory cell part MCP functions as an active area that includes the memory cell transistors MC and a channel layer of the select transistors ST1 and ST2. In other words, the channel layer of each NAND string NS extends in a direction parallel to the surface of the semiconductor substrate 30.

The bit lines BL are provided above the multi-layer body 34. The bit lines and the NAND strings NS are coupled to each other via the semiconductor layers 33 and the contact plugs BC of the bit-line connecting part BLCP. Specifically, the bottoms of the contact plugs BC0 through BC2 are electrically coupled to the semiconductor layers 33-0 through 33-2, respectively. The bit lines BL0 through BL2 are electrically coupled via the upper surfaces of the contact plugs BC0 through BC2. Each contact plug BC is electrically insulated from the semiconductor layers 33 other than the semiconductor layer 33 electrically coupled at the bottom.

The source line SL is provided above the multi-layer body 34. The source line SL has a part extending in the X-direction, for example. The source line SL and the NAND strings NS are coupled to each other via the semiconductor layers 33 and the contact plugs SC of the memory cell part MCP. Specifically, the side surface or bottom surface of the contact plug SC0 is electrically coupled to each of the semiconductor layers 33-0 through 33-2 of the other side of the memory cell part MCP0. The side surface or bottom surface of the contact plug SC1 is electrically coupled to each of the semiconductor layers 33-0 through 33-2 of the other side of the memory cell part MCP1. The source line SL is electrically coupled via the upper surfaces of the contact plugs SC0 and SC1.

On the side and upper surfaces of the multi-layer body 34, a tunnel insulating film, a charge storage layer, and a block insulating film (hereinafter "stacked film") are stacked (illustrations thereof are omitted). Between the part to which the contact plug SC of the memory cell MCP is coupled and the bit-line connecting part BLCP, the select gate line SGS, the word lines WL0 through WL3, and the select gate lines SGD are arranged in this order, toward the bit-line connecting part BLCP side. The select gate line SGS and the word lines WL0 through WL3 has a part that covers (steps over) the side and upper surfaces of the stacked film provided in the memory cell part MCP0 of the multi-layer body 34. The select gate line SGD0 has a part that covers the side and upper surfaces of the stacked film provided in the memory cell part MCP0 of the multi-layer body 34. The select gate line SGD1 has a part that covers the side and upper surfaces of the stacked film provided in the memory cell part MCP1 of the multi-layer body 34.

(Planar Layout of Memory Cell Array 18)

Figure 5:
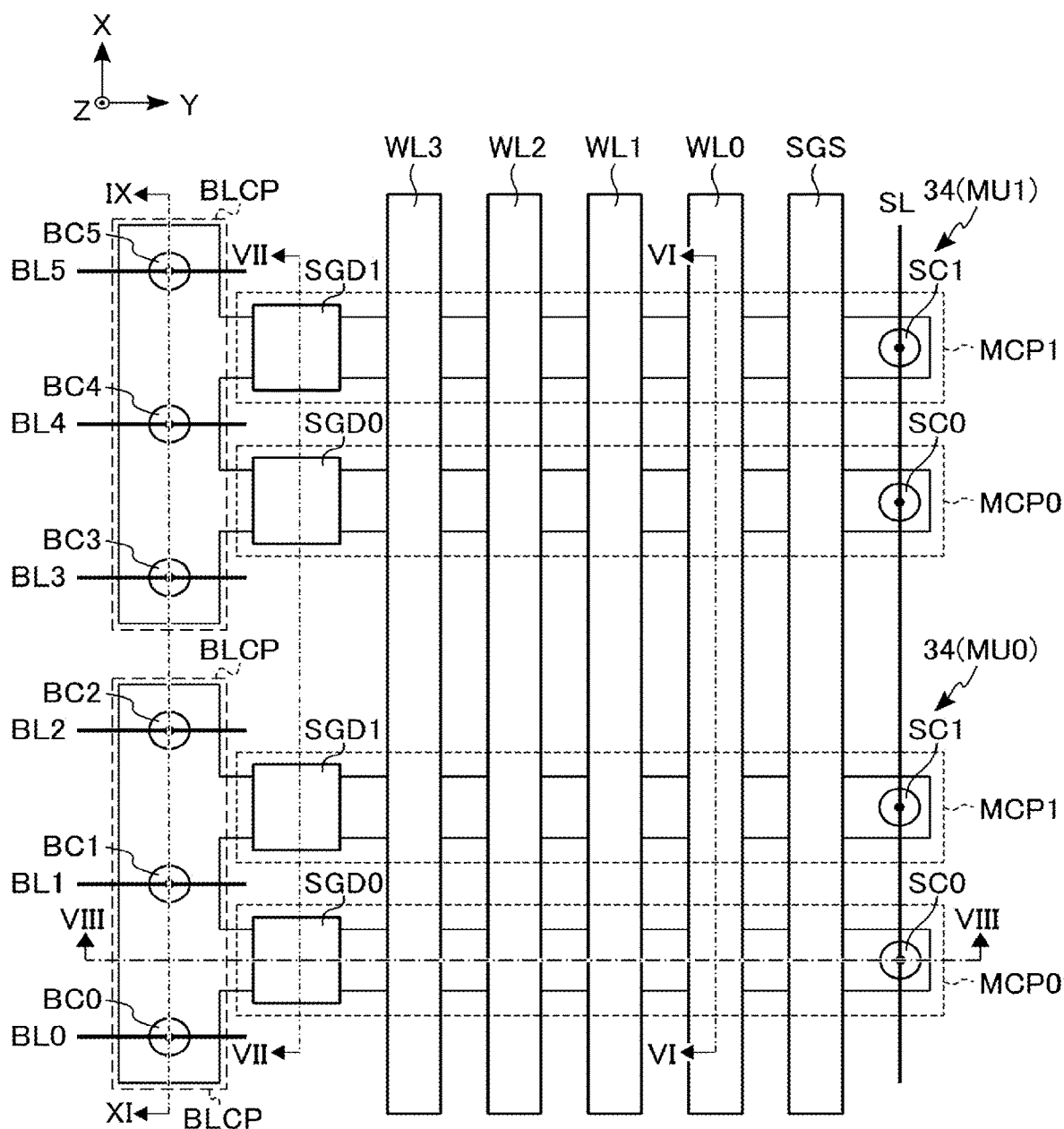
FIG. 5 is a plan view showing an example of a planar layout of the memory cell array included in the memory device of the memory system according to the first embodiment.

FIG. 5 is a plan view showing a configuration example of the planar layout of the memory cell array 18 included in the memory device 100 of the memory system 1 according to the first embodiment. FIG. 5 shows an area that includes two adjacent memory units MU0 and MU1. As shown in FIG. 5, a plurality of the multi-layer bodies 34 are separately arranged side by side in the X-direction.

In the bit-line connecting part BLCP of the multi-layer body 34 corresponding to the memory unit MU0, the contact plugs BC0 through BC2 respectively coupled to the bit lines BL0 through BL2 are provided. In the bit-line connecting part BLCP of the multi-layer body 34 corresponding to the memory unit MU1, the contact plugs BC3 through BC5 respectively coupled to the bit lines BL3 through BL5 are provided. As described above, in the present example, three contact plugs BC respectively coupled to three bit lines BL are provided in the bit-line connecting part BLCP of the multi-layer body 34 corresponding to one memory unit MU.

In the multi-layer body 34 corresponding to the memory unit MU0, the contact plugs SC0 through SC1 respectively coupled to the bit lines MCP0 through MCP1 are provided. In the multi-layer body 34 corresponding to the memory unit MU1, the contact plugs SC0 through SC1 respectively coupled to the bit lines MCP0 through MCP1 are provided. As described above, at least one contact plug SC coupled to the source line SL is provided in each memory cell MCP of the multi-layer body 34 of one memory unit MU.

In the area where a plurality of the multi-layer bodies 34 correspond to a single block BLK, the select gate line SGS and the word lines WL0 through WL3 are provided. Each of the select gate line SGS and the word lines WL0 through WL3 includes a part that extends in the X-direction and is arranged so as to overlap the plurality of the multi-layer bodies 34. Thus, each of the select gate line SGS and the word lines WL0 through WL3 is shared by a plurality of memory units MU in the same block BLK.

In the memory cell parts MCP0 and MCP1 of the multi-layer body 34 corresponding to the memory unit MU0, the select gate lines SGD0 and SGD1 are provided, respectively. In the memory cell parts MCP0 and MCP1 of the multi-layer body 34 corresponding to the memory unit MU1, the select gate lines SGD0 and SGD1 are provided, respectively. As described above, in the memory cell parts MCP0 and MCP1 of the multi-layer body 34 corresponding to one memory unit MU, the select gate lines SGD0 and SGD1 are provided, respectively. In the same block BLK, the select gate lines SGD0 and the select gate lines SGD1 are electrically coupled to each other respectively, via contacts and interconnects (not shown).

(Cross-Sectional Structure of Memory Cell Array 18)

FIGS. 6 through 9 are cross-sectional diagrams showing an example of the cross-sectional structure of the memory cell array 18 included in the memory device 100 of the memory system 1 according to the first embodiment. An example of the cross-sectional structure of the memory cell array 18 in the first embodiment will be described below with reference to FIGS. 6 through 9.

FIG. 6 is a cross-sectional view along line VI-VI in FIG. 5 and shows the X-direction cross section including the word line WL0 of two memory units MU0 and MU1. As shown in FIG. 6, the memory device 100 further includes a tunnel insulating film 35, a charge storage layer 36, a block insulating film 37, and a conductive layer 38.

The tunnel insulating film 35 is provided so as to continuously cover the upper and side surfaces of the multi-layer body 34 of each memory unit MU. In other words, the tunnel insulating film 35 is provided above the insulating layer 31 so as to step over the multi-layer body 34 of each memory unit MU. On the tunnel insulating film 35, the charge storage layer 36, the block insulating film 37, and the conductive layer 38 are stacked in this order. Both of the tunnel insulating film 35 and the block insulating film 37 include, for example, silicon oxide ($SiO_2$). The charge storage layer 36 includes a silicon nitride film (SiN) for example. The conductive structure 38 includes tungsten (W) for example. The conductive layer 38 included in the cross section shown in FIG. 6 is used as the word line WL0.

In each memory unit MU, the part in which the semiconductor layer 33-0 and the word line WL0 in the memory cell part MCP0 are close to each other functions as the memory cell transistor MC0 of the NAND string NS0 included in the string unit SU0. In each memory unit MU, the part in which the semiconductor layer 33-0 and the word line WL0 in the memory cell part MCP1 are close to each other functions as the memory cell transistor MC0 of the NAND string NS0 included in the string unit SU1. In other words, the plurality of memory cell transistors MC0 allocated in the NAND string NS0 are included in the layer L0.

In each memory unit MU, the part in which the semiconductor layer 33-1 and the word line WL0 in the memory cell part MCP0 are close to each other functions as the memory cell transistor MC0 of the NAND string NS1 included in the string unit SU0. In each memory unit MU, the part in which the semiconductor layer 33-1 and the word line WL0 in the memory cell part MCP1 are close to each other functions as the memory cell transistor MC0 of the NAND string NS1 included in the string unit SU1. In other words, the plurality of memory cell transistors MC0 allocated in the NAND string NS1 are included in the layer L1.

In each memory unit MU, the part in which the semiconductor layer 33-2 and the word line WL0 in the memory cell part MCP0 are close to each other functions as the memory cell transistor MC0 of the NAND string NS2 included in the string unit SU0. In each memory unit MU, the part in which the semiconductor layer 33-2 and the word line WL0 in the memory cell part MCP1 are close to each other functions as the memory cell transistor MC0 of the NAND string NS2 included in the string unit SU1. In other words, the plurality of memory cell transistors MC0 allocated in the NAND string NS2 are included in the layer L2.

The cross-sectional structure in the X-direction is the same between the cross-sectional structure that includes the word line WL0 and the cross-sectional structure that includes the other word lines WL. Furthermore, the cross-sectional structure in the X-direction is the same between that including the word line WL0 and that including the select gate line SGS. In other words, the plurality of memory cell transistors MC1 through MC3 and the plurality of select transistors ST2 allocated in the NAND string NS0 are included in the layer L0. The plurality of memory cell transistors MC1 through MC3 and the plurality of select transistors ST2 allocated to the NAND string NS1 are included in the layer L1. The plurality of memory cell transistors MC1 through MC3 and the plurality of select transistors ST2 allocated to the NAND string NS2 are included in the layer L2.

Figure 7:
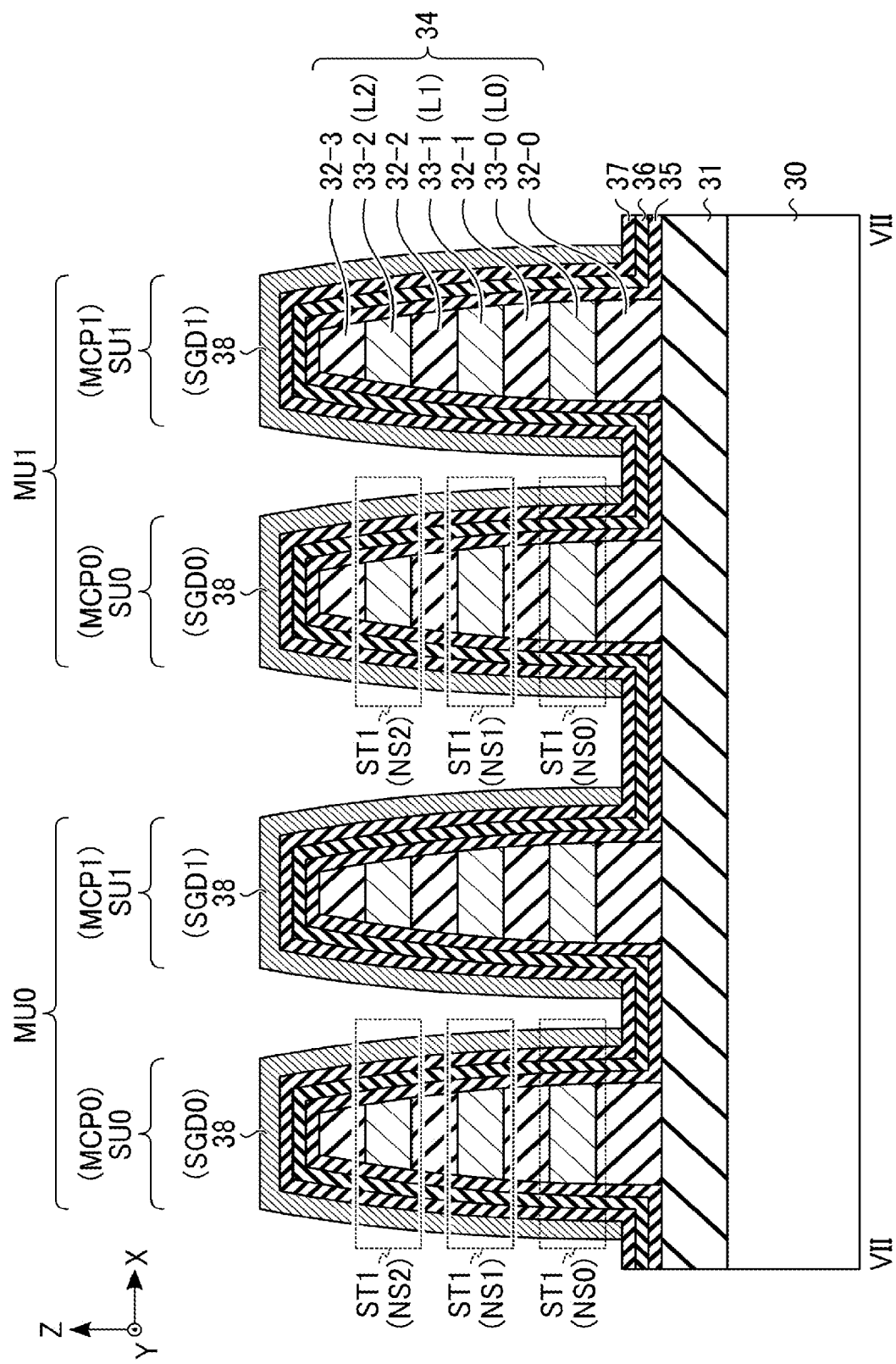
FIG. 7 is a cross-sectional view showing an example of a cross-sectional structure of the memory cell array included in the memory device of the memory system according to the first embodiment, along line VII-VII in FIG. 5.

FIG. 7 is a cross-sectional view along line VII-VII in FIG. 5 and shows the X-direction cross section including the select gate lines SGD0 and SGD1 of two memory units MU0 and MU1. As shown in FIG. 7, the X-direction cross-sectional structure including the select gate lines SGD0 and SGD1 has the conductive layer 38 having a shape differing from that included in the X-direction cross-sectional structure including the word line WL0.

Specifically, the conductive layer 38 is separated between the memory cell parts MCP in the X-direction cross section including the select gate lines SGD0 and SGD1. In other words, the conductive layer 38 is independently provided in each string unit SU in the X-direction cross section including the select gate lines SGD.

The X-direction cross-sectional structure including the select gate lines SGD0 and SGD1 is similar to the X-direction cross-sectional structure including the word line WL0. In other words, the plurality of select transistors ST1 allocated in the NAND string NS0 are included in the layer L0. The plurality of memory cell transistors ST1 allocated in the NAND string NS1 are included in the layer L1. The plurality of memory cell transistors ST1 allocated in the NAND string NS2 are included in the layer L2.

As shown in FIGS. 6 and 7, the X-direction cross-sectional shape of the multi-layer body 34 has a tapered shape. Thus, in the memory device 100, the cross-sectional shape of the multi-layer body 34 in the X-direction may be changed depending on processing characteristics, etc. of dry etching in the process of forming the multi-layer body 34. For this reason, the X-direction cross-sectional shape of the multi-layer body 34 may be an inverted-tapered shape or a bowed shape.

In the present example, the width in the X-direction of each of the semiconductor layers 33-0 through 33-2 included in the multi-layer body 34 and the length in the Z-direction of the side surface of each of the semiconductor layers 33-0 through 33-2 included in the multi-layer body 34 are different from layer to layer. As a result, the gate length of the memory cell transistor MC included in the NAND string NS0 and that included in the NAND string NS1, and that included in the NAND string NS2 are different from layer to layer.

Specifically, the gate length of the memory cell transistor MC provided in the layer L0, namely the length of the word line WL in the part in the Z-direction and adjacent to the memory cell transistor MC, is shorter than the gate length of the memory cell transistor MC provided in the layer L1. The gate length of the memory cell transistor MC provided in the layer L1 is shorter than that of the memory cell transistor MC provided in the layer L2. Thus, in the present example, the gate length of the memory cell transistor MC increases as a distance from the semiconductor substrate 30 increases.

Furthermore, the X-direction length (width) of the semiconductor layer 33-0 provided in the layer L0 is longer than the X-direction length of the semiconductor layer 33-1 provided in the layer L1. The X-direction length of the semiconductor layer 33-1 provided in the layer L1 is longer than the X-direction length of the semiconductor layer 33-2 provided in the layer L2. In other words, in the present example, the X-direction length of the semiconductor layer 33 used as the part of the memory cell transistor MC decreases as a distance from the semiconductor substrate 30 increases.

FIG. 8 is a cross-sectional view along line VIII-VIII in FIG. 5 and shows the Y-direction cross section including each channel of the NAND strings NS0 through NS2 included in one memory unit MU. As shown in FIG. 8, the memory device 100 further includes the conductive member 40 and the conductive layers 41.

Each conductive member 40 is provided in, for example, a shape of a pillar extending in the Z-direction and is used as a contact plug SC. The conductive member 40 passes through the block insulating film 37, the charge storage layer 36, the tunnel insulating film 35, the insulating layers 32-3 through 32-1, and the semiconductor layers 33-2 and 33-1, in the vicinity of the edge portion of the memory cell part MCP on the side away from the bit-line connecting part BLCP. The bottom portion of the semiconductor material 40 reaches the conductor 33-0. The conductive member 40 is thereby electrically coupled to the semiconductor layers 33-0 through 33-2. The conductive member 40 contains, for example, tungsten (W).

On the conductive member 40, the conductive layer 41 is provided. The conductive layer 41 has a part extending in the X-direction and is used as a source line SL, for example. In other words, the conductive layer 41 is electrically coupled to each of the semiconductor layers 33-0 through 33-2 via the conductive member 40 (contact plug SC). The conductive layer 41 includes copper (Cu), for example.

As shown in FIG. 8, the width in the Y-direction of the conductive layer 38 separated between interconnects changes in accordance with the height. Thus, in the memory device 100, the width in the Y-direction of the conductive layer 38 separated between interconnects may change based on processing characteristics, etc. of dry etching in the process of separating the conductive layer 38 between interconnects. In the present example, the width in the Y-direction of the conductive layer 38 separated between interconnects decreases as a distance from the semiconductor substrate 30 increases. In such a case, the gate width of the memory cell transistor MC differs from one NAND string NS to another.

Specifically, the gate width of the memory cell transistor MC provided in the layer L0 is longer than that of the memory cell transistor MC provided in the layer L1. The gate width of the memory cell transistor MC provided in the layer L1 is longer than that of the memory cell transistor MC provided in the layer L2. Thus, in the present example, the gate width of the memory cell transistor MC decreases as a distance from the semiconductor substrate 30 increases.

Figure 9:
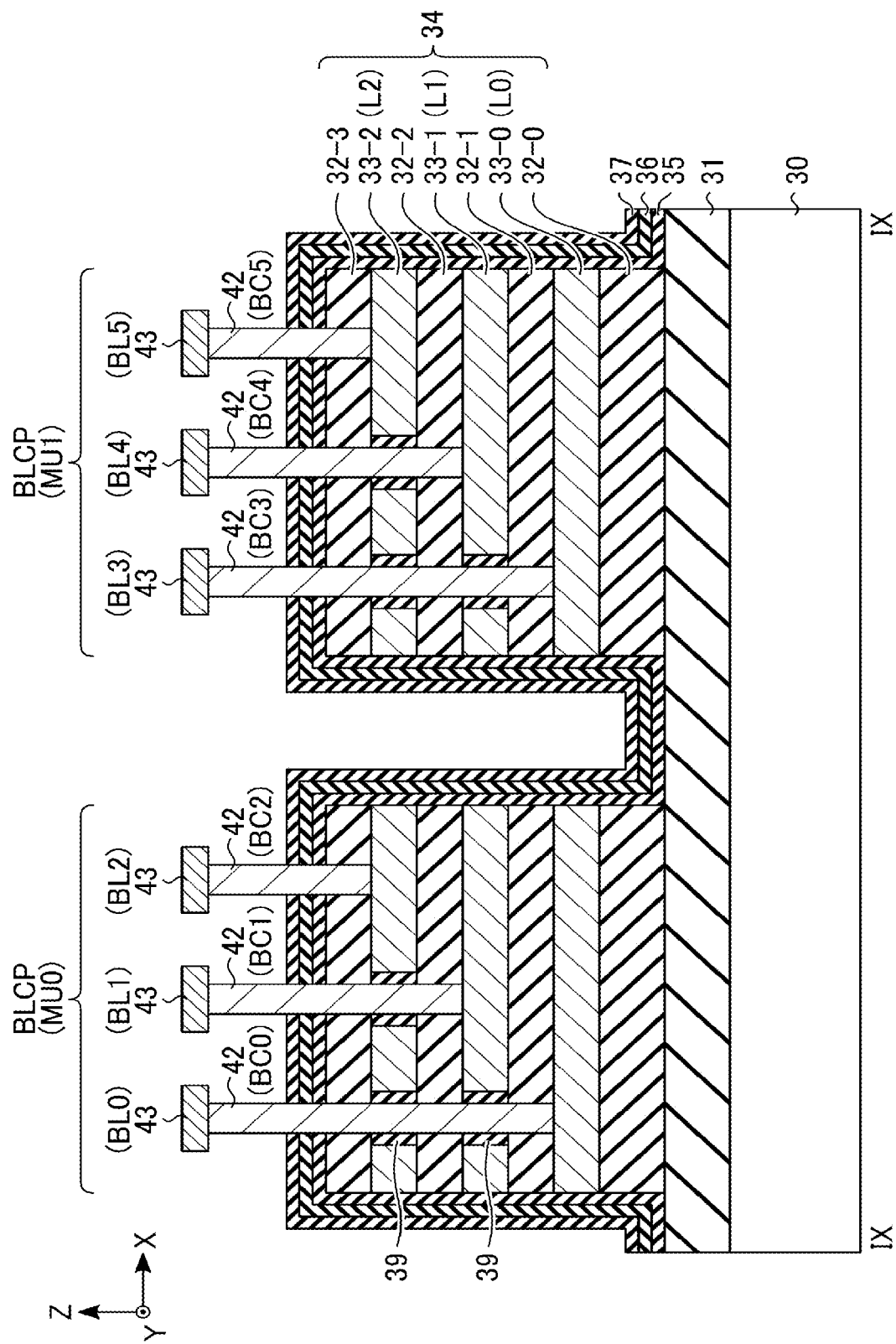
FIG. 9 is a cross-sectional view showing an example of a cross-sectional structure of the memory cell array included in the memory device of the memory system according to the first embodiment, along line IX-IX in FIG. 5.

FIG. 9 is a cross-sectional view along the line IX-IX in FIG. 5 and shows the X-direction cross section including the bit-line connecting part BLCP of two memory units MU0 and MU1. As shown in FIG. 9, the memory device 100 further includes a plurality of conductive members 42, a plurality of conductive layers 43, and a plurality of insulating layers 39.

Each conductive member 42 is provided in, for example, a shape of a pillar extending in the Z-direction and is used as a contact plug BC. Specifically, in the bit-line connecting part BLCP of the memory unit MU0, three conductive members 42 (contact plugs BC0 through BC2) are provided on the semiconductor layers 33-0 through 33-2, respectively. In the bit-line connecting part BLCP of the memory unit MU1, three conductive members 42 (contact plugs BC3 through BC5) are provided on the semiconductor layers 33-0 through 33-2, respectively. Each conductive member 42 penetrates the block insulating film 37, the charge storage layer 36, and the tunnel insulating film 35.

The conductive member 42 coupled to the semiconductor layer 33-0 included in the layer L0 further passes through the semiconductor layer 33-1 included in the layer L1 and the semiconductor layer 33-2 included in the layer L1. The conductive member 42 coupled to the semiconductor layer 33-0 is separated and insulated from the semiconductor layer 33-1 by the insulating layer 39. The conductive member 42 coupled to the semiconductor layer 33-0 is separated and insulated from the semiconductor layer 33-2 by the insulating layer 39. Similarly, the conductive member 42 coupled to the semiconductor layer 33-1 included in the layer L1 further passes through the semiconductor layer 33-2 included in the layer L2. The conductive member 42 coupled to the semiconductor layer 33-1 and the semiconductor layer 33-2 are separated and insulated from each other by the insulating layer 39. The insulating layer 39 contains, for example, silicon oxide ($SiO_2$).

A plurality of conductive layers 43 are provided on a plurality of conductive members 42, respectively. The conductive layer 43 has a part extending in the Y-axis direction for example and is used as a bit line BL. Specifically, the conductive layer 43 provided on the conductive member 42 corresponding to the contact plug BC0 is used as the bit line BL0. The conductive layer 43 provided on the conductive member 42 corresponding to the contact plug BC1 is used as the bit line BL1. The conductive layer 43 provided on the conductive member 42 corresponding to the contact plug BC2 is used as the bit line BL2. Similarly, each conductive layer 43 is used as a bit line BL associated with the semiconductor layer 33 coupled thereto via the contact plug BC. The conductive structure 43 includes copper (Cu), for example.

[1-1-5] Configurations of Sense Amplifier Module 21 and Data Register 22

Figure 10:
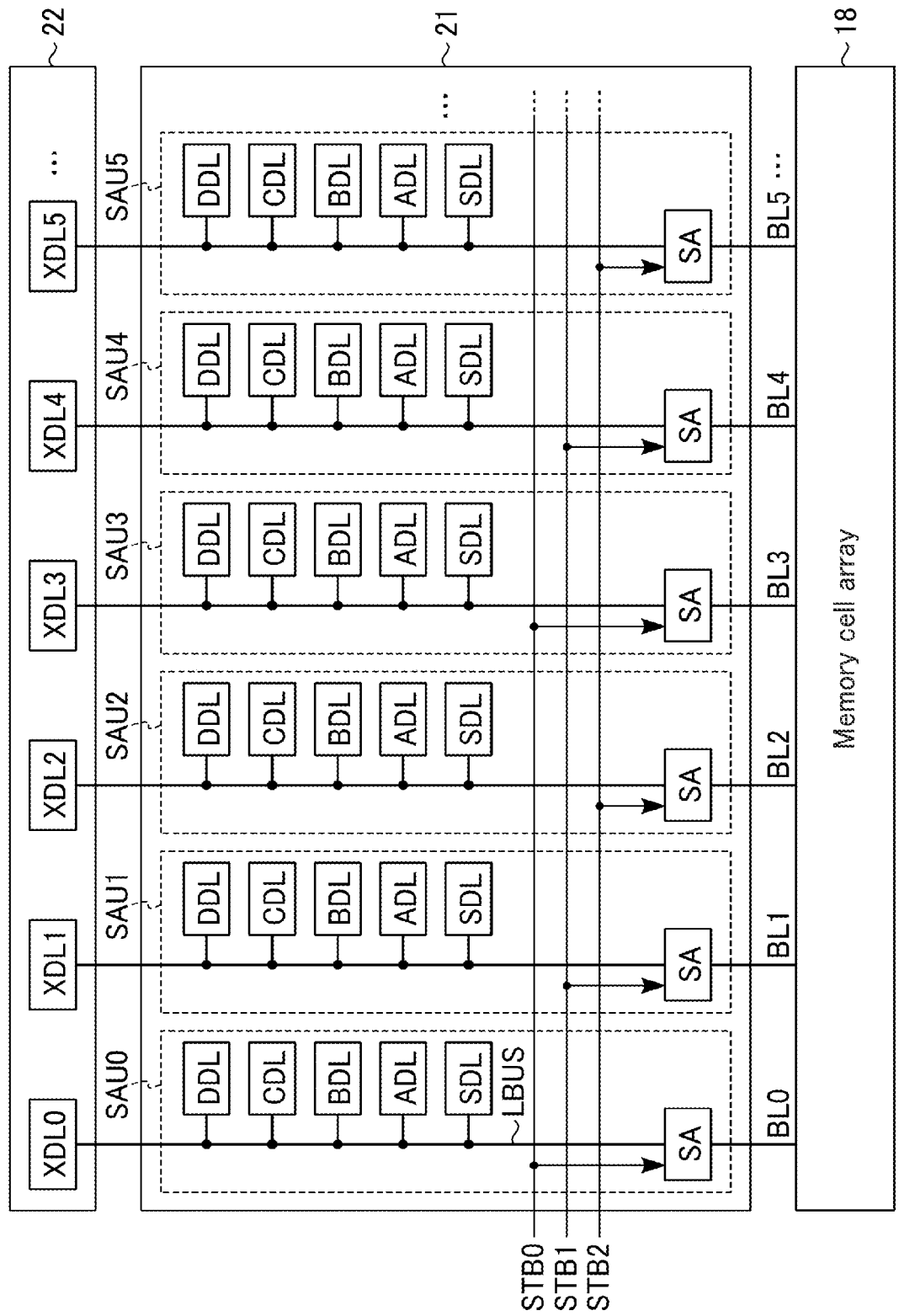
FIG. 10 is a block diagram showing an example of configurations of a sense amplifier module and a data register included in the memory device of the memory system according to the first embodiment.

FIG. 10 is a block diagram showing an example of configurations of the sense amplifier module 21 and the data register 22 included in the memory device 100 of the memory system 1 according to the first embodiment. As shown in FIG. 10, the sense amplifier module 21 includes a plurality of sense amplifier units SAU (SAU0, SAU1, SAU2, SAU3, SAU4, SAU5, . . . ) respectively associated with the bit lines BL, for example. The data register 22 includes a plurality of latch circuits XDL (XDL0, XDL1, XDL2, XDL3, XDL4, XDL5, . . . ) associated with the respective sense amplifier units SAU.

Each sense amplifier unit SAU includes a sense circuit SA, and latch circuits SDL, ADL, BDL, CDL, and DDL, and a bus LBUS. The sense circuit SA, the latch circuits SDL, ADL, BDL, CDL, and DDL, and the corresponding latch circuit XDL are coupled in common to the bus LBUS. It is thereby possible to send and receive data between the sense circuit SA and the latch circuits SDL, ADL, BDL, CDL, DDL, and XDL, via the bus LBUS.

The sense circuit SA is coupled to a bit line BL associated with the corresponding sense amplifier unit SAU. For example, in a read operation, the sense circuit SA senses data read and output to the corresponding bit line BL and determines the data stored in the selected memory cell transistor MC. Specifically, when the control signal STB is asserted in a read operation, the sense circuit SA determines whether the read data of the selected memory cell transistor MC is "0" or "1" based on a voltage of the corresponding bit line BL or a current flowing in the corresponding bit line BL. In a write operation, the sense circuit SA applies a voltage to the corresponding bit line BL based on write data stored in at least one latch circuit included in the corresponding sense amplifier unit SAU.

Each of the latch circuits SDL, ADL, BDL, CDL, DDL, and XDL temporarily stores read data and write data. In a read operation, the read data confirmed by the sense circuit SA is transferred to one of the latch circuit SDL, ADL, BDL, CDL, or DDL, for example. In a write operation, the write data transferred to the latch circuit XDL is transferred to one of the latch circuit SDL, ADL, BDL, CDL, or DDL, for example. The latch circuit XDL is used to input and output data between the sense amplifier unit SAU and the input/output circuit 10. The latch circuit XDL may also be used as a cache memory of the memory device 100. The memory device 100 can be in a ready state when at least the latch XDL is available.

In the memory device 100 of the first embodiment, the sequencer 15 generates multiple control signals STB in accordance with the number of the layers of the memory cell transistors MC. In the present example, the sequencer 15 generates the control signals STB0 through STB2 associated with the layers L0 through L2. The sequencer 15 then inputs a control signal STB0 to a plurality of bit lines BL(k×3) (k is an integer equal to or greater than 0); a control signal STB1 to a plurality of bit lines BL(1+k×3); and a control signal STB2 to a plurality of bit lines BL(2+k×3). Specifically, the sequencer 15 inputs the control signal STB0 to each sense circuit SA of the sense amplifier units SAU0 and SAU3; the control signal STB1 to each sense circuit SA of the sense amplifier units SAU1 and SAU4; and the control signal STB2 to each sense circuit SA of the sense amplifier units SAU2 and SAU5.

(Circuit Configuration of Sense Amplifier Unit SAU)

Figure 11:
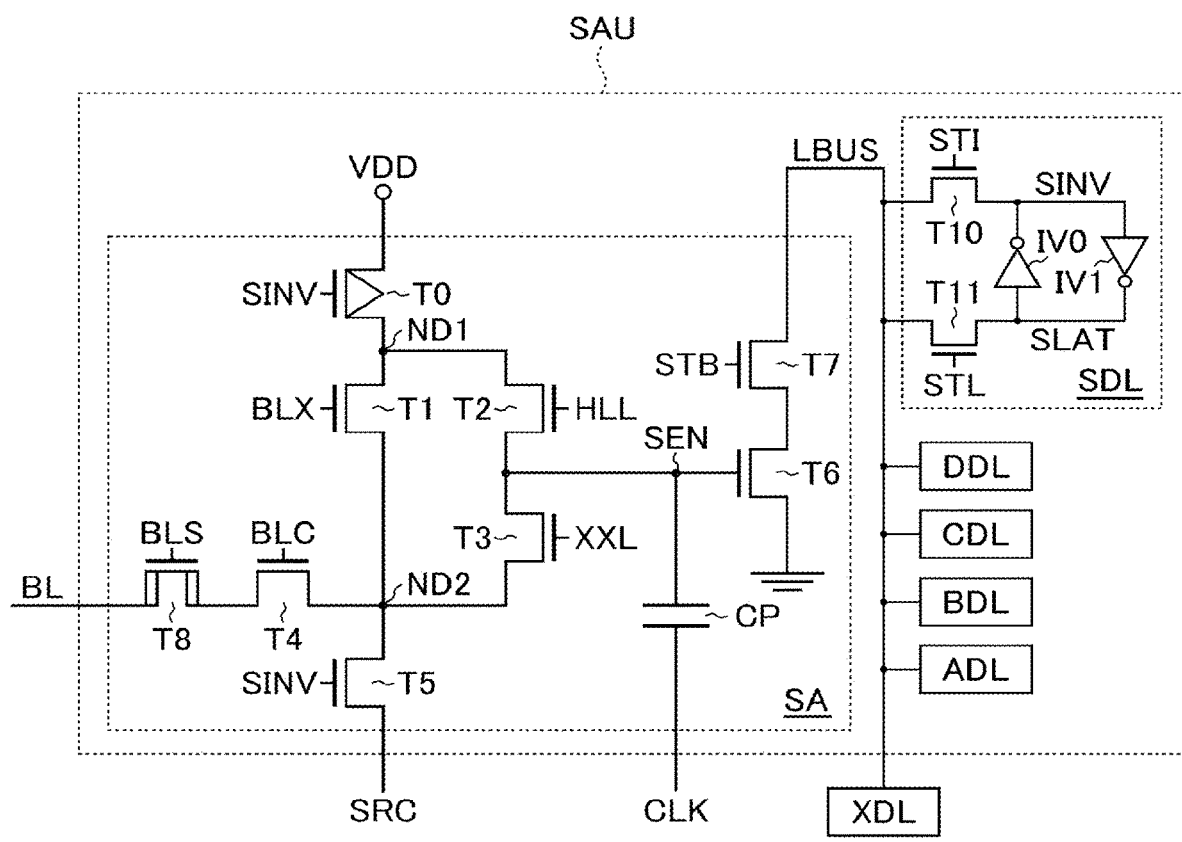
FIG. 11 is a circuit diagram showing a circuit configuration example of a sense amplifier unit included in the memory device of the memory system according to the first embodiment.

FIG. 11 is a circuit diagram showing a circuit configuration example of the sense amplifier unit SAU included in the memory device 100 of the memory system 1 according to the first embodiment. As shown in FIG. 11, the sense circuit SA of the sense amplifier unit SAU includes transistors T0 through T8 and a capacitor CP. The latch circuit SDL of the sense amplifier unit SAU includes inverters IV0 and IV1 and transistors T10 and T11. The transistor T0 is a P-type MOS transistor. Each of the transistors T1 through T7, T10, and T11 is an N-type MOS transistor. The transistor T8 is an N-type MOS transistor with a breakdown voltage higher than those of the transistors T0 through T7.

The source of the transistor T0 is coupled to a power supply line. The drain of the transistor T0 is coupled to a node ND1. The gate of the transistor T0 is coupled to a node SINV in the latch circuit SDL. The drain of the transistor T1 is coupled to the node ND1. The source of the transistor T1 is coupled to a node ND2. A control signal BLX is input to the gate of the transistor T1. The drain of the transistor T2 is coupled to the node ND1. The source of the transistor T2 is coupled to a node SEN. A control signal HLL is input to the gate of the transistor T2.

The drain of the transistor T3 is coupled to the node SEN. The source of the transistor T3 is coupled to the node ND2. A control signal XXL is input to the gate of the transistor T3. The drain of the transistor T4 is coupled to the node ND2. A control signal BLC is input to the gate of the transistor T4. The drain of the transistor T5 is coupled to the node ND2. The source of the transistor T5 is coupled to a node SRC. The gate of the transistor T5 is coupled to the node SINV in the latch circuit SDL, for example.

The source of the transistor T6 is grounded. The gate of the transistor T6 is coupled to the node SEN. The drain of the transistor T7 is coupled to the bus LBUS. The source of the transistor T7 is coupled to the drain of the transistor T6. A control signal STB is input to the gate of the transistor T7. One electrode of the capacitor CP is connected to the node SEN. A clock signal CLK is input to the other electrode of the capacitor CP. The drain of the transistor T8 is coupled to the source of the transistor T4. The source of the transistor T8 is coupled to the corresponding bit line BL. A control signal BLS is input to the gate of the transistor T8.

The input node of the inverter IV0 is coupled to a node SLAT. The output node of the inverter IV0 is coupled to the node SINV. The input node of the inverter IV1 is coupled to the node SINV. The output node of the inverter IV1 is coupled to the node SLAT. One end of the transistor T10 is coupled to the node SINV. The other end of the transistor T10 is coupled to the bus LBUS. A control signal ST1 is input to the gate of the transistor T10. One end of the transistor T11 is coupled to the node SLAT. The other end of the transistor T11 is coupled to the bus LBUS. A control signal STL is input to the gate of the transistor T11. For example, the data held in the node SLAT corresponds to the data held in the latch circuit SDL. The data held in the node SINV, on the other hand, corresponds to inversion data of the data held in the node SLAT.

The circuit configurations of the latch circuits ADL, BDL, CDL, DDL, and XDL are, for example, the same as that of the latch circuit SDL. For example, the latch circuit ADL holds data in the node ALAT and holds inversion data of the data in the node AINV. Then, a control signal ATI is input to the gate of the transistor T10 of the latch circuit ADL, and a control signal ATL is input to the gate of the transistor T11 of the latch circuit ADL. The latch circuit BDL holds data in the node BLAT and holds inversion data of the data in the node BINV. For example, a control signal BTI is input to the gate of the transistor T10 of the latch circuit BDL, and a control signal BTL is input to the gate of the transistor T11 of the latch circuit BDL. Descriptions of the latch circuits CDL, DDL, and XDL will be omitted, as the configurations thereof are similar to those of the latch circuits ADL and BDL.

In the above-discussed circuit structure of the sense amplifier unit SAU, a power supply voltage VDD may be applied to the power supply line coupled to the source of the transistor T0. A ground voltage VSS for example is applied to node SRC. The control signals BLX, HLL, XXL, BLC, STB, BLS, ST1, and STL, and the clock CLK are each generated by, for example, the sequencer 15. The node SEN may be called a "sense node of the sense circuit SA".

The circuit configuration of the sense amplifier unit SAU may be different from the foregoing. For example, the number of latch circuits included in each sense amplifier unit SAU may be changed as appropriate based on the number of pages stored in a single cell unit CU. The sense amplifier unit SAU may include a computing circuit capable of performing basic logical operations. In the memory device 100 of the first embodiment, asserting a control signal corresponds to temporarily changing an "L"-level voltage to an "H"-level voltage. If the transistor whose gate is coupled to a sense node is a P-type transistor, asserting a control signal STB corresponds to temporarily changing an "H"-level voltage to an "L"-level voltage.

(Coupling Relationship Between Data Register 22 and Input/Output Circuit 10)

FIG. 12 is a circuit diagram showing an example of the coupling relationship between the data register 22 and the input/output circuit 10 in the memory device 100 of the memory system 1 according to the first embodiment. FIG. 12 also shows eight data buses IO0 through IO7 coupled to the input/output circuit 10. As shown in FIG. 12, the data register 22 further includes a plurality of transistors TR (TR0, TR1, TR2, TR3, TR4, TR5, TR6, TR7, TR8, TR9, TR10, TR11, TR12, TR13, TR14, TR15, . . . ).

The source and drain of the transistor TR(k×8) (k is an integer equal to or greater than 0) are coupled between the latch circuit XDL(k×8) and the data bus IO0. The source and drain of the transistor TR(1+k×8) are coupled between the latch circuit XDL(1+k×8) and the data bus IO1. The source and drain of the transistor TR(2+k×8) are coupled between the latch circuit XDL(2+k×8) and the data bus IO2. The source and drain of the transistor TR(3+k×8) are coupled between the latch circuit XDL(3+k×8) and the data bus IO3. The source and drain of the transistor TR(4+k×8) are coupled between the latch circuit XDL(4+k×8) and the data bus IO4. The source and drain of the transistor TR(5+k×8) are coupled between the latch circuit XDL(5+k×8) and the data bus IO5. The source and drain of the transistor TR(6+k×8) are coupled between the latch circuit XDL(6+k×8) and the data bus IO6. The source and drain of the transistor TR(7+k×8) are coupled between the latch circuit XDL(7+k×8) and the data bus IO7.

The sequencer 15 generates and controls multiple control signals CS. The control signal CSk is input to the gate of each of the transistors TRk, TR(1+k×8), TR(2+k×8), TR(3+k×8), TR(4+k×8), TR(5+k×8), TR(6+k×8), and TR(7+k×8).

Specifically, the control signal CS0 is input to the gate of each of the transistors TR0 through TR7, and the control signal CS1 is input into the gate of each of the transistors TR8 through TR15. In other words, the transistors TR into which the same control signal CS is input are coupled to different data buses IO. For example, the sequencer 15 sequentially controls multiple control signals CS to an "H" level and turns the transistors TR to an on state in batches of eight, so that data can be sent and received in units of 8 bits between the multiple latch circuits XDL in the data register 22 and the input/output circuit 10. Hereinafter, the processing of outputting read data in units of 8 bits will be referred to as "a single output cycle".

[1-1-6] Data Store Method

The memory system 1 of the first embodiment can use various types of write modes in accordance with the number of bits of data to be stored to in a single memory cell transistor MC. For example, the memory system 1 of the first embodiment uses one of the following write modes: an SLC (single-level cell) mode, an MLC (multi-level cell) mode, a TLC (triple-level cell) mode, a QLC (quadruple-level cell) mode. The SLC mode, MLC mode, TLC mode, and QLC mode are write modes for storing 1-bit data, 2-bit data, 3-bit data, and 4-bit data, respectively, for a single memory cell transistor MC.

Figure 13:
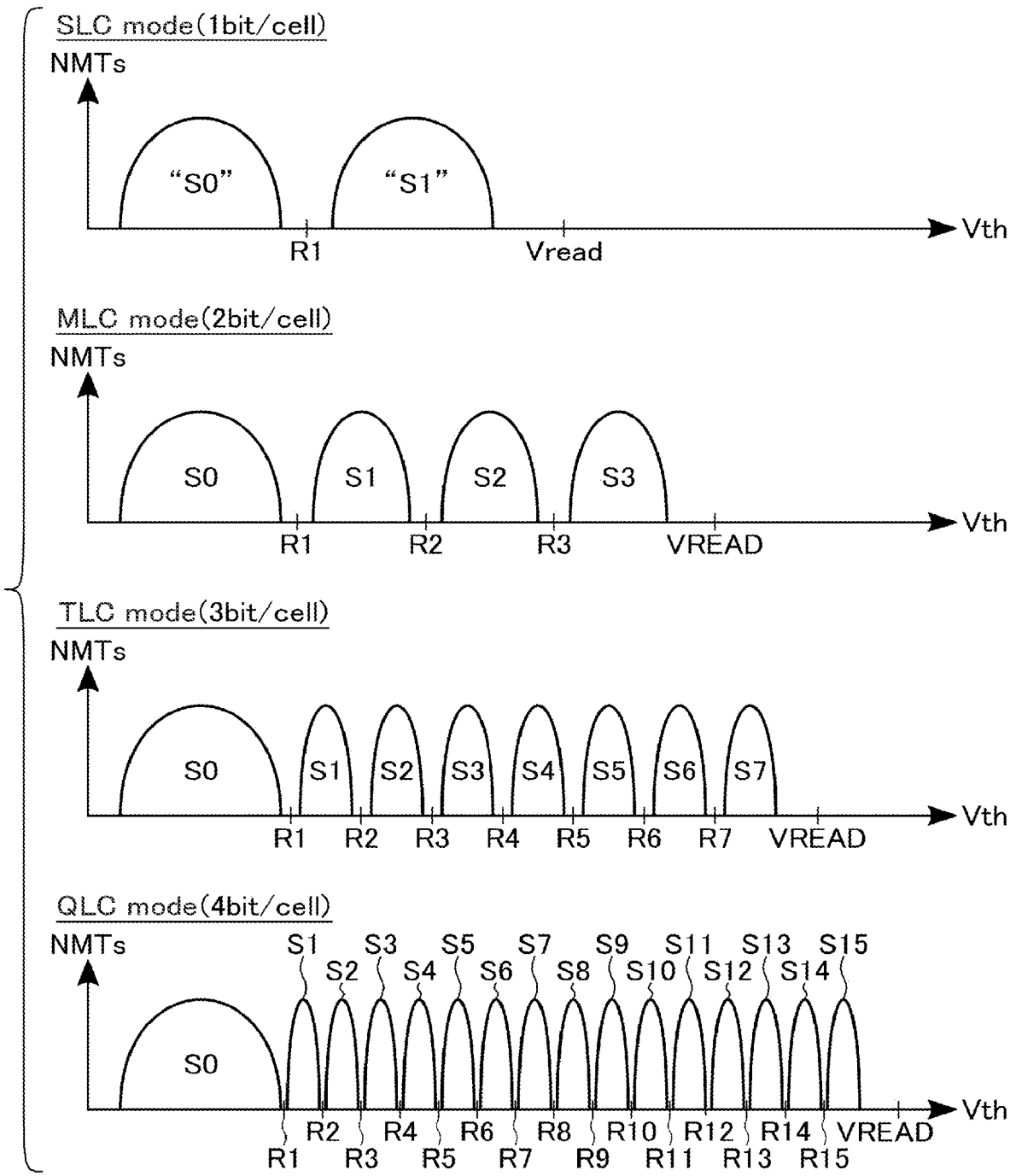
FIG. 13 is a schematic diagram showing an example of distribution of threshold voltages of memory cell transistors in the memory system according to the first embodiment.

FIG. 13 is a schematic diagram showing an example of distribution of the threshold voltages of the memory cell transistors MC in the memory system 1 according to the first embodiment. FIG. 13 shows an example of four types of threshold voltage distribution and read voltage groups, each corresponding to the SLC mode, MLC mode, TLC mode, and QLC mode. The label "NMTs" in the vertical axis indicates the number of memory cell transistors MC. The label "Vth" in the horizontal axis indicates the threshold voltage of the memory cell transistors MC. As shown in FIG. 13, the plurality of memory cell transistors MC fall into a plurality of states in accordance with an applied write mode, in other words, the number of bits of stored data.

If the SLC mode (1 bit/cell) is used, the threshold voltage distribution of the memory cell transistors MC includes two states. These two states are called an "S0" state and an "S1" state, from lower to higher threshold voltages. In the SLC mode, mutually different 1-bit data is allocated to the respective "S0" and "S1" states.

If the MLC mode (2 bits/cell) is used, the threshold voltage distribution of the memory cell transistors MC includes four states. These four states are called an "S0" state, an "S1" state, an "S2" state, and an "S3" state, from lower to higher threshold voltages. In the MLC mode, mutually different 2-bit data is allocated to the respective "S0" through "S3" states.

If the TLC mode (3 bits/cell) is used, the threshold voltage distribution of the memory cell transistors MC includes eight states. The eight states are called an "S0" state, an "S1" state, an "S2" state, an "S3" state, an "S4" state, an "S5" state, an "S6" state, and an "S7" state, from lower to higher threshold voltages. In the TLC mode, mutually different 3-bit data is allocated to the respective "S0" through "S7" states.

If the QLC mode (4 bits/cell) is used, the threshold voltage distribution of the memory cell transistors MC includes 16 states. The 16 states are called an "S0" state, an "S1" state, an "S2" state, an "S3" state, an "S4" state, an "S5" state, an "S6" state, an "S7" state, an "S8" state, an "S9" state, an "S10" state, an "S11" state, an "S12" state, an "S13" state, an "S14" state, and an "S15" state, from lower to higher threshold voltages. In the QLC mode, mutually different 4-bit data is allocated to the respective "S0" through "S15" states.

In each write mode, a read voltage is set between neighboring states. Specifically, the read voltage R1 is set between the states "S0" and "S1". The read voltage R2 is set between the states "S1" and "S2". The read voltage R3 is set between the states "S2" and "S3". The read voltage R4 is set between the states "S3" and "S4". The read voltage R5 is set between the states "S4" and "S5". The read voltage R6 is set between the states "S5" and "S6". The read voltage R7 is set between the states "S6" and "S7". The read voltage R8 is set between the states "S7" and "S8". The read voltage R9 is set between the states "S8" and "S9". The read voltage R10 is set between the states "S9" and "S10". The read voltage R11 is set between the states "S10" and "S11". The read voltage R12 is set between the states "S11" and "S12". The read voltage R13 is set between the states "S12" and "S13". The read voltage R14 is set between the states "S13" and "S14". The read voltage R15 is set between the states "S14" and "S15".

In each write mode, the read pass voltage VREAD is set at a voltage higher than a state in which the threshold voltage is highest. A memory cell transistor MC to which the read pass voltage VREAD is applied is turned on, regardless of data stored therein. In each write mode, a verify voltage is set between neighboring threshold states. Specifically, in a write operation, verify voltages V1 through V15 are used respectively in the verify operations in the "S1" to "S15" states. For example, the verify voltages V1 through V15 are set to voltages higher than the read voltages R1 through R15, respectively.

The above-describe write modes used by the memory system 1 are merely an example. In each memory cell transistor MC, 5-bit or larger data may be stored. Each of the read voltages, read pass voltages, and verify voltages may be set at the same voltage value in each write mode, or may be set at different voltage values. In the present specification, a case where the memory system 1 uses a TLC mode as a data storing scheme will be described. The operation described below is applicable to the other write modes.

(Allocation of TLC-Mode Data)

Figure 14:
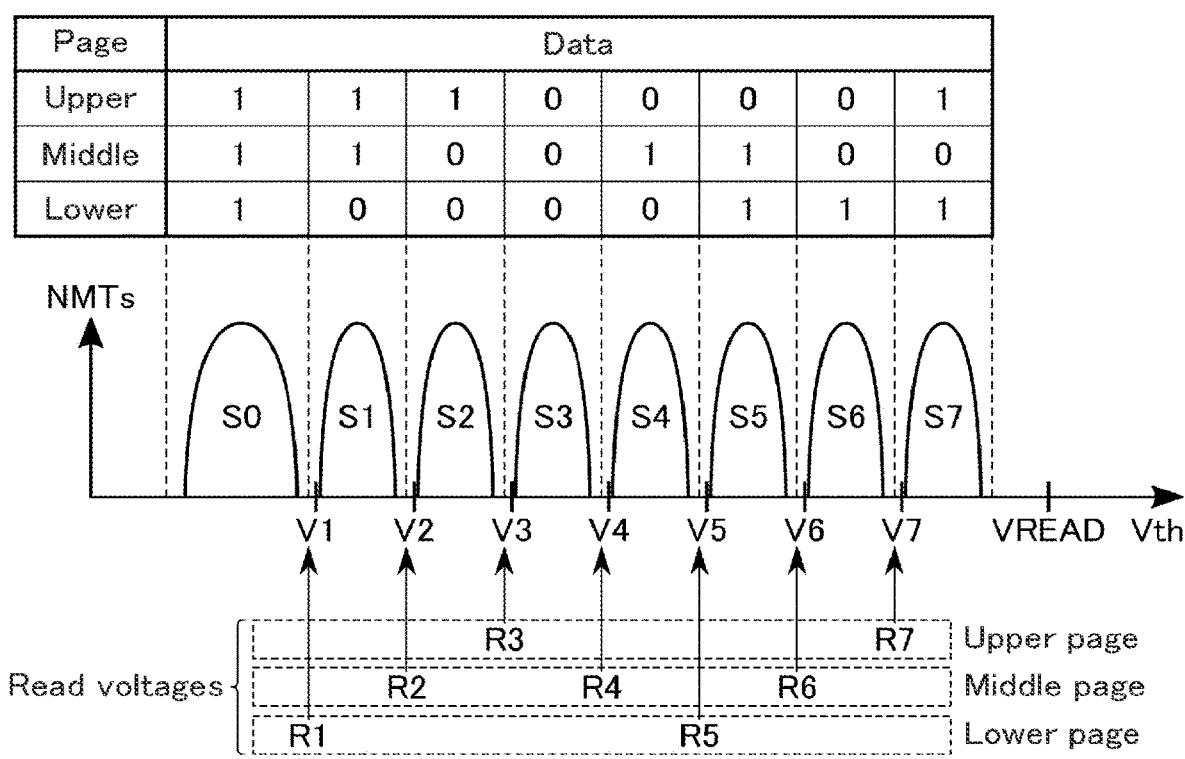
FIG. 14 is a schematic diagram showing an example of allocation of TLC-mode data used in the memory system according to the first embodiment.

FIG. 14 is a schematic diagram showing an example of allocation of TLC-mode data used in the memory system according to the first embodiment. As shown in FIG. 14, in the TLC mode, 3-bit, mutually different data is allocated to the eight states respectively. Listed below is an example of data allocation to the eight states.

"S0" state: "111 (upper bit/middle bit/lower bit)" data
"S1" state: "110" data
"S2" state: "100" data
"S3" state: "000" data
"S4" state: "010" data
"S5" state: "011" data
"S6" state: "001" data
"S7" state: "101" data For example, when the data allocation shown in FIG. 14 is applied in the TLC mode, one-page data constituted by the lower bit (lower-page data) is confirmed by a read operation using the read voltages R1 and R5. One-page data constituted by the middle bit (middle-page data) is confirmed by a read operation using the read voltages R2, R4, and R6. One-page data constituted by the upper bit (upper-page data) is confirmed by a read operation using the read voltages R3 and R7. In a page read operation in which a plurality of read voltages are used, arithmetic processing is performed in the sense amplifier unit SAU as appropriate. The data allocation used in the TLC mode may be set differently. The operation described below is applicable to different data allocations.

Hereinafter, determination processing using a read voltage R1 is called an "R1 read process". Determination processing using a read voltage R2 is called an "R2 read process". Determination processing using a read voltage R3 is called an "R3 read process". Determination processing using a read voltage R4 is called an "R4 read process". Determination processing using a read voltage R5 is called an "R5 read process". Determination processing using a read voltage R6 is called an "R6 read process". Determination processing using a read voltage R7 is called an "R7 read process".

(Layer Dependency of Threshold Voltage Distribution of Memory Cell Transistor MC)

As described with reference to FIGS. 6 to 8, the memory cell transistors MC may have different characteristics between layers. For this reason, even when a write operation under the same write condition is performed on the memory cell transistors MC, the threshold voltage distribution of the memory cell transistors MC may shift in accordance with a layer.

FIG. 15 is a schematic diagram showing an example of the threshold voltage distribution of the memory cell transistors MC in each layer in the memory system 1 according to the first embodiment. FIGS. 15(1) to (3) show the threshold voltage distributions of the memory cell transistors MC respectively corresponding to the layers L2 through L0. As shown in FIG. 15, the threshold voltage distributions of the memory cell transistors MC may have layer dependency.

In the present example, the threshold voltage distribution of the memory cell transistors MC included in the layer L2, namely the NAND string NS2, shifts lower than that in the layer L1, namely the NAND string NS1. The threshold voltage distribution of the memory cell transistors MC included in the layer L1, namely the NAND string NS1, shifts lower than that in the layer L0, namely the NAND string NS0. In other words, in the present example, the closer to the semiconductor substrate 30 the layer is, the higher the threshold voltage distribution of the memory cell transistors MC of the layer shifts.

The layer dependency of the threshold voltage distribution of the memory cell transistors MC may vary in accordance with a size of the memory cell transistors MC based on a shape of the multi-layer body 34 or a shape of the word line WL. For example, the threshold voltage distribution of the memory cell transistors MC included in an uppermost layer of multiple layers (layer L2, for example) may be located at a higher-voltage side than the threshold voltage distributions of the memory cell transistors MC included in the other layers. For example, the threshold voltage distribution of the memory cell transistors MC included in a middle layer of multiple layers L (layer L1, for example) may be located at a higher-voltage side than the threshold voltage distributions of the memory cell transistors MC included in the other layers.

The memory system 1 of the first embodiment may set different read voltages for each layer in which the memory cell transistors MC are formed. For example, in the R1 read operation, the read voltages R1_L0 through R1_L2 are set in correspondence to the layers L0 through L2. In the R2 read operation, the read voltages R2_L0 through R2_L2 are set in correspondence to the layers L0 through L2. In the R3 read operation, the read voltages R3_L0 through R3_L2 are set in correspondence to the layers L0 through L2. In the R4 read operation, the read voltages R4_L0 through R4_L2 are set in correspondence to the layers L0 through L2. In the R5 read operation, the read voltages R5_L0 through R5_L2 are set in correspondence to the layers L0 through L2. In the R6 read operation, the read voltages R6_L0 through R6_L2 are set in correspondence to the layers L0 through L2. In the R7 read operation, the read voltages R7_L0 through R7_L2 are set in correspondence to the layers L0 through L2.

In the present example, the read voltages R1_L0 through R1_L2 hold a relationship of "R1_L0>R1_L1>R1_L2". The read voltages R2_L0 through R2_L2 hold a relationship of "R2_L0>R2_L1>R2_L2". The read voltages R3_L0 through R3_L2 hold a relationship of "R3_L0>R3_L1>R3_L2". The read voltages R4_L0 through R4_L2 hold a relationship of "R4_L0>R4_L1>R4_L2". The read voltages R5_L0 through R5_L2 hold a relationship of "R5_L0>R5_L1>R5_L2". The read voltages R6_L0 through R6_L2 hold a relationship of "R6_L0>R6_L1>R6_L2". The read voltages R7_L0 through R7_L2 hold a relationship of "R7_L0>R7_L1>R7_L2".

The relationship between the read voltages set for each layer may change in accordance with layer dependency of the threshold voltage distribution of the memory cell transistors MC. The read voltages set for each layer are set with reference to the read voltages R1 through R7 shown in FIG. 14 for example. Hereinafter, the read voltages R1 through R7 used as a reference may be referred to as "default voltages". For example, an amount of shift from a default voltage in a read voltage set for each layer is controlled by a DAC (digital analog converter) value. In this case, a shift amount of a read voltage corresponds to a value obtained by multiplying a DAC value with a predetermined voltage value.

[1-2] Operation

Next, an operation of the memory system 1 according to the first embodiment will be described. Hereinafter, a selected word line WL will be referred to as a "selected word line WLsel". Application of a voltage to a word line WL corresponds to application of a voltage to the word line WL by the driver module 19 via the row decoder module 20. The address ADD and the command CMD received by the memory device 100 are transferred to the address register 13 and the command register 14, respectively. The write data received by the memory device 100 is transferred to a plurality of latch circuits XDL in the data register 22.

[1-2-1] Read Operation

First, a read operation and a shift read operation will be described as prerequisite operations in the memory system 1 of the first embodiment. The shift read operation is a read operation using a read voltage shifted from a default voltage. Hereinafter, the command sequence of the regular read operation and the command sequence of the shift read operation will be first described, and the relationship between the signal DQ and the layers of the memory cell array 18 in a read operation will be subsequently described.

(Command Sequence of Read Operation)

FIG. 16 is a schematic diagram showing an example of the command sequence of a read operation in a TLC mode in the memory system 1 according to the first embodiment. FIGS. 16(1) through (3) show command sequences of a lower-page read operation, a middle-page read operation, and an upper-page read operation, respectively. DQ[7:0] indicates command CMD, address ADD, and data DAT, etc. sent and received between the memory controller 200 and the memory device 100.

As shown in FIG. 16(1), when a lower-page read operation is performed, the memory controller 200 sends a command "01h", a command "00h", an address "ADD", a command "30h", in this order, to the memory device 100. The command "01h" is a command for designating an operation in which a lower page is selected. The command "00h" is a command for designating a read operation. The address "ADD" includes a read-target word line WL. The address "ADD" may be sent over several cycles. The command "30h" is a command for instructing commencement of a read operation. Upon receipt of the command "30h" from the memory device 100, the sequencer 15 changes the memory device 100 from a ready state to a busy state and performs a lower-page read operation.

In a lower-page read operation, the sequencer 15 performs an R1 read operation and an R5 read operation and transfers read results to the data register 22. Upon transfer of the read results to the data register 22 for example, the sequencer 15 changes the memory device 100 from a busy state to a ready state. Then, the read data Dout stored in the data register 22 is output (Dout) from the memory device 100 to the memory controller 200 based on the control of the memory controller 200. FIG. 16(1) shows a period in which the memory device 100 performs a read operation as "tR".

As shown in FIG. 16(2), when a middle-page read operation is performed, the memory controller 200 sends a command "02h", a command "00h", an address "ADD", a command "30h", in this order, to the memory device 100. The command "02h" is a command for designating an operation in which a middle page is selected. Upon receipt of the command "30h" from the memory device 100, the sequencer 15 changes the memory device 100 from a ready state to a busy state and performs a middle-page read operation. In a middle-page read operation, the sequencer 15 performs an R2 read operation, an R4 read operation, and an R6 read operation and transfers read results to the data register 22. The other operations in the middle-page operation are the same as those in the lower-page operation.

As shown in FIG. 16(3), when an upper-page read operation is performed, the memory controller 200 sends a command "03h", a command "00h", an address "ADD", a command "30h", in this order, to the memory device 100. The command "03h" is a command for designating an operation in which an upper page is selected. Upon receipt of the command "30h" from the memory device 100, the sequencer 15 changes the memory device 100 from a ready state to a busy state and performs an upper-page read operation. In an upper-page read operation, the sequencer 15 performs an R3 read operation and an R7 read operation and transfers read results to the data register 22. The other operations in the upper-page operation are the same as those in the lower-page operation.

(Command Sequence of Shift Read Operation)

FIG. 17 is a schematic diagram showing an example of the command sequence of a shift read operation in the memory system 1 according to the first embodiment. DQ[7:0]indicates command CMD, address ADD, and data DAT, etc. sent and received between the memory controller 200 and the memory device 100.

As shown in FIG. 17, when a shift read operation is performed, the memory controller 200 first sends command "XXh", command "YYh", and data "P0", "P1", "P2", "P3" to the memory device 100, in this order. The command "XXh is a command for instructing a change of setting of the memory device 100. The command "YYh" includes an address corresponding to setting items to which the change of setting is applied. The data "P0", "P1", "P2", and "P3" are data associated with the commands "XXh and "YYh", and include parameters applied to the setting items designated by the address "YYh".

Subsequently, when a shift read operation on a lower page is performed, the memory controller 200 sequentially sends a command "01h", a command "00h", address information "ADD", and a command "30h", in this order, to the memory device 100. The command "01h" may be changed as appropriate in accordance with a target page of a read operation. Upon receipt of the command "30h" by the memory device 100, the sequencer 15 changes the memory device 100 from a ready state to a busy state and performs a shift read operation on a lower page. In a shift read operation, the sequencer 15 uses the parameters included in the data "P0", "P1", "P2", and "P3" to determine a shift amount of a read voltage used in a shift read operation from a default voltage. The other operations in the shift read operation are the same as those in the regular read operation.

FIG. 18 is a table showing an example of the allocation of parameters used in a shift read operation in the memory system 1 according to the first embodiment. As shown in FIG. 18, the parameters relating to shift read operations are allocated to the data "P0", "P1", "P2", and "P3".

Specifically, if the target of a shift read operation is a lower-page read operation, "00h" is stored in the data "P0", for example. This "00h" indicates that the parameters relate to a lower-page read operation. If "P0" stores "00h", "P1" stores the shift amount "ΔR1" of the read voltage R1, "P2" stores the shift amount "ΔR5" of the read voltage R5, and "P3" is treated as invalid data.

If the target of a shift read operation is a middle-page read operation, the data "P0" stores "01h", for example. This "01h" indicates that the parameters relate to a middle-page read operation. If "P0" stores "01h", "P1" stores the shift amount "ΔR2" of the read voltage R2, "P4" stores the shift amount "ΔR4" of the read voltage R4, and "P3" stores the shift amount "ΔR6" of the read voltage R6.

If the target of a shift read operation is an upper-page read operation, the data "P0" stores "02h", for example. This "02h" indicates that the parameters relate to an upper-page read operation. If "P0" stores "02h", "P1" stores the shift amount "ΔR3" of the read voltage R3, "P7" stores the shift amount "ΔR7" of the read voltage R7, and "P3" is treated as invalid data.

The allocation of parameters used in the shift read operation may be a different allocation. The allocation of parameters used in the shift read operation may be changed in accordance with a write mode or data allocation used in the shift read operation.

(Relationship Between Signal DQ and Memory Cell Array 18)

FIG. 19 is a table showing an example of output signals output from the memory device 100 to the memory controller 200 in a read operation in the memory system 1 according to the first embodiment. FIG. 19 shows read data allocated to the output signal (signal DQ[7:0]) in each output cycle of read data. The data D0 through the data D31 each indicate data read respectively from the memory cell transistors MC coupled to the bit lines BL0 through BL31. In the following description, assume that data of the signal DQ assigned with the smaller number is output earlier in the order of outputting the concurrently output signals DQ0 through DQ7. In other words, in the present example, the output order of the concurrently output signals DQ0 through DQ7 is DQ0, DQ1, DQ2, DQ3, DQ4, DQ5, DQ6, DQ7.

As shown in FIG. 19, in the first cycle of read data output, the signals DQ0 through DQ7 are stored in the data D0 through D7, respectively. In the second cycle of read data output, the signals DQ0 through DQ7 are stored in the data D8 through D15, respectively. In the third cycle of read data output, the signals DQ0 through DQ7 are stored in the data D16 through D23, respectively. In the fourth cycle of read data output, the signals DQ0 through DQ7 are stored in the data D24 through D31, respectively. The data is output from the memory device 100 to the memory controller 200 in a similar manner, thereafter.

Thus, the allocation of signals DQ in which read data is output may be fixed. Furthermore, in the first embodiment, the correspondence between the output read data and the layer L is cyclic in the sequence of the layer L0 to the layer L2. In other words, the CPU 230 is able to know which layer L the received read data corresponds to by ascertaining the ordinal number of the read data.

In the present example, the data D(k×3) (k is an integer equal to or greater than 0) corresponds to read data from the memory cell transistors MC provided in the layer L0, namely read data from the memory cell transistors MC included in the NAND string NS0. The data D(1+k×3) corresponds to read data from the memory cell transistors MC provided in the layer L1, namely read data from the memory cell transistors MC included in the NAND string NS1. The data D(2+k×3) corresponds to read data from the memory cell transistors MC provided in the layer L2, namely read data from the memory cell transistors MC included in the NAND string NS2.

The relationship between the layer L and the signal DQ may be changed in accordance with a method of connecting a data bus IO between the data register 22 and the input/output circuit 10 or the order of data transfer. In the first embodiment, it suffices if the CPU 230 of the memory controller 200 ascertains at least the relationship between the read data received from the memory device 100 and the layer L.

[1-2-2] Patrol Operation

The memory system 1 according to the first embodiment may voluntarily perform a patrol operation in a period during which an operation based on an instruction from the host device 2 is not performed. In other words, the memory system 1 according to the first embodiment may perform a patrol operation independently of an instruction from a host device 2, during a background operation.

The patrol operation contributes to reduction of a reading error in the memory system 1 and detection of a block BLK in which failures occur. For example, in the patrol operation, the memory system 1 performs a patrol read operation and a correction operation targeting all pages of all blocks BLK in every predetermined patrol period.

The patrol read operation is a read operation for checking whether or not it is possible to read all pages targeted for the patrol operation and is performed with reference to a history table. The history table retains, for each word line WL, information indicating whether or not a patrol operation is performed in a patrol period, for example. The history table is preferably stored in a region that can be referred to at least by the CPU 230, for example the RAM 220.

The correction operation is an operation of updating a correction value table through estimating optimal read voltages based on a result of the patrol read operation. The correction value table retains correction values of the read voltages referred to by the CPU 230 in a read operation. The correction value table is preferably stored in a region that can be referred to at least by the CPU 230, for example the RAM 220.

In the following descriptions, the data obtained by determination processing using the read voltages based on the correction value table will be called "hard-bit data", and the data obtained by determination processing using read voltages shifted from the read voltages to be used in the reading of hard-bit data will be called "soft-bit data". Error correction processing using hard-bit data will be called "hard-decision decoding processing", and error correction processing using hard-bit data and soft-bit data will be called "soft-decision decoding processing".

(Flow of Patrol Operation)

FIG. 20 is a flowchart showing an example of the processing in the patrol operation in the memory system 1 according to the first embodiment. As shown in FIG. 20, after the patrol operation is commenced, the CPU 230 checks progress of the patrol operation by referring to the history table (step S10).

Subsequently, the CPU 230 performs a patrol read operation targeting a word line WL on which a patrol operation has not been performed, based on the checked progress of the patrol operation (step S11). Specifically, in step S11, the CPU 230 causes the memory device 100 to perform a read operation in each of a lower page, a middle page, and a higher page. In these read operations, the read voltages based on the correction value table are used.

Next, the CPU 230 causes the ECC circuit 260 to perform error correction processing on the received read result (step S12). The patrol read operation is performed using read voltages based on the correction value table. The error correction processing in step S12 corresponds to hard-decision decoding processing. Upon completion of the error correction processing by the ECC circuit 260, the CPU 230 checks if the error correction was successful (step S13).

If the error correction was determined to be successful in step S13 (Yes in step S13), the CPU 230 subsequently performs correction operation (step S14). The details of the correction operation will be described later. Upon completion of the correction operation, the CPU 230 updates the history table based on the correction value of the optimal read voltage obtained by the correction operation (step S15). Upon completion of updating the history table, the CPU 230 finishes the patrol operation in which the word line WL is selected and performs a patrol operation in which a subsequent word line WL is selected, as appropriate.

If the error correction was determined to be unsuccessful in step S13 (No in step S13), the CPU 230 subsequently performs a retry sequence (step S16). In the retry sequence, a shift read operation in which a predetermined correction is applied to a read voltage, a tracking read operation in which an optimal read voltage is searched for through multiple read operations, or soft-decision decoding processing may be performed, for example. These operations in the retry sequence may be performed several times singly or in combination until the error correction is successful. For example, in the retry sequence, the CPU 230 may perform the shift read operations several times, the tracking read operations several times, or the shift read operation then the tracking read operation. The details of the retry sequence will be described in the second through fourth embodiments.

If error-correctable data is read as a result of the retry sequence, the CPU 230 subsequently performs refresh processing (step S17). The refresh processing is a write operation in which data of a page on which the retry sequence is performed is evacuated to a block BLK differing from the block to which the page belongs to. Upon completion of the refresh operation, the CPU 230 finishes the patrol operation in which the word line WL is selected and performs a patrol operation in which a subsequent word line WL is selected, as appropriate.

The patrol read operation may be performed in units of pages or units of word lines WL. The refresh operation may be performed at a different timing. For example, the refresh operation may be performed in units of blocks BLK. The data obtained by the retry sequence is retained in the RAM 220, for example. Then, after the patrol operation on all pages in the block BLK is finished, the CPU 230 performs the refresh operation on the block BLK in a batch.

[1-2-3] Correction Operation

In a correction operation, correction values of optimal read voltages are calculated in accordance with the fail bit count that occurred between two neighboring states. "fail bit count" corresponds to the number of failed bits. In the memory system 1 according to the first embodiment, the correction values of the optimal read voltages are managed not only for each word line WL but for each layer L. First, the definition of the failed bits used in the correction operation is described with reference to FIG. 21.

Figure 21:
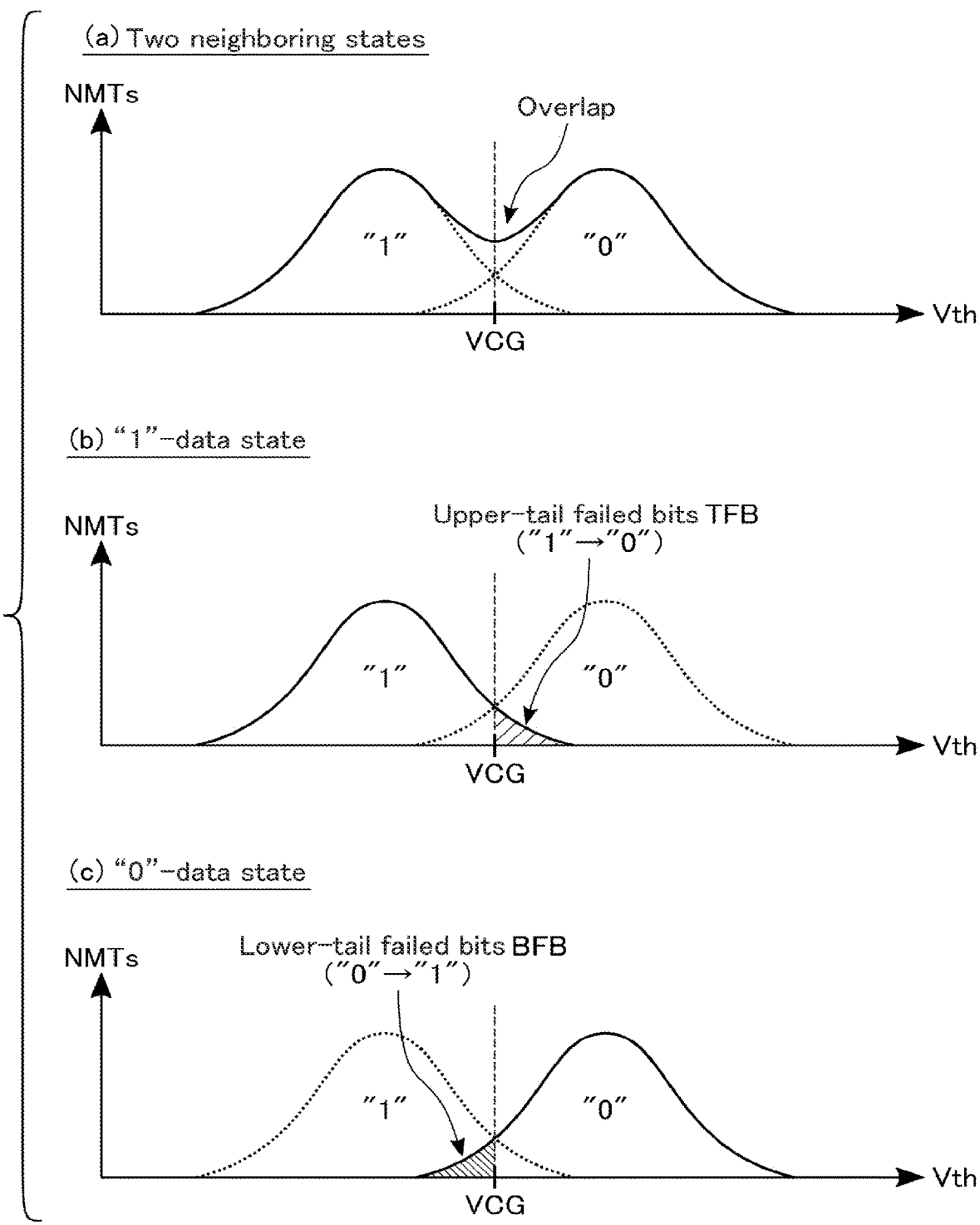
FIG. 21 is a schematic diagram showing an example of the failed bits between two neighboring states in the memory system according to the first embodiment.

FIG. 21 is a schematic diagram showing an example of the failed bits between two neighboring states in the memory system 1 according to the first embodiment. In FIG. 21(a), an overlapping part between two neighboring states is added. In FIGS. 21(b) and (c), the overlapping part between two neighboring states is shown independently. In FIGS. 21(b) and (c), one of the states corresponding to "1" data and "0" data is shown as a solid line, and the other state is shown as a dotted line.

As shown in FIG. 21, one of the two states corresponds to the "1" data and the other corresponds to the "0" data. VCG is a read voltage set between the state of "1" data and the state of "0" data. It is desirable that two neighboring states be separated from each other. However, as shown in FIG. 21(a), an overlapping part may be formed between the two neighboring states. The overlapping part includes failed bits of either one of the two neighboring states.

As shown in FIG. 21(b), in the state corresponding to "1" data, the data of the memory cell transistors MC in which the threshold voltage is equal to or higher than the read voltage VCG corresponds to failed bits. The error correction processing detects that "1" data has been changed to "0" data in the failed bits, and corrects the failed bits to "1" data.

As shown in FIG. 21(c), in the state corresponding to "0" data, the data of the memory cell transistors MC in which the threshold voltage is lower than the read voltage VCG corresponds to failed bits. The error correction processing detects that "0" data has been changed to "1" data in the failed bits, and corrects the failed bits to "0" data.

The definitions of data in the two neighboring states shown in FIG. 21 are interchangeable. In the following, of the two neighboring states, the failed bits that occurred in the state of a lower threshold voltage will be called "upper-tail failed bits TFB", and the failed bits that occurred in the state of a higher threshold voltage will be called "lower-tail failed bits BFB". The number of upper-tail failed bits TFB will be referred to as "the number of upper-tail failed bits TFBC", and the number of lower-tail failed bits BFB will be referred to as "the number of lower-tail failed bits BFBC".

The data allocation of the memory cell transistors MC is set in such a manner that the data differs only by 1 bit between the neighboring states. For this reason, in the case where the memory cell transistors MC store multiple-bit data, the CPU 230 can specify the type of failed bits detected by the error correction processing using the data before the error correction and the data after the error correction. If a TLC scheme is used, correspondence between the upper-tail failed bits TFB and the lower-tail failed bits BFB in the two neighboring states is as listed below:

(Example) "Pre-correction upper bit/pre-correction middle bit/pre-correction lower bit"→"Corrected upper bit/corrected middle bit/corrected lower bit": Type of corresponding failed bits "110"→"111": upper-tail failed bits TFB of "S0" state
"111"→"110": lower-tail failed bits BFB of "S1" state
"100"→"110": upper-tail failed bits TFB of "S1" state
"110"→"100": lower-tail failed bits BFB of "S2" state
"000"→"100": upper-tail failed bits TFB of "S2" state
"100"→"000": lower-tail failed bits BFB of "S3" state
"010"→"000": upper-tail failed bits TFB of "S3" state
"000"→"010": lower-tail failed bits BFB of "S4" state
"011"→"010": upper-tail failed bits TFB of "S4" state
"010"→"011": lower-tail failed bits BFB of "S5" state
"001"→"011": upper-tail failed bits TFB of "S5" state
"011"→"001": lower-tail failed bits BFB of "S6" state
"101"→"001": upper-tail failed bits TFB of "S6" state
"001"→"101": lower-tail failed bits BFB of "S7" state (Method of Correcting Read Voltages)

FIG. 22 is a table showing an example of shift amounts of the read voltages in the correction operation in the memory system according to the first embodiment. The fail bit count FBC corresponds to the total fail bit count between two neighboring states and to the sum of the number of lower-tail failed bits BFBC and the number of upper-tail failed bits TFBC. The failure ratio RAT corresponds to the ratio between the number of lower-tail failed bits BFBC and the number of upper-tail failed bits TFBC in two neighboring states and to a value obtained by dividing BFBC with TFBC, for example. The shift amount of a read voltage is described by a DAC value.

As shown in FIG. 22, if BFBC=10 and TFBC=100 for example, the fail bit count FBC is "110" and the failure ratio RAT is "0.1". If BFBC=30 and TFBC=60 for example, the fail bit count FBC is "90" and the failure ratio RAT is "0.5". If BFBC=40 and TFBC=40 for example, the fail bit count FBC is "80" and the failure ratio RAT is "1". If BFBC=60 and TFBC=30 for example, the fail bit count FBC is "90" and the failure ratio RAT is "2". If BFBC=100 and TFBC=10 for example, the fail bit count FBC is "110" and the failure ratio RAT is "10".

Thus, the fail bit count FBC tends to be smaller as the failure ratio RAT becomes closer to "1", for example. If a read voltage is shifted in a positive direction, it is assumed that the number of lower-tail failed bits BFBC increases and the number of higher tail failed bits TFBC decreases; similarly, if a read voltage is shifted in a negative direction, it is assumed that the number of lower-tail failed bits BFBC decreases and the number of higher tail failed bits TFBC increases.

For this reason, the shift amount of a read voltage is set in a positive direction if the failure ratio RAT is smaller than "1" and set in a negative direction if the failure ratio RAT is greater than "1". Furthermore, the shift amount of a read voltage is set in such a manner that it becomes larger as the failure ratio RAT becomes less close to 1. For example, if RAT=0.1, a read voltage is shifted by +5DAC. If RAT=0.5, a read voltage is shifted by +3DAC. If RAT=1, a read voltage is not shifted. If RAT=2, a read voltage is shifted by −3DAC. If RAT=10, a read voltage is shifted by −5DAC.

The shift amount of a read voltage with respect to the failure ratio RAT is not limited to the setting shown in FIG. 22. In the memory system 1 according to the first embodiment, the shift amount of a read voltage in a correction operation is preferable as long as it is determined based at least on a failure ratio RAT.

The above-described correction of read voltages is performed on each read voltage and each layer (NAND string NS). Specifically, the CPU 230 extracts the threshold voltage distribution of the memory cell transistors MC of each layer in accordance with the output order of the read data, as described above with reference to FIG. 19. Then, the CPU 230 performs the correction operation for each threshold voltage distribution of the memory cell transistors MC extracted for each layer.

If the TLC scheme is used, the fail bit count FBC corresponding to the read voltage R1 corresponds to the sum of the TFBC in the "S0" state and the BFBC in the "S1" state. The fail bit count FBC corresponding to the read voltage R2 corresponds to the sum of the TFBC in the "S1" state and the BFBC in the "S2" state. The fail bit count FBC corresponding to the read voltage R3 corresponds to the sum of the TFBC in the "S2" state and the BFBC in the "S3" state. The fail bit count FBC corresponding to the read voltage R4 corresponds to the sum of the TFBC in the "S3" state and the BFBC in the "S4" state. The fail bit count FBC corresponding to the read voltage R5 corresponds to the sum of the TFBC in the "S4" state and the BFBC in the "S5" state. The fail bit count FBC corresponding to the read voltage R6 corresponds to the sum of the TFBC in the "S5" state and the BFBC in the "S6" state. The fail bit count FBC corresponding to the read voltage R7 corresponds to the sum of the TFBC in the "S6" state and the BFBC in the "S7" state.

The CPU 230 calculates the following for each layer: the failure rate RAT corresponding to the "S0" and "S1" states, the failure rate RAT corresponding to the "S1" and "S2" states, the failure rate RAT corresponding to the "S2" and "S3" states, the failure rate RAT corresponding to the "S3" and "S4" states, the failure rate RAT corresponding to the "S4" and "S5" states, the failure rate RAT corresponding to the "S5" and "S6" states, the failure rate RAT corresponding to the "S6" and "S7" states. Then the CPU 230 determines a shift amount of each of the read voltages R1 through R7 for each layer L. The CPU 230 then updates the correction value table as appropriate based on the determined shift amounts of the read voltages in each layer L.

FIG. 23 is a table showing an example of the correction value table used in the memory system according to the first embodiment. As shown in FIG. 23, the correction values COL of the read voltages are managed for each combination of block BLK, string unit SU, word line WL, and layer ID, for example. The correction values COL correspond to correction values of each read voltage used in a read operation. The correction values COL are managed in DAC (digital analog converter) values for each read voltage, for example. The layer ID is the same as the identifier assigned to a NAND string NS.

In a read operation, the CPU 230 refers to correction values COL corresponding to the layers L0 through L2 of an address corresponding to a selected word line WLsel and uses a voltage shifted from a default voltage based on the correction value COL as a read voltage. In this case, the CPU 230 performs a read operation using an optimal correction value COL for each layer, for example. An example of this operation will be described in the second embodiment.

When a read operation is performed in units of pages, only the correction values COL of read voltages used in a read operation of a read-target page may be referred to. The correction values COL may be grouped as appropriate. For example, if the memory unit MU has four or more memory cell transistors MC stacked in the Z-direction, the correction values COL applicable to each of the layers may be grouped as appropriate in accordance with the layer ID. The memory system 1 may apply a same correction value COL to multiple word lines WL having similar characteristics. It is thereby possible for the memory system 1 to reduce the size of the correction value table.

(Flow of Correction Operation)

Figure 24:
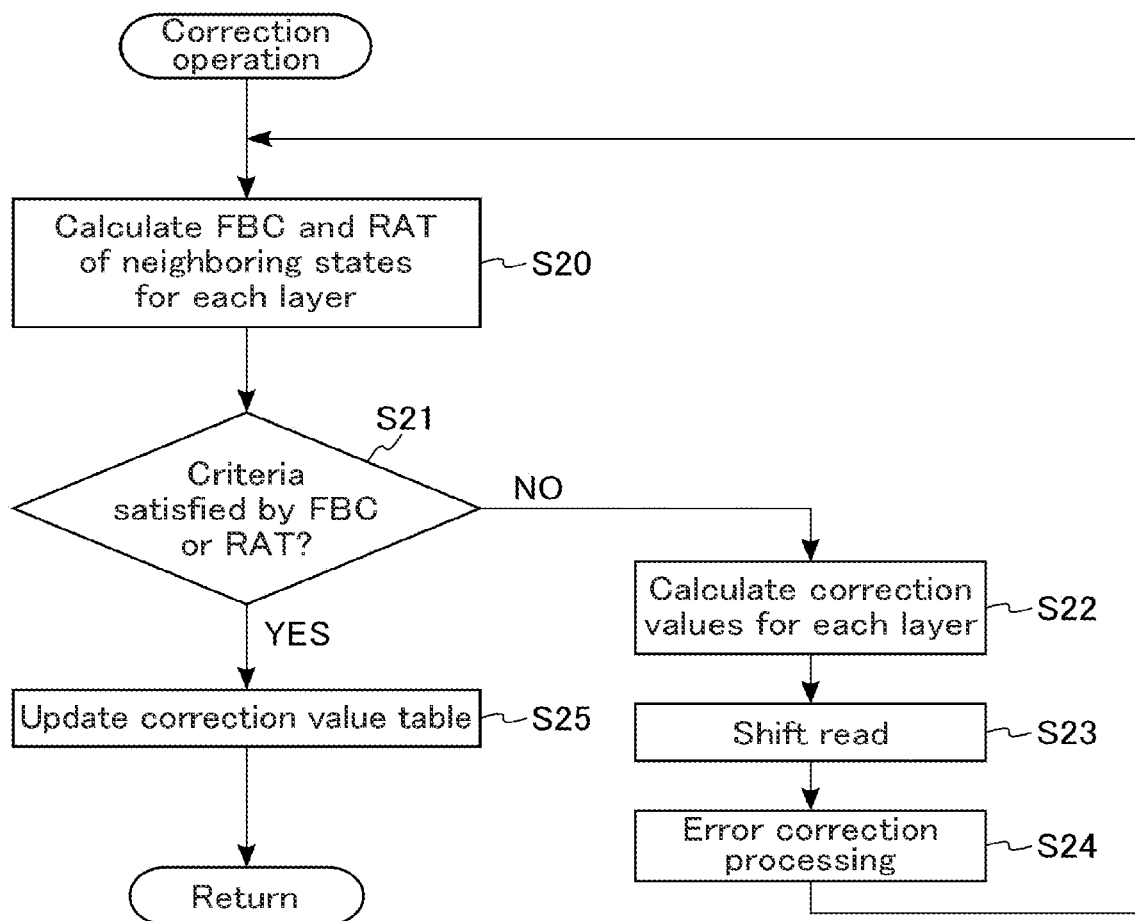
FIG. 24 is a flowchart showing an example of the correction operation of the memory system according to the first embodiment.

FIG. 24 is a flowchart showing an example of the correction operation of the memory system 1 according to the first embodiment. As shown in FIG. 24, when a correction operation is commenced, the CPU 230 calculates the fail bit count FBC and the failure ratio RAT between the neighboring states based on the results of the error correction processing in steps S12 and S13 (step S20).

Subsequently, the CPU 230 checks if the calculated fail bit count FBC or the calculated failure ratio RAT satisfies a predetermined criterion (step S21). A predetermined criterion is set to each of the fail bit count FBC and the failure ratio RAT. For example, the criterion for the fail bit count FBC is to be less than a predetermined value, and the criterion for the failure ratio RAT is to fall within a predetermined range including "1".

If it is determined that either the FBC or the RAT does not satisfy the criterion in step S21 (No in step S21), the CPU 230 calculates correction values of read voltages based on the failure ratio RAT for each layer (step S22). The CPU 230 applies, for example, the method described with FIG. 22 to the calculation of the correction values. The CPU 230 then performs a shift read operation using the calculated correction values of the read voltages (step S23). The shift read operation is a read operation in which a read voltage to be used is shifted compared to a read voltage used in the patrol read operation in step S11. Thereafter, the CPU 230 causes the ECC circuit 260 to perform error correction processing on the received read result of the shift read operation (step S24). The error correction processing in step S24 corresponds to hard-decision decoding processing similar to that in step S12. Since the error correction processing in step S24 uses the read result of the shift read operation in which the corrected read voltages are used, the probability of success in the error correction is higher than in the error correction processing performed before the read voltage correction. Upon completion of the hard-decision decoding processing in step S24, the CPU 230 returns to the processing in step S20. In other words, the CPU 230 repeats the processing in steps S20 through S24 as appropriate.

If it is determined that either the FBC or the RAT satisfies the reference in step S21 (Yes in step S21), the CPU 230 updates the correction value table based on, for example, the correction values of the read voltages used in the shift read operation and the result of the error correction processing (step S25). Upon completion of updating the correction value table, the CPU 230 completes the correction operation. In other words, the CPU 230 proceeds to the processing in step S15 and updates the history table of the patrol operation.

The processing in steps S20 through S22 in the above-described correction operation is performed for each set read voltage. In other words, in step S21, there may be both the read voltages that satisfy the condition and those that do not satisfy the condition. If there are the read voltages that do not satisfy the condition, the CPU 230 repeats the process in step S22 through step S24. The processing may proceed from step S21 to step S25 under a condition that the processing in step S20 through step S24 is iterated for a predetermined number of times, or a predetermined state passes the condition of step S21, for example.

The FBC and RAT may be calculated by the ECC circuit 260. If there is a page that satisfies the condition in step S21 during the iteration of the processing of steps S20 through S24, the CPU 230 may omit a shift read operation on the page in step S23. In this case, the CPU 230 uses a result based on a most immediate shift read operation on the page to calculate the FBC and RAT in step S20. Furthermore, the CPU 230 may update the correction value table based on the calculated correction value after step S22. In this case, the CPU 230 performs a read operation based on the correction value table in step S23.

(Specific Example of Correction Operation)

Hereinafter, a specific example of the correction operation will be described, while focusing on a lower page. In the following description, the fail bit count FBC at the read voltage R1 indicates the FBC corresponding to the pair of "S0" and "S1" states. The failure ratio RAT at the read voltage R1 indicates the RAT corresponding to the pair of "S0" and "S1" states. Similarly, the fail bit count FBC at the read voltage R5 indicates the FBC corresponding to the pair of "S4" and "S5" states, and the failure ratio RAT at the read voltage R5 indicates the RAT corresponding to the pair of "S4" and "S5" states.

FIG. 25 is a table showing an example of the correction values COL, the fail bit count FBC, and the failure ratio RAT in the correction operation in the memory system 1 according to the first embodiment. As shown in FIG. 25, the correction values COL of the read voltages R1 and R5 before a correction operation are set to "0". As an example of the criteria of the FBC and the RAT in step S21, "FBC<30 or 0.7<RAT<1.5" is set.

As shown in FIG. 25(a), in a first read operation, the read voltage R1 to which the correction value COL=0 and the read voltage R5 to which the correction value COL=0 are used. In the first read operation, the FBC of the read voltages R1 and R5 are "60" and "80" respectively, and the RAT of the read voltages R1 and R5 are "0.5" and "2" respectively. In other words, the read voltages R1 and R5 do not satisfy the criteria for the FBC and the RAT.

In this case, the CPU 230 calculates correction values of the read voltages R1 and R5. For example, the CPU 230 corrects the read voltage R1 with +2DAC based on RAT=0.5 and the read voltage R5 with −5DAC based on RAT=2. The CPU 230 then performs a first read operation in which the obtained correction values of the read voltages are applied.

As shown in FIG. 25(b), in a second read operation, the read voltage R1 to which the correction value COL=+2DAC and the read voltage R5 to which the correction value COL=−5DAC are used. In the second read operation, the FBC of the read voltages R1 and R5 are "25" and "50" respectively, and the RAT of the read voltages R1 and R5 are "0.8" and "0.5" respectively. In other words, the read voltage R1 satisfies the criteria for the FBC and the RAT ("S1" pass). On the other hand, the read voltage R5 does not satisfy the criteria for the FBC and the RAT.

In this case, the CPU 230 calculates a correction value of the read voltage R5. For example, the CPU 230 corrects the read voltage R5 with +3DAC based on RAT=0.5. The CPU 230 performs a minor adjustment to the read voltage R1 that satisfies the criteria and applies the +1DAC correction to the read voltage R1 based on the RAT=0.8. The CPU 230 then performs a second read operation in which the obtained correction values of the read voltages are applied.

As shown in FIG. 25(c), in a third read operation, the read voltage R1 to which the correction value COL=+3DAC and the read voltage R5 to which the correction value COL=−2DAC are used. In the third read operation, the FBC of the read voltages R1 and R5 are "20" and "40" respectively, and the RAT of the read voltages R1 and R5 are "1" and "1.2" respectively. In other words, the read voltage R1 does not satisfy the criteria for the FBC and the RAT, similarly to the second read result. On the other hand, the read voltage R5 fails to satisfy the criterion for the FBC but satisfies the criterion for the RAT.

Thus, even in a case where only either one of the FBC and RAT criteria is satisfied, the criteria for the read voltage R5 set in step S21 are satisfied ("S5" pass). The CPU 230 then performs minor adjustment to the read voltage R5 that satisfies the criteria and applies the −1DAC correction to the read voltage R5 based on the RAT=1.2 and completes the correction operation.

As a result, as shown in FIG. 25(d), the correction values COL of the read voltage R1 and R5 after the correction operation are set at "+3" and "−3", respectively. Although the description is omitted, the sequencer 15 may perform a correction operation for a middle page and an upper page in parallel to a correction operation for a lower page. The ±1DAC correction applied to the read voltage that satisfies the criteria in step S21 is a minor adjustment.

Figure 26:
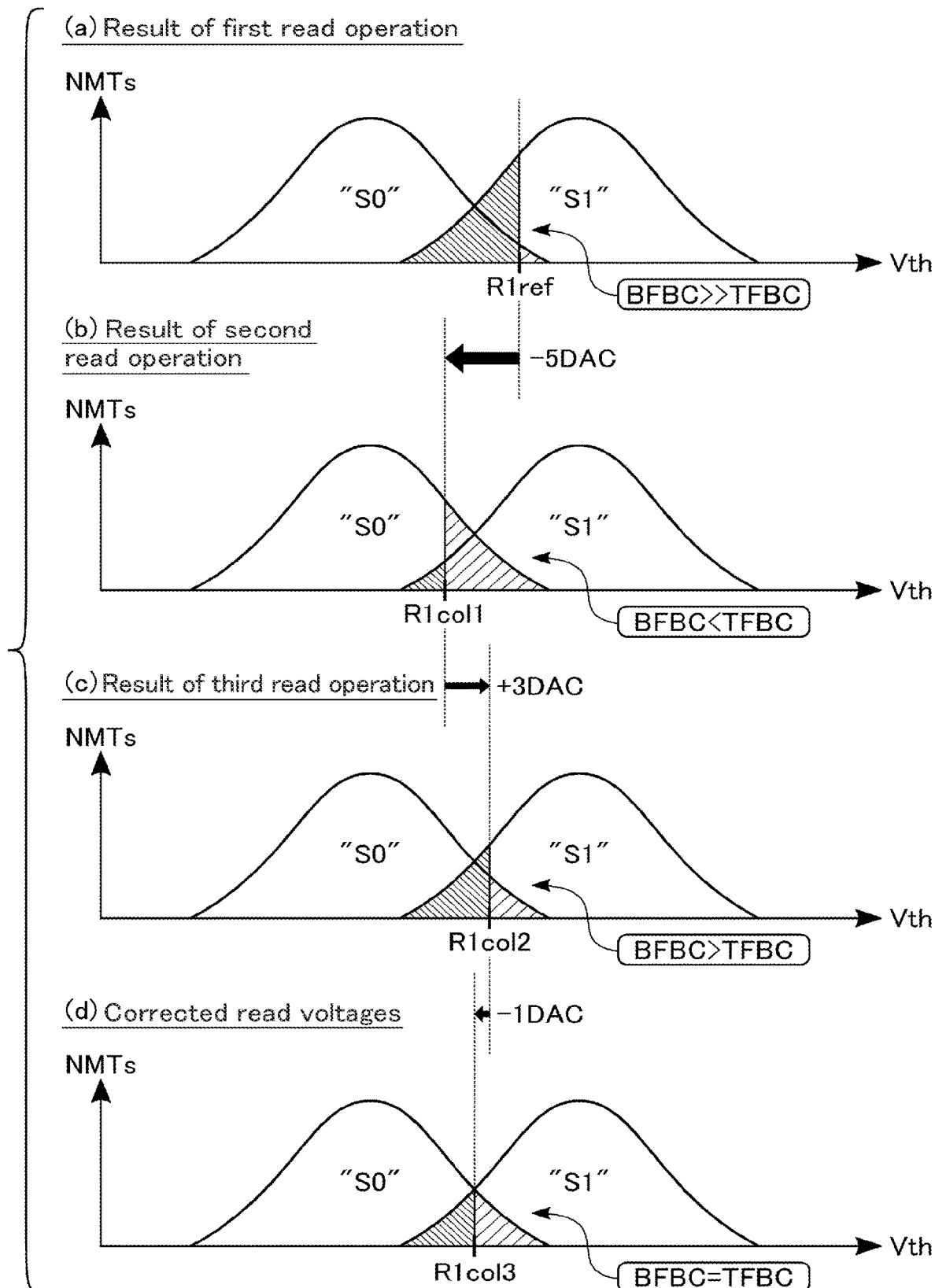
FIG. 26 is a schematic diagram showing an example of the change in the fail bit count in a correction operation in the memory system according to the first embodiment.

FIG. 26 is a schematic diagram showing an example of the change in the fail bit count in a correction operation in the memory system 1 according to the first embodiment. FIG. 26 shows the threshold voltage distribution of the states relating to the read voltage R5 in each read operation described with reference to FIG. 25 in the above. "R1ref", "R1col1", "R1col2", and "R1col3" are read voltage R5 to which the correction value COL=0DAC, −5DAC, −2DAC, and −3DAC, respectively.

As shown in FIG. 26(a), the first read operation result in which R5ref is used is BFBC>>TFBC. For this reason, in the subsequent second read operation, the read voltage R5 is corrected to a great extent in the negative direction in which the number of lower-tail fail bits BFBC decreases.

As shown in FIG. 26(b), in the second read operation result in which R5col1 is used, BFBC<TFBC. For this reason, in the subsequent third read operation, the read voltage R5 is corrected to be in the positive direction in which the number of upper-tail failed bits TFBC increases.

As shown in FIG. 26(c), the third read operation result in which R5col2 is used is BFBC>TFBC. On the other hand, as described with reference to FIG. 25, the condition for the PAT in step S21 is satisfied in the third read result. For this reason, after the correction, the read voltages are subtly adjusted to be in the negative direction in which the number of lower-tail failed bits BFBC decreases.

As shown in FIG. 26(d), in a read operation using the corrected read voltage R5col3, BFBC=TFBC or an approximation thereof is expected. In other words, in the read operation using the corrected read voltage R5col3, it is expected that the failure rate PAT will approach "1" and the fail bit count FBC will become a minimum value.

[1-3] Advantageous Effects of First Embodiment

With the above-described memory system 1 according to the first embodiment, reliability of written data can be improved. In the following, advantageous effects of the memory system 1 according to the first embodiment are described in detail.

The memory cell transistors MC store different data based on a threshold voltage that changes in accordance with the number of electrons in the charge storage layer. However, the electrons in the charge storage layer may increase or decrease due to stress caused by the operations or a lapse of time. In other words, the threshold voltages of the memory cell transistors MC may be changed after data is written into those memory cell transistors MC. For example, if the shape of the threshold voltage distribution of the memory cell transistors MC changes due to an influence such as a read disturbance or program disturbance, the fail bit count FBC increases and the error correction of the read data may fail.

In contrast, the memory system 1 according to the first embodiment periodically performs a patrol operation in order to inhibit the increase in the fail bit count FBC. Furthermore, the memory system 1 corrects the read voltages as appropriate by a correction operation performed after a patrol read operation. It is thereby possible for the memory system 1 according to the first embodiment to maintain the correction values of the read voltages in an optimal state and to suppress the risk of becoming impossible to correct errors in data written in the memory cell transistors MC.

In the correction operation, the memory system 1 of the first embodiment uses a failure ratio RAT, which is a ratio between the number of lower-tail failed bits BFBC and the number of upper-tail failed bits TFBC. The failure ratio RAT is used to calculate an estimate of a direction and an amplitude for read voltage correction. Furthermore, the memory system 1 repeats the set of correction value calculation and shift read operation in a correction operation and is able to correct the read voltages at higher accuracy by approximating the failure ratio RAT to 1. As a result, the memory system 1 according to the first embodiment can inhibit the increase in the fail bit count FBC.

In the memory system 1 of the first embodiment, the shape of the memory cell transistors MC may change in accordance with the process of manufacturing the memory device 100. The gate length and gate width of the memory cell transistors MC may vary between layers. In other words, the characteristics of the memory cell transistors MC may vary between layers. For this reason, an optimal read voltage may be different between layers in which the memory cell transistors MC are provided.

Then, in the memory system 1 of the first embodiment, the above-described correction operation is performed for each layer. In other words, the memory system 1 of the first embodiment calculates a correction value of an optimal read voltage for each layer. As a result, the memory system 1 of the first embodiment can perform a read operation using an optimal value for each layer and inhibit the increase in the fail bit count FBC. Therefore, the above-described memory system 1 according to the first embodiment can improve reliability of data stored in the memory system 1.

[2] Second Embodiment

The memory system 1 of the second embodiment has a hardware configuration similar to that of the memory system 1 of the first embodiment. The second embodiment relates to a first example of the retry sequence described in the first embodiment. In the following, differences between the memory system 1 of the second embodiment and that of the first embodiment will be described.

[2-1] Operation

The memory system 1 of the second embodiment performs a tracking read operation and an optimal value read operation in the retry sequence. The tracking read operation is an operation of detecting a valley between neighboring states and calculating an optimal read voltage. The tracking read operation may be called "Vth tracking". The optimal value read operation is a read operation using correction values of the read voltages obtained by the tracking read operation. Hereinafter, a one-level read operation will be described as a prerequisite operation in the memory system 1 of the second embodiment, and the details of the tracking read operation and the retry sequence will be subsequently described.

[2-1-1] One-Level Read Operation

Figures 27, 28:
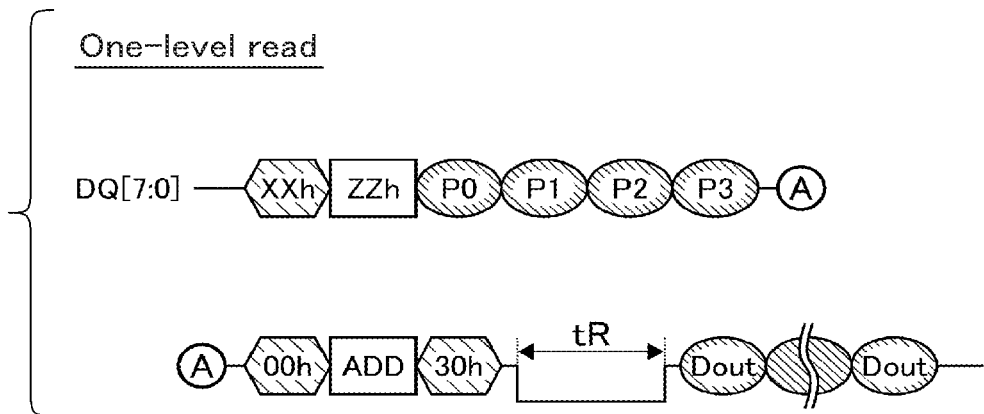
FIG. 27 is a schematic diagram showing an example of the command sequence of a one-level read operation in the memory system according to the second embodiment.
FIG. 28 is a table showing an example of the allocation of parameters used in a one-level read operation in the memory system according to the second embodiment.

FIG. 27 is a schematic diagram showing an example of the command sequence of a one-level read operation in the memory system 1 according to the second embodiment. DQ[7:0] indicates command CMD, address ADD, and data DAT, etc. sent and received between the memory controller 200 and the memory device 100.

As shown in FIG. 27, when a one-level read operation is performed, the memory controller 200 first sends command "XXh", address "ZZh", data "P0", "P1", "P2", "P3" to the memory device 100, in this order. The address "ZZh" is a command for designating a one-level read operation. The data "P0", "P1", "P2", and "P3" are data associated with the commands "XXh and "ZZh", and include parameters applied to the setting items designated by the address "ZZh".

Subsequently, the memory controller 200 sequentially sends command "00h", address "ADD", and command "30h", in this order, to the memory device 100. Upon receipt of command "30h" by the memory device 100, the sequencer 15 changes the memory device 100 from a ready state to a busy state, and performs a one-level read operation. In the one-level read operation, the sequencer 15 performs a read operation using a single read voltage designated by the data "P0", "P1", "P2", and "P3". The other operations in the one-level read operation are the same as those in the regular read operation.

FIG. 28 is a table showing an example of the allocation of parameters used in a one-level read operation in the memory system 1 according to the second embodiment. As shown in FIG. 28, a command designating a read voltage at which a one-level read operation is performed is assigned to data "P0". Specifically, for example, "00h", "01h", "02h", "03h", "04h", "05h", and "06h" are stored in the data "P0" if the targets of the one-level read operation are R1 read operation, R2 read operation, R3 read operation, R4 read operation, R5 read operation, R6 read operation, and R7 read operation. In the parameter setting for the one-level read operation, "P1", "P2", and "P3" are treated as invalid data, for example.

The allocation of parameters used in the one-level read operation may be a different allocation. The allocation of parameters used in the one-level read operation may be changed in accordance with a write mode used in the one-level read operation.

[2-1-2] Tracking Read Operation

Figures 29, 30:
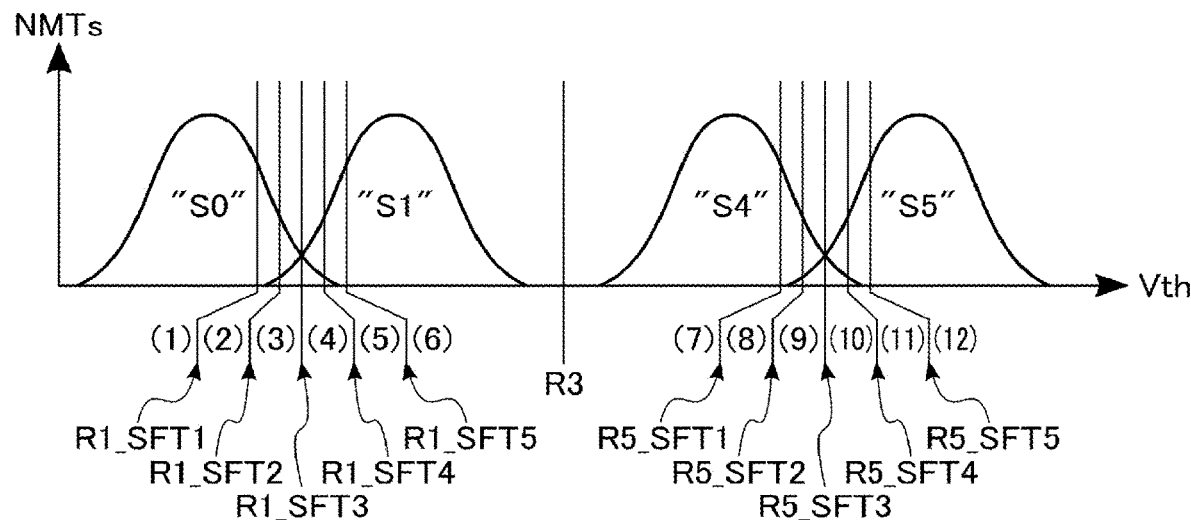
FIG. 29 is a schematic diagram showing an example of the read voltages used in a tracking read operation in the memory system of the second embodiment.
FIG. 30 is a table showing an example of read data obtained by a tracking read operation in the memory system according to the second embodiment.

FIG. 29 is a schematic diagram showing an example of the read voltages used in a tracking read operation in the memory system 1 of the second embodiment. FIG. 29 shows the "S0", "S1", "S4", and "S5" states relating to a lower-page read operation extracted from the threshold voltage distribution of the memory cell transistors MC. As shown in FIG. 29, in the tracking read operation, the CPU 230 performs a read operation in which the read voltages are shifted (a shift read) multiple times in the valley between two neighboring states as a target.

In the present example, in the tracking read operation targeting the read voltage R1, the read voltages R1_SFT1 through R1_SFT5 are set, and in the tracking read operation targeting the read voltage R5, the read voltages R1_SFT1 through R1_SFT5 are set. The CPU 230 performs, for example, a one-level read operation using the read voltage R3 in a tracking read operation corresponding to a lower-page read operation. The read voltages used in the one-level read are preferably at least read voltages set between multiple types of read voltages used in a read operation of a targeted page.

The amplitudes of the set read voltages hold the following relationship:
R1_SFT1<R1_SFT2<R1_SFT3<R1_SFT4<R1_SFT5<R3<R5_SFT1<R5_SFT2<R5_SFT3<R5_SFT4<R5_SFT5.
The read voltages R1_SFT1 through R1_SFT5 are set in the vicinity of the valley between the states "S0" and "S1". The read voltages R5_SFT1 through R5_SFT5 are set in the vicinity of the valley between the states "S4" and "S5". These read voltages divide the threshold voltage distribution into twelve areas (1) through (12).

FIG. 30 is a table showing an example of read data obtained by a tracking read operation in the memory system 1 according to the second embodiment. Section "R3" corresponds to a read result obtained by the one-level read operation of the read voltage R3. Section "SFT1" corresponds to a read result obtained by the one-level read operation of the read voltages R1_SFT1 and R5_SFT1. Section "SFT2" corresponds to a read result obtained by the one-level read operation of the read voltages R1_SFT2 and R5_SFT2. Section "SFT3" corresponds to a read result obtained by the one-level read operation of the read voltages R1_SFT3 and R5_SFT3. Section "SFT4" corresponds to a read result obtained by the one-level read operation of the read voltages R1_SFT4 and R5_SFT4. Section "SFT5" corresponds to a read result obtained by the one-level read operation of the read voltages R1_SFT5 and R5_SFT5.

As shown in FIG. 30, the read result of section "R3" becomes "0" when the threshold voltages of the memory cell transistors MC are included in one of the areas (1) to (6) and becomes "1" when the threshold voltages of the memory cell transistors MC are included in one of the areas (7) to (12).

The read result of section "SFT1" becomes "1" when the threshold voltages of the memory cell transistors MC are included in one of the areas (1) or (8) to (12) and becomes "0" when the threshold voltages of the memory cell transistors MC are included in one of the areas (2) to (7).

The read result of section "SFT2" becomes "1" when the threshold voltages of the memory cell transistors MC are included in one of the areas (1), (2), and (9) through (12) and becomes "0" when the threshold voltages of the memory cell transistors MC are included in one of the areas (3) to (8).

The read result of section "SFT3" becomes "1" when the threshold voltages of the memory cell transistors MC are included in one of the areas (1) through (3) and (10) through (12) and becomes "0" when the threshold voltages of the memory cell transistors MC are included in one of the areas (4) to (9).

The read result of section "SFT4" becomes "1" when the threshold voltages of the memory cell transistors MC are included in one of the areas (1) through (4) and (11) through (12) and becomes "0" when the threshold voltages of the memory cell transistors MC are included in one of the areas (5) to (10).

The read result of section "SFT5" becomes "1" when the threshold voltages of the memory cell transistors MC are included in one of the areas (1) through (5) and (12) and becomes "0" when the threshold voltages of the memory cell transistors MC are included in one of the areas (6) to (11).

Figure 31:
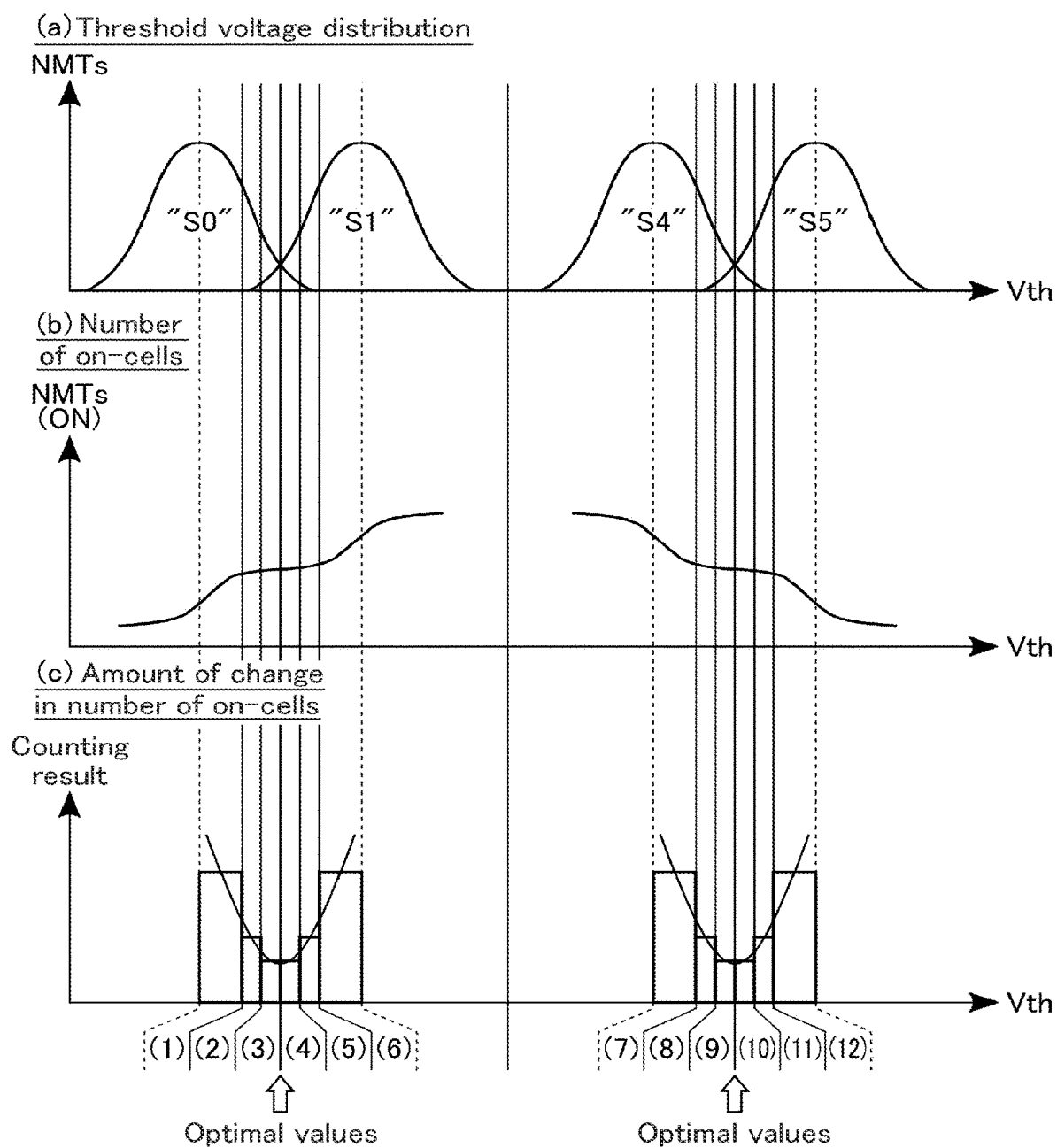
FIG. 31 is a schematic diagram showing an example of a method of detecting optimal values of the read results in a tracking read operation in the memory system according to the second embodiment.

FIG. 31 is a schematic diagram showing an example of a method of detecting optimal values of the read results in a tracking read operation in the memory system 1 according to the second embodiment. FIG. 31(*a*) shows the threshold voltage distribution shown in FIG. 29. FIG. 31(*b*) shows the number of the memory cell transistors MC in an on state (the number of on-cells) corresponding to FIG. 31(*a*). FIG. 31(*c*) shows a result of counting the on-cells for each of the areas (1) through (12) corresponding to FIG. 31(*b*) and corresponds to an amount of change in the number of on-cells.

As shown in FIG. 31(*a*), when a tracking read operation is performed, the CPU 230 counts the number of on-cells of the memory cell transistors MC as shown in FIG. 31(*b*). The number of on-cells corresponds to the number of memory cell transistors MC in which the read result is data "0" shown in FIG. 30. Specifically, to count the number of on-cells included in the areas (1) through (6) that are lower than the read voltage R3, the CPU 230 specifies whether a cell is in an on state or in an off state using a result of an AND operation on a read result of the section targeted for counting and the read result of the section "R3". On the other hand, to count the number of on-cells included in the areas (7) through (12) that are higher than the read voltage R3, the CPU 230 specifies whether a cell is in an on state or in an off state using a result of an AND operation on a read result of the section targeted for counting and inversion data of the read result of the section "R3".

For example, to count the number of on-cells included in the area (1), the CPU 230 specifies whether a cell is in an on state or in an off state using a result of an AND operation on a read result of the section "SFT1" and the read result of the section "R3". To count the number of on-cells included in the area (7), the CPU 230 specifies whether a cell is in an on state or in an off state using a result of an AND operation on a read result of the section "SFT1" and the read result of the section "R3". The number of on-cells in an area associated with other sections is calculated with a method similar to the method used for the areas (1) and (7) associated with the section "SFT1".

In the present example, the number of on-cells increases in an ascending manner, from the area (1) toward the area (5), and decreases in a descending manner, from the area (7) toward the area (12). The CPU 230 then counts the number of on-cells of each of the areas (1) through (12) as shown in FIG. 31(*a*). If so, a counting result exhibiting a concave shape can be obtained for each of the valley between the states "S0" and "S1" and the valley between the states "S4 and "S5". Then, the CPU 230 detects an optimal value of the read voltage R1 based on the valley portions detected in the areas (1) through (5) and calculates a correction value of the read voltage R1. Similarly, the CPU 230 detects an optimal value of the read voltage R5 based on the valley portions detected in the areas (7) through (12) and calculates a correction value of the read voltage R5. The CPU 230 can perform a tracking read operation targeting pages other than a lower page in a manner similar to a tracking read operation targeting a lower page.

[2-1-3] Retry Sequence

Figure 32:
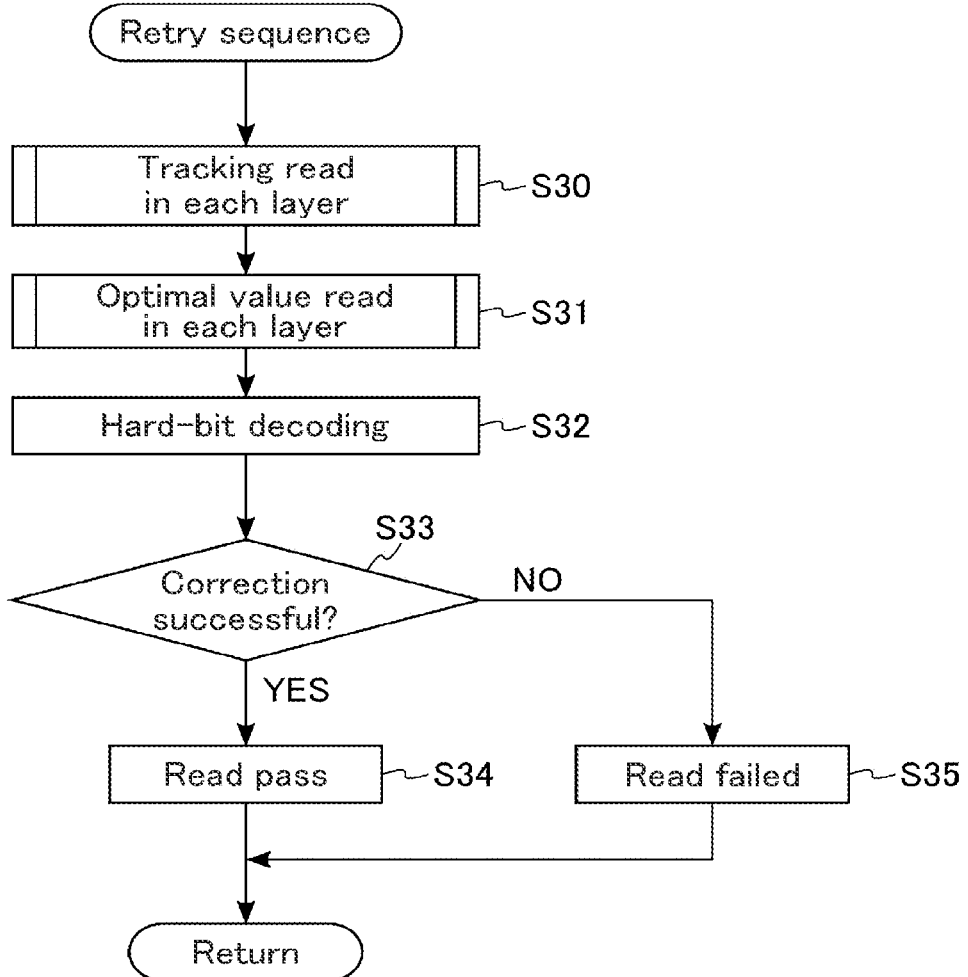
FIG. 32 is a flowchart showing an example of the retry sequence of the memory system according to the second embodiment.

FIG. 32 is a flowchart showing an example of the retry sequence of the memory system 1 according to the second embodiment.

As shown in FIG. 32, upon commencement of a retry sequence in step S16 of FIG. 20, the CPU 230 performs a tracking read operation in each layer (step S30). Specifically, the CPU 230 performs a read operation in which the read voltages are shifted (a shift read operation) multiple times, as already described with reference to FIG. 29. Then, the CPU 230 extracts the threshold voltage distribution of the memory cell transistors MC of each layer in accordance with the output order of the read data, as described above with reference to FIG. 19. Then, the CPU 230 performs a calculation of an optimal value of a read voltage for each threshold voltage distribution of the memory cell transistors MC extracted for each layer.

Next, the CPU 230 performs an optimal value read operation in each layer (step S31). In other words, the CPU 230 performs a shift read operation using an optimal read voltage of each layer obtained by the process in step S30. Thereafter, the CPU 230 causes the ECC circuit 260 to perform error correction processing (hard-decision decoding processing) on the read result of the optimal value read operation (step S32).

If the error correction is successful in step S32 (Yes in step S33), the CPU 230 determines the result of the read operation in the page as "read pass" (step S34) and finishes the retry sequence (Return). If the result of the read operation is "read pass", the CPU 230 performs a refresh operation in subsequent step S17, using the read data obtained by the optimal value read operation.

If the error correction failed in step S32 (No in step S33), the CPU 230 determines the result of the read operation in the page as "read failed" (step S34) and finishes the retry sequence (Return). If the result of the read operation is "read failed", the CPU 230 recognizes the result as a read data loss of the page.

(Calculation of Optimal Value for Each Layer)

Figure 33:
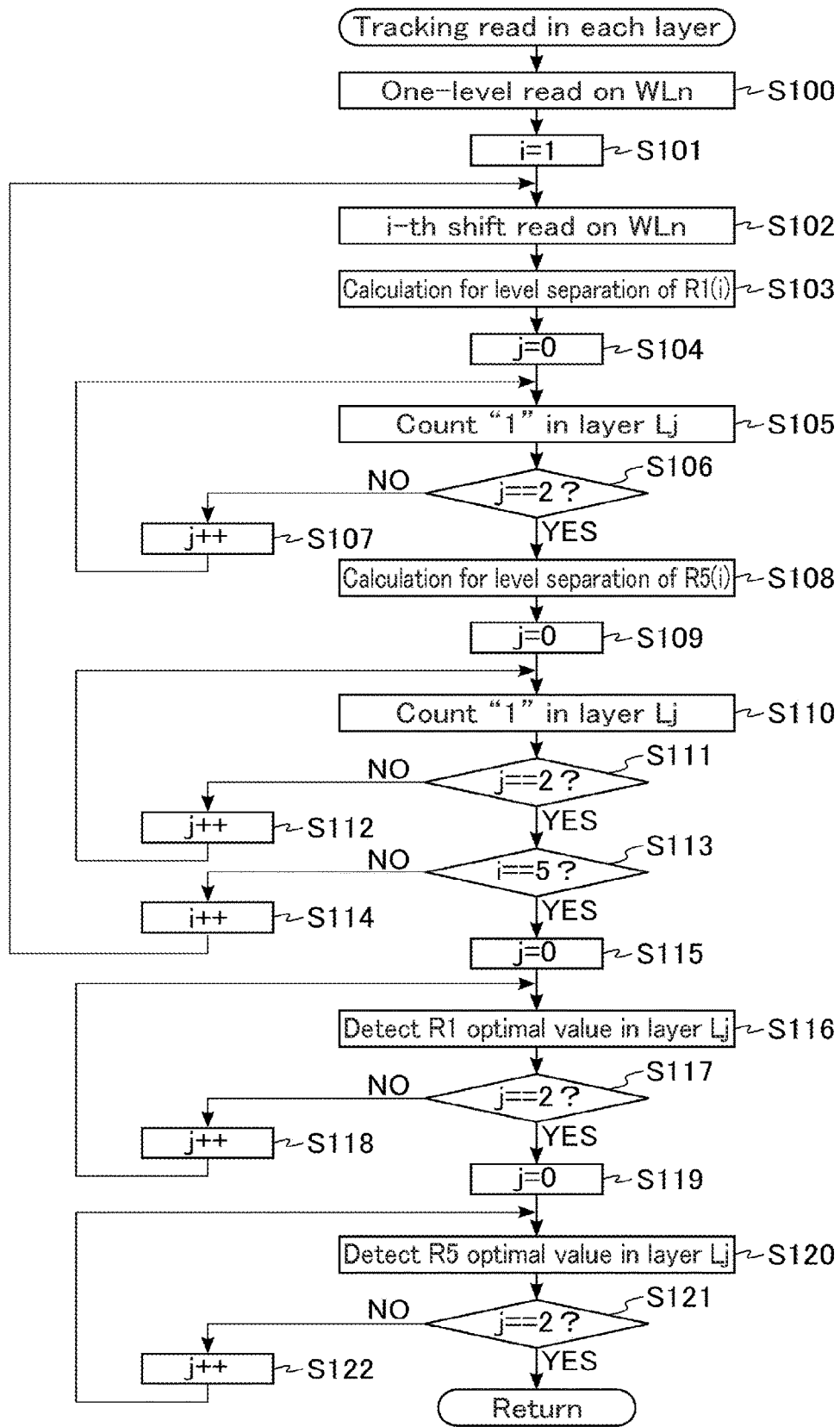
FIG. 33 is a flowchart showing an example of the tracking read process in each layer in the memory system according to the second embodiment.

FIG. 33 is a flowchart showing an example of the tracking read process in each layer in the memory system 1 according to the second embodiment. FIG. 33 shows a specific example of an operation when the tracking read operation in each layer is performed when a lower page is targeted. The CPU 230 uses, for example, a plurality of counters in the tracking read process. In the following, descriptions will be given, taking the value of the first counter as a variable "i" and the value of the second counter as a variable "j".

As shown in FIG. 33, upon commencement of the tracking read operation in each layer in step S30 of FIG. 32, the CPU 230 causes the memory device 100 to perform a one-level read operation in which a word line WLn is selected as a target of the tracking read operation and causes the RAM 220 to store a result of the one-level read operation received from the memory device 100 (step S100).

Next, the CPU 230 substitutes "1" in the first counter (step S101). In other words, the CPU 230 performs the processing where "i=1". The value of the first counter indicates the number of times of performing a shift read operation.

Next, the CPU 230 selects a word line WLn and causes the memory device 100 to perform an i-th shift read operation using the read voltages R1 and R5, and causes the RAM 220 to store a result of the shift read operation received from the memory device 100 (step S102).

Next, the CPU 230 performs an R1(i) level separation calculation (step S103). This "R1(i) level separation calculation" corresponds to an AND operation on a read result of the read voltages R1_SFTi and R5_SFTi in an i-th shift read operation and a read result of a one-level read operation. The CPU 230 thus obtains data indicating the number of on-cells associated with the read voltage R1(i) in the i-th shift read operation.

Next, the CPU 230 resets the second counter (step S104). In other words, the CPU 230 performs the processing of "j=0". The value of the second counter indicates the layer location of the memory cell transistors MC.

Next, the CPU 230 counts "1" in the layer Lj (step S105). Specifically, the CPU 230 extracts a calculation result corresponding to the layer Lj from the calculation results obtained in step S103. Then, the CPU 230 counts the number of calculation results in which the data is "1" among the extracted calculation results, and causes the RAM 220 for example to store the counting result as a counting result of the number of on-cells of the read voltage R1_SFTi.

Next, the CPU 230 checks if the value of the second counter reaches a predetermined value (step S106). Specifically, the CPU 230 checks whether or not "j==2" is satisfied. "j==2" indicates that the number of stacks of the memory cell transistors MC is three. The value of the determination in step S106 may be changed in accordance with the number of stacks of the memory cell transistors MC.

In step S106, if "j==2" is not satisfied (No in step S106), the CPU 230 increments the value of the second counter (j++ in step S107) and returns to step S105.

In step S106, if "j==2" is satisfied (Yes in step S106), the CPU 230 performs R5(i) level separation calculation (step S108). This "R5(i) level separation calculation" corresponds to an AND operation on a read result of the read voltages R1_SFTi and R5_SFTi in an i-th shift read operation and inversion data of a read result of a one-level read operation. The CPU 230 thus obtains data indicating the number of on-cells associated with the read voltage R5(i) in the i-th shift read operation.

Next, the CPU 230 resets the second counter (step S109). In other words, the CPU 230 performs the processing of "j=0".

Next, the CPU 230 counts "1" in the layer Lj (step S110). Specifically, the CPU 230 extracts a calculation result corresponding to the layer Lj from the calculation results obtained in step S108. Then, the CPU 230 counts the number of calculation results in which the data is "1" among the extracted calculation results, and causes the RAM 220 for example to store the counting result as a counting result of the number of on-cells of the read voltage R5_SFTi.

Next, the CPU 230 checks if the value of the second counter reaches a predetermined value (step S111).

Specifically, the CPU 230 checks whether or not "j==2" is satisfied. The value of the determination in step S111 may be changed in accordance with the number of stacks of the memory cell transistors MC.

In step S111, if "j==2" is not satisfied (No in step S111), the CPU 230 increments the value of the second counter (j++ in step S112) and returns to step S110.

In step S111, if "j==2" is satisfied (Yes in step S111), the CPU 230 checks if the value of the first counter reaches a predetermined value (step S113). Specifically, the CPU 230 checks whether or not "i==5" is satisfied. The value of the determination in step S113 may be changed in accordance with the number of times of performing a shift read operation in a tracking read operation.

In step S113, if "i==5" is not satisfied (No in step S113), the CPU 230 increments the value of the first counter (j++ in step S114) and returns to step S102.

In step S113, if "i==5" is satisfied (Yes in step S113), the CPU 230 resets the second counter (step S115). In other words, the CPU 230 performs the processing of "j=0".

Next, the CPU 230 detects an optimal value of R1 of the layer Lj (step S116). Specifically, the CPU 230 detects an optimal value of the read voltage R1 in the layer Lj based on a counting result of the number of on-cells of each of the read voltages R1_SFT1 through R1_SFT5 of multiple memory cell transistors MC corresponding to the layer Lj. In other words, the CPU 230 calculates a correction value of the read voltage R1 in the layer Lj.

Next, the CPU 230 checks if the value of the second counter reaches a predetermined value (step S117). Specifically, the CPU 230 checks whether or not "j==2" is satisfied. The value of the determination in step S111 may be changed in accordance with the number of stacks of the memory cell transistors MC.

In step S117, if "j==2" is not satisfied (No in step S117), the CPU 230 increments the value of the second counter (j++ in step S118) and returns to step S116.

In step S117, if "j==2" is satisfied (Yes in step S117), the CPU 230 resets the second counter (step S119). In other words, the CPU 230 performs the processing of "j=0".

Next, the CPU 230 detects an optimal value of R5 of the layer Lj (step S120). Specifically, the CPU 230 detects an optimal value of the read voltage R5 in the layer Lj based on a counting result of the number of on-cells of each of the read voltages R5_SFT1 through R1_SFT5 of multiple memory cell transistors MC corresponding to the layer Lj. In other words, the CPU 230 calculates a correction value of the read voltage R5 in the layer Lj.

Next, the CPU 230 checks if the value of the second counter reaches a predetermined value (step S121). Specifically, the CPU 230 checks whether or not "j==2" is satisfied. The value of the determination in step S121 may be changed in accordance with the number of stacks of the memory cell transistors MC.

In step S121, if "j==2" is not satisfied (No in step S121), the CPU 230 increments the value of the second counter (j++ in step S122) and returns to step S120.

In step S121, if "j==2" is satisfied (Yes in step S122), the CPU 230 finishes a tracking read operation for each layer (Return). In other words, the CPU 230 completes the processing in step S30 and proceeds to step S31.

The CPU 230 may perform a tracking read operation in each layer using a method other than the method described with reference to FIG. 33. The CPU 230 may change the order of the processing shown in FIG. 33 as appropriate or may adopt different operations, as long as similar results are obtained. The CPU 230 can perform a tracking read operation in different layers.

FIG. 34 is a table showing an example of read data targeted for counting in each layer in the memory system 1 according to the second embodiment. The content of the table shown in the upper part of FIG. 34 is the same as that shown in FIG. 19. The lower part of FIG. 34 indicates combinations of a layer targeted for counting and read data.

As shown in the lower part of FIG. 34, if the layer targeted for counting is "L0", the CPU 230 extracts the (1+k×3)-th read data (k is an integer equal to or greater than 0) in the order of outputting read data. Specifically, the CPU 230 extracts the data D0, D3, D6, D9, D12, D15, D18, D21, . . . as read data targeted for counting in the layers L0.

If the layer targeted for counting is "L1", the CPU 230 extracts the (2+k×3)-th read data in the order of outputting read data. Specifically, the CPU 230 extracts data D1, D4, D7, D10, D13, D16, D19, D22, . . . as read data targeted for counting in the layer L1.

If the layer targeted for counting is "L2", the CPU 230 extracts the (3+k×3)-th read data in the order of outputting read data. Specifically, the CPU 230 extracts data D2, D5, D8, D11, D14, D17, D20, D23, . . . as read data targeted for counting in the layer L2.

Thus, the CPU 230 extracts read data for each layer in accordance with the order of outputting data so as to perform the processing in each of step S105 and step S110. In other words, the CPU 230 can count the number of predetermined bits in each layer.

(Optimal Value Read Operation)

FIG. 35 is a flowchart showing an example of the optimal value read process in each layer in the memory system 1 according to the second embodiment. FIG. 35 shows a specific example of an operation when the optimal value read operation in each layer is performed when a lower page is targeted. The CPU 230 uses, for example, the second counter in the tracking read process. In the following, descriptions will be given, taking the value of the second counter as a variable "j".

As shown in FIG. 35, upon commencement of a tracking read operation in step S31 of FIG. 32, the CPU 230 resets the second counter (step S200). In other words, the CPU 230 performs the processing of "j=0". The value of the second counter indicates the layer location of the memory cell transistors MC.

Next, the CPU 230 selects a word line WLn and causes the memory device 100 to perform a shift read operation using an R1 optimal value and an R5 optimal value of the layer Lj, and causes the RAM 220 to store a result of the shift read operation received from the memory device 100 (step S201).

Next, the CPU 230 extracts a result of reading the layer Lj from a result of the shift read operation obtained in step S102, in accordance with the order of outputting read data (step S202).

Next, the CPU 230 merges the read operation result extracted in step S202 (step S203). Details of the method of merging the read operation results will be described later in detail.

Next, the CPU 230 checks if the value of the second counter reaches a predetermined value (step S204). Specifically, the CPU 230 checks whether or not "j==2" is satisfied. The value of the determination in step S204 may be changed in accordance with the number of stacks of the memory cell transistors MC.

In step S204, if "j==2" is not satisfied (No in step S204), the CPU 230 increments the value of the second counter (j++ in step S205) and returns to step S201.

In step S204, if "j==2" is satisfied (Yes in step S204), the CPU 230 finishes an optimal value read operation for each layer (Return). In other words, the CPU 230 completes the processing in step S31 and proceeds to step S32.

The CPU 230 may perform an optimal value read operation in each layer using a method other than the method described with reference to FIG. 35. The CPU 230 may change the order of the processing shown in FIG. 35 as appropriate or may adopt different operations, as long as similar results can still be obtained after such changes. The CPU 230 can perform an optimal value read operation in different layers.

FIG. 36 is a table showing an example of read data merged by the read operation in the memory system 1 according to the second embodiment. FIG. 36 shows read data of a first eight bits allocated to the output signal (signal DQ[7:0]) in each layer targeted for an optimal value read operation. To the read data of the layer L0, "_L0" is added. To the read data of the layer L1, "_L1" is added. To the read data of the layer L2, "_L2" is added. The merged data is a combination of read results merged by the CPU 230 in step S203. As shown in FIG. 36, the CPU 230 merges the read results of the optimal value read operations.

In the present example, the (1+k×3)-th read data (k is an integer equal to or greater than 0) in the order of outputting read data corresponds to the layer L0. For this reason, the CPU 230 extracts data D0_L0, data D3_L0, data D6_L0, . . . from the read results of the optimal value read operations in the layers L0 and stores the data in the merged data.

In the present example, the (2+k×3)-th read data in the order of outputting read data corresponds to the layer L1. For this reason, the CPU 230 extracts data D1_L1, data D4_L1, data D7_L1, . . . from the read results of the optimal value read operations in the layer L1 and stores the data in the merged data.

In the present example, the (3+k×3)-th read data in the order of outputting read data corresponds to the layer L2. For this reason, the CPU 230 extracts data D2_L2, data D5_L2, . . . from the read results of the optimal value read operations in the layer L2 and stores the data in the merged data.

The CPU 230 generates merged data as described above, and the ECC circuit 260 refers to the generated merged data and performs hard-decision decoding processing S32. If there are multiple layers having the same correction values of the read voltages, the CPU 230 may integrate optimal value read operations for the multiple layers into a single operation. In this case, the number of times of optimal value read operations performed by the CPU 230 becomes smaller than the number of stacks of the memory cell transistors MC.

The CPU 230 may extract a result using the same read voltage as the optimal value read operation from the data of the tracking read operation stored in the buffer memory 240. In this case, the CPU 230 can reduce the number of times of performing the optimal value read operations and can enhance the speed of the retry sequence processing.

[2-2] Advantageous Effects of Second Embodiment

As described above, in a retry sequence, the memory system 1 of the second embodiment performs a tracking read operation for searching for an optimal value of a read voltage in each layer and an optimal value read operation using a detected optimal value. It is thereby possible for the memory system 1 of the second embodiment to read data of a page that cannot be successfully read by a regular read operation more accurately than in the regular read operation and to correct errors at a high success rate. As a result, the memory system 1 according to the second embodiment can retrieve the data in which the fail bit count FBC is increased and can improve the reliability of data stored in the memory system 1.

[3] Third Embodiment

The memory system 1 of the third embodiment has a hardware configuration similar to that of the memory system 1 of the first embodiment. The third embodiment relates to a second example of the retry sequence described in the first embodiment. In the following, differences of the memory system 1 of the third embodiment from the first and second embodiments will be described.

[3-1] Operation

The memory system 1 of the third embodiment performs first soft-bit decoding processing in the retry sequence. The first soft-bit decoding processing is soft-bit decoding using hard-bit data and two types of soft-bit data (−Δ soft-bit data and +Δ soft-bit data). The retry sequence in the third embodiment and the first soft-bit decoding processing will be explained below.

[3-1-1] Retry Sequence

Figure 37:
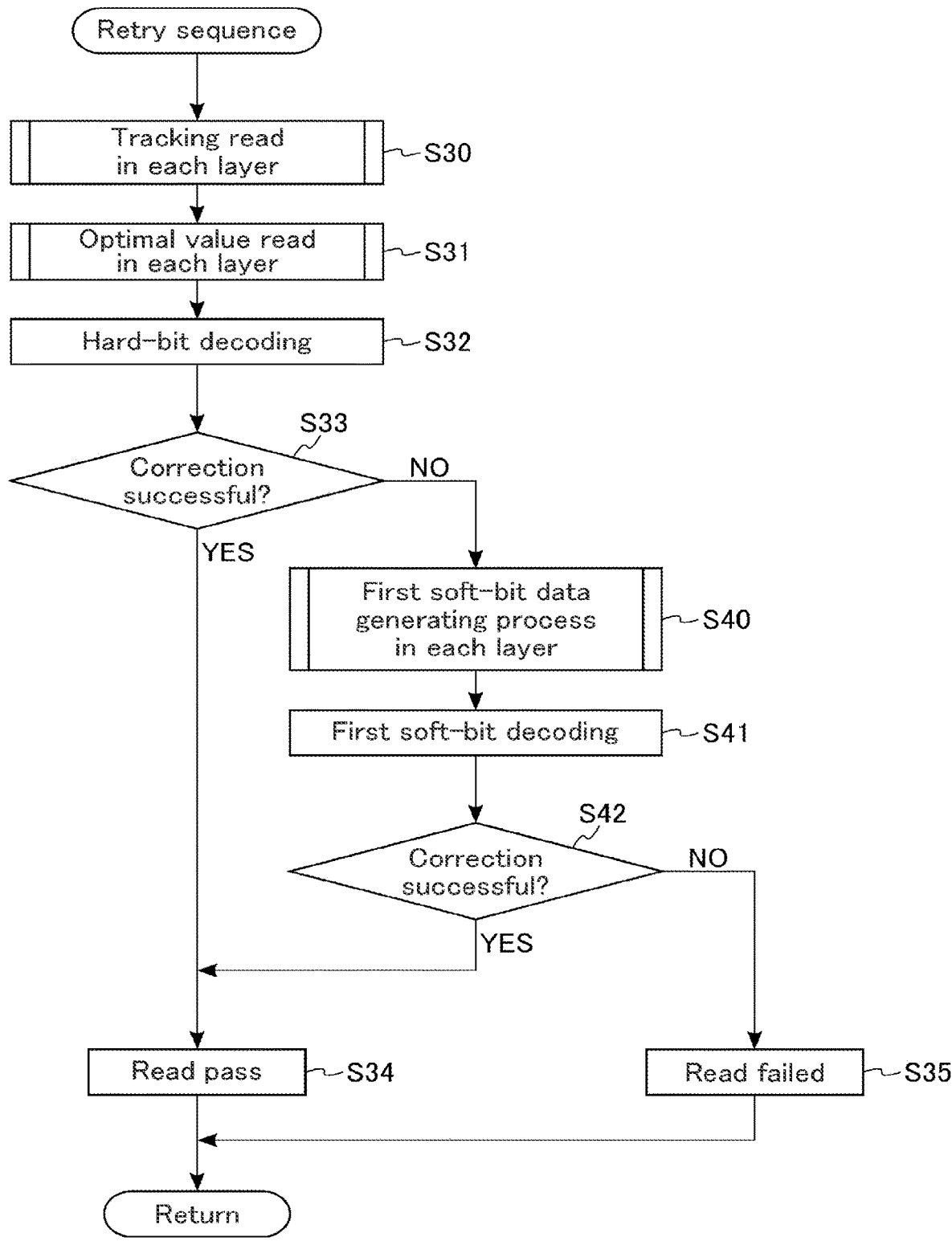
FIG. 37 is a flowchart showing an example of the retry sequence of the memory system according to the third embodiment.

FIG. 37 is a flowchart showing an example of the retry sequence of the memory system 1 according to the third embodiment.

As shown in FIG. 37, upon commencement of a retry sequence in step S16, the CPU 230 performs a tracking read operation in each layer (step S30), similarly to the second embodiment. Next, the CPU 230 performs an optimal value read operation in each layer (step S31), similarly to the second embodiment. Thereafter, the CPU 230 causes the ECC circuit 260 to perform error correction processing (hard-bit decoding processing) on the read result of the optimal value read operation (step S32), similarly to the second embodiment.

If the error correction is successful in step S32 (Yes in step S33), the CPU 230 determines the result of the read operation in the page as "read pass" (step S34) and finishes the retry sequence (return).

If the error correction in step S32 failed (No in step S33), the CPU 230 performs a first soft-bit data generating process in each layer (step S40). The CPU 230 then performs first soft-bit decoding processing using a read result of step S30 and a read result of step S40 (step S41). The details of the first soft-bit data generating process and the first soft-bit decoding processing in each layer will be described later.

If it is determined in step S42 that the error correction was successful (Yes in step S42), the CPU 230 determines the result of the read operation in the page as "read pass" (step S34) and finishes the retry sequence (return).

If it is determined that the error correction failed in step S42 (No in step S42), the CPU 230 determines the result of the read operation in the page as "read failed" (step S35) and finishes the retry sequence (return).

[3-1-2] First Soft-Bit Data Generating Process in Each Layer

Figure 38:
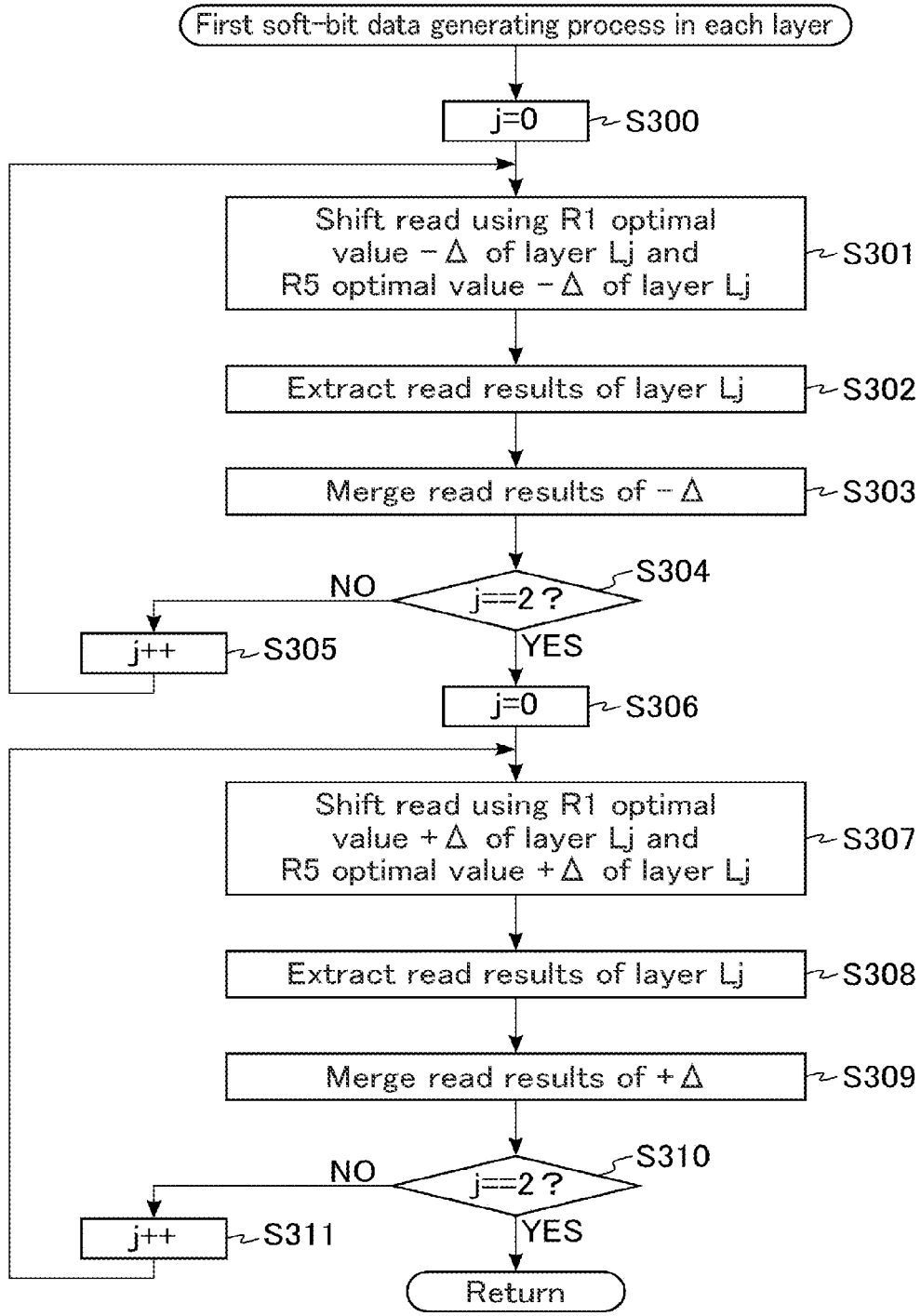
FIG. 38 is a flowchart showing an example of the first soft-bit data generating processing for each layer in the memory system according to the third embodiment.

FIG. 38 is a flowchart showing an example of the first soft-bit data generating process in each layer in the memory system 1 according to the third embodiment. FIG. 38 shows a specific example of an operation when the first soft-bit data generating process is performed when a lower page is a target. The CPU 230 uses, for example, the second counter in the tracking read process. In the following, descriptions will be given, taking the value of the second counter as a variable "j".

As shown in FIG. 38, upon commencement of a first soft-bit data generating process in step S40, the CPU 230 resets the second counter (step S300). In other words, the CPU 230 performs the processing of "j=0". The value of the second counter indicates the layer location of the memory cell transistors MC.

Next, the CPU 230 selects a word line WLn and causes the memory device 100 to perform a shift read operation using (R1 optimal value−Δ) and (R5 optimal value−Δ) of the layer Lj, and causes the RAM 220 to store a result of the shift read operation received from the memory device 100 (step S301). "R1 optimal value−Δ" is a read voltage obtained by subtracting a predetermined value "Δ" from the optimal value of the read voltage R1 of the layer Lj calculated in step S30. "R5 optimal value−Δ" is a read voltage obtained by subtracting a predetermined value "Δ" from the optimal value of the read voltage R5 of the layer Lj calculated in step S30. The predetermined value "Δ" subtracted from the read voltage R1 may be the same as or differ from the predetermined value "Δ" subtracted from the read voltage R5.

Next, the CPU 230 extracts a result of reading the layer Lj from a result of the shift read operation obtained in step S301 (step S302). Specifically, the CPU 230 extracts the read result of the memory cell transistors MC corresponding to the layer Lj in accordance with the output order of the read data, as described above with reference to FIG. 19.

Next, the CPU 230 merges the read operation result of $-\Delta$ (step S303). This method of merging the read operation result of $-\Delta$ is the same as the method described with reference to FIG. 36, for example.

Next, the CPU 230 checks if the value of the second counter reaches a predetermined value (step S304).

Specifically, the CPU 230 checks whether or not "j==2" is satisfied. The value of the determination in step S304 may be changed in accordance with the number of stacks of the memory cell transistors MC.

In step S304, if "j==2" is not satisfied (No in step S304), the CPU 230 increments the value of the second counter (j++ in step S305) and returns to step S301.

In step S304, if "j==2" is satisfied (Yes in step S304), the CPU 230 resets the second counter (step S306). In other words, the CPU 230 performs the processing of "j=0".

Next, the CPU 230 selects a word line WLn and causes the memory device 100 to perform a shift read operation using an R1 optimal value+$\Delta$ and an R5 optimal value+$\Delta$ of the layer Lj, and causes the RAM 220 to store a result of the shift read operation received from the memory device 100 (step S307). "R1 optimal value+$\Delta$" is a read voltage obtained by adding a predetermined value "$\Delta$" to the optimal value of the read voltage R1 of the layer Lj calculated in step S30. "R5 optimal value+$\Delta$" is a read voltage obtained by adding a predetermined value "$\Delta$" to the optimal value of the read voltage R5 of the layer Lj calculated in step S30. The predetermined value "$\Delta$" added to the read voltage R1 may be the same as or differ from the predetermined value "$\Delta$" added to the read voltage R5.

Next, the CPU 230 extracts a result of reading the layer Lj from a result of the shift read operation obtained in step S307 (step S302). Specifically, the CPU 230 extracts the read result of the memory cell transistors MC corresponding to the layer Lj in accordance with the output order of the read data, as described above with reference to FIG. 19.

Next, the CPU 230 merges the read operation result of +$\Delta$ (step S303). This method of merging the read operation result of +$\Delta$ is the same as the method described with reference to FIG. 36, for example.

Next, the CPU 230 checks if the value of the second counter reaches a predetermined value (step S310). Specifically, the CPU 230 checks whether or not "j==2" is satisfied. The value of the determination in step S310 may be changed in accordance with the number of stacks of the memory cell transistors MC.

In step S310, if "j==2" is not satisfied (No in step S310), the CPU 230 increments the value of the second counter (j++ in step S311) and returns to step S307.

In step S311, if "j==2" is satisfied (Yes in step S310), the CPU 230 finishes the first soft-bit data generating process in each layer (Return). In other words, the CPU 230 completes the processing in step S40 and proceeds to step S41.

In the first soft-bit data generating process in each layer, the read result merged by the iteration of step S303 corresponds to the soft bit of $-\Delta$, and the read result merged by the iteration of step S309 corresponds to the soft bit of +$\Delta$. The CPU 230 may perform the first soft-bit data generating process in each layer using a method other than the method described with reference to FIG. 38. The CPU 230 may change the order of the processing shown in FIG. 38 as appropriate or may adopt different operations, as long as similar results are obtained. The CPU 230 can perform a first soft-bit data generating process in each layer to a page other than a lower page in a similar manner.

[3-1-3] First Soft-Bit Decoding Processing

In the third embodiment, the RAM 220 of the memory controller 200 stores a log likelihood ratio (LLR) table. The log likelihood ratio table (hereinafter "LLR table") is referred to by the ECC circuit 260 in the soft-bit decoding processing. The LLR table holds the relationship between each divided range when the range of the threshold voltage that the memory cell transistors MC may have is divided into multiple ranges and a log likelihood ratio (LLR) value. The LLR value indicates a reliability (likelihood) of the data that is read at a certain read voltage, and the LLR value is confirmed by pre-evaluation.

FIG. 39 is a schematic diagram showing an example of setting of the LLR table in the memory system 1 according to the third embodiment. FIG. 39 shows an example of the LLR table of the case where two types of soft-bit data ($-\Delta$ soft-bit data SB1 and +$\Delta$ soft-bit data SB2) are used in the first soft-bit decoding processing on a lower page. The data allocation and the LLR values in each LLR table is merely an example. Any LLR values can be used as long as they are preset in accordance with pre-evaluation using the set read voltages of soft-bits.

In the example shown in FIG. 39, R1_M and R5_M are set as read voltages of the $-\Delta$ soft-bit data SB1, and R1_P and R5_P are set as read voltages of the +$\Delta$ soft-bit data SB1. As a read voltage for a one-level read operation, the read voltage R3 is set. In the present example, the LLR values of the lower page are determined based on the bit-data OB of the one-level read operation, the hard-bit data HB of the lower page, and the $-\Delta$ and +$\Delta$ soft-bit data SB1 and SB2. Listed below is an example of data allocation and the LLR values of the LLR table:

(Example) "bit-data OB of one-level read operation/hard-bit data HB of lower page/$-\Delta$ soft-bit data SB1/+$\Delta$ soft-bit data SB2": "LLR value"
"1111": "$-Na$"
"1101": "$-Nb$"
"1001": "$Nb$"
"1000": "$Na$"
"0000": "$Na$"
"0010": "$Nb$"
"0110": "$-Nb$"
"0111": "$-Na$"

Thus, in this LLR table, eight combinations of bit-data OB of a one-level read operation, hard-bit data HB of a lower page, and $-\Delta$ and +$\Delta$ soft-bit data SB1 and SB2 are formed. Furthermore, an LLR value of a lower bit is allocated to each of the formed eight combinations.

The absolute value of "Na" is greater than the absolute value of "Nb". The magnitude of the absolute value of the LLR value indicates a likelihood that the hard bit="0" data. For example, a smaller absolute value of the LLR value indicates that the ratio of the erroneously read bits is lower in two neighboring states. The ECC circuit 260 uses such an LLR table to perform first soft-bit decoding processing on lower-page data.

[3-2] Advantageous Effects of Third Embodiment

As described above, the memory system 1 of the third embodiment performs first soft-bit decoding processing in each layer, which has a higher error correction capability than in the hard bit decoding, after the tracking read operation and the optimal value read operation described in the second embodiment are performed. It is thus possible for the memory system 1 of the third embodiment to correct errors at a higher success rate than in the second embodiment and to retrieve data of a page in which the fail bit count FBC increases. As a result, the memory system 1 of the third embodiment is able to improve reliability of data stored in the memory system 1 compared to the second embodiment.

[4] Fourth Embodiment

The memory system 1 of the fourth embodiment has a hardware configuration similar to that of the memory system 1 of the first embodiment. The fourth embodiment relates to a third example of the retry sequence described in the first embodiment. In the following, differences of the semiconductor system 1 of the fourth embodiment from the first to third embodiments will be described.

[4-1] Operation

The memory system 1 of the fourth embodiment further performs second soft-bit decoding processing in the retry sequence. The second soft-bit decoding processing is soft-bit decoding using a read result of word lines WL adjacent to a selected word line WLsel. The retry sequence in the fourth embodiment and the second soft-bit decoding processing will be explained below.

[4-1-1] Retry Sequence

Figure 40:
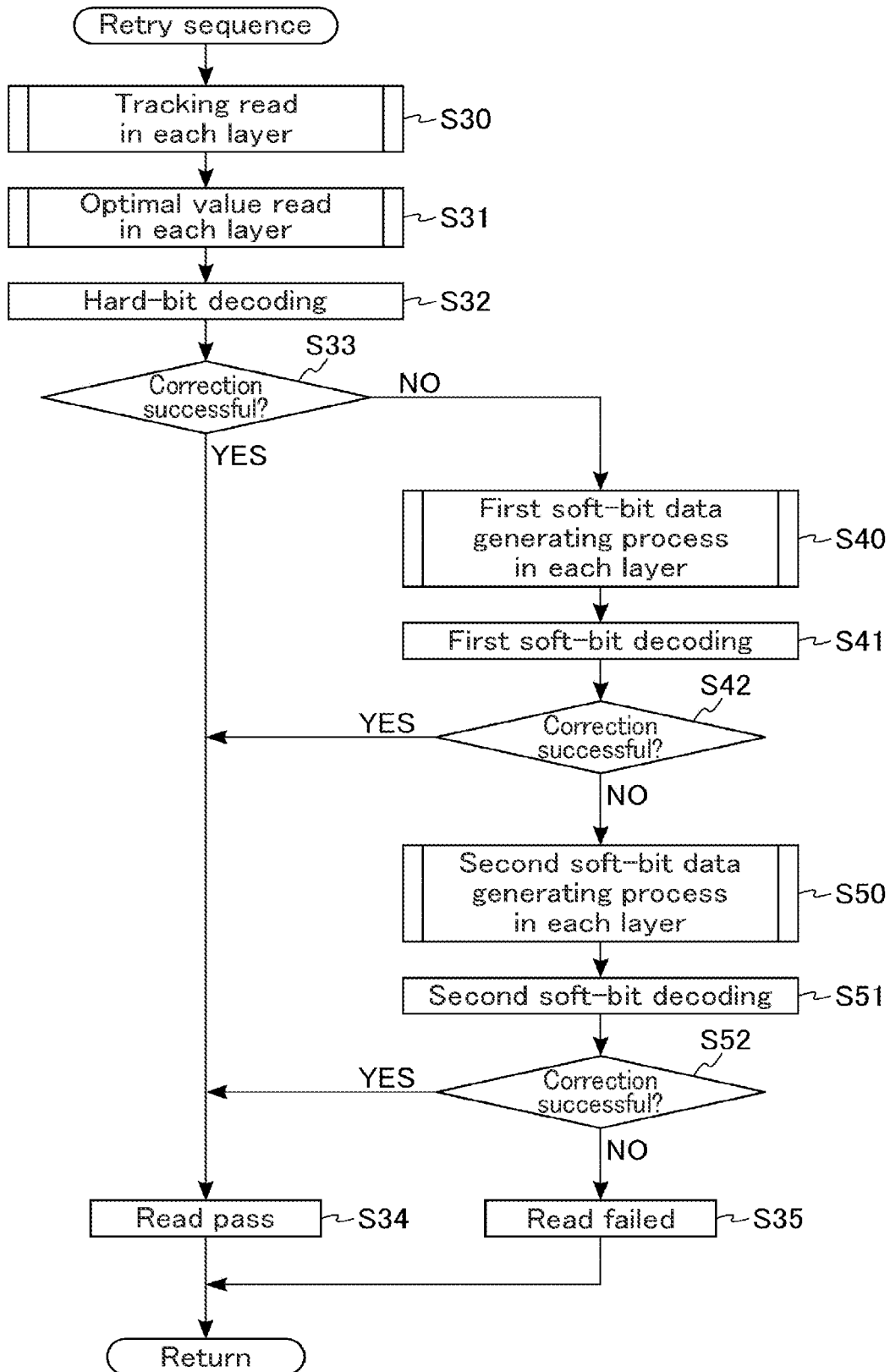
FIG. 40 is a flowchart showing an example of the retry sequence of the memory system according to the fourth embodiment.

FIG. 40 is a flowchart showing an example of the retry sequence of the memory system 1 according to the fourth embodiment.

As shown in FIG. 40, upon commencement of a retry sequence in step S16 of FIG. 20, the CPU 230 performs a tracking read operation in each layer (step S30), similarly to the second embodiment. Next, the CPU 230 performs an optimal value read operation in each layer (step S31), similarly to the second embodiment. Thereafter, the CPU 230 causes the ECC circuit 260 to perform error correction processing (hard-bit decoding processing) on the read result of the optimal value read operation (step S32), similarly to the second embodiment.

If the error correction in step S32 was successful (Yes in step S33), the CPU 230 determines the result of the read operation in the page as "read pass" (step S34) and finishes the retry sequence (Return).

If the error correction in step S32 failed (No in step S33), the CPU 230 performs a first soft-bit data generating process in each layer (step S40), similarly to the third embodiment. Next, the CPU 230 performs first soft-bit decoding (step S41), similarly to the third embodiment.

If it is determined in step S42 that the error correction was successful (Yes in step S42), the CPU 230 determines the result of the read operation in the page as "read pass" (step S34) and finishes the retry sequence (Return).

If it is determined in step S42 that the error correction failed (No in step S42), the CPU 230 performs a second soft-bit data generating process in each layer (step S50). The CPU 230 then performs second soft-bit decoding processing using a read result of step S30, a read result of step S40, and a read result of step S50 (step S51). The details of the second soft-bit data generating process and the second soft-bit decoding processing will be described later.

If it is determined in step S52 that the error correction was successful (Yes in step S52), the CPU 230 determines the result of the read operation in the page as "read pass" (step S34) and finishes the retry sequence (Return).

If it is determined in step S52 that the error correction failed (No in step S52), the CPU 230 determines the result of the read operation in the page as "read failed" (step S35) and finishes the retry sequence (Return).

[4-1-2] Second Soft-Bit Data Generating Process

Figure 41:
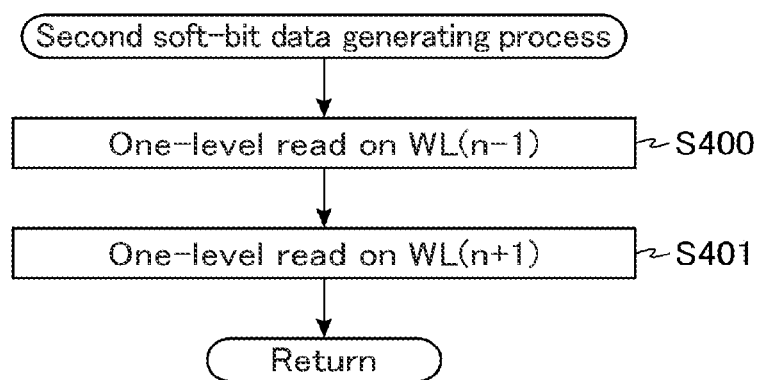
FIG. 41 is a flowchart showing an example of the second soft-bit data generating processing in the memory system according to the fourth embodiment.

FIG. 41 is a flowchart showing an example of the second soft-bit data generating processing in the memory system 1 according to the fourth embodiment. FIG. 41 shows a specific example of an operation in the case where the second soft-bit data generating process is performed on a lower page.

As shown in FIG. 41, upon commencement of the second soft-bit data generating process in step S50, the CPU 230 causes the memory device 100 to perform a one-level read operation in which a word line WL(n−1) adjacent to the word line WLn, which is a target of the retry sequence, is selected and causes the RAM 220 to store a result of the one-level read operation received from the memory device 100 (step S400). As the read voltage used in this one-level read operation, the same read voltage as that used in the one-level read operation in step S100 of FIG. 33 in which a word line WLn is selected is used, for example. In the present example, the CPU 230 uses the read voltage R3 for the one-level read operation in step S400.

The CPU 230 causes the memory device 100 to perform a one-level read operation in which a word line WL(n+1) adjacent to the word line WLn targeted for the retry sequence is selected and causes the RAM 220 to store a result of the one-level read operation received from the memory device 100 (step S401). As the read voltage used in this one-level read operation, the same read voltage as that used in the one-level read operation in step S100 in which a word line WLn is selected is used, for example. In the present example, the CPU 230 uses the read voltage R3 for the one-level read operation in step S401, similarly to step S400.

Upon completion of the process in step S400 and step S401, the CPU 230 finishes the second soft-bit data generating process (Return). In other words, the CPU 230 completes the processing in step S50 and proceeds to step 351. The order of performing the one-level read operation may be changed between step 3400 and step S401. The CPU 230 can perform the second soft-bit data generating process to a page other than a lower page in a similar manner.

[4-1-3] Second Soft-Bit Decoding Processing

FIG. 42 is a schematic diagram showing an example of setting of the LLR table in the memory system 1 according to the fourth embodiment. FIG. 42 shows an example of the LLR table of the case where two types of soft-bit data used in the first soft-bit decoding processing, and bit data of one-level read operations on the adjacent word lines WL(n−1) and WL(n+1) are used in the second soft-bit decoding processing on the lower page. The data allocation and the LLR values in each LLR table is merely an example. Any LLR values can be used as long as they are preset in accordance with pre-evaluation using the set read voltages of soft-bits.

In the example shown in FIG. 42, the LLR values of the lower page are determined based on the bit data OB of the one-level read operation, the hard-bit data HB of the lower page, the −Δ and +Δ soft-bit data SB1 and SB2, and the bit data OBa and OBb of the one-level read operation on the adjacent word lines WL(n−1) and WL(n+1).

In the following, for the sake of brevity, the case where "bit data OB of one-level read operation/hard-bit data HB of lower page/−Δ soft-bit data SB1/+Δ soft-bit data SB2" is "1001" will be described below. In the second soft-bit decoding processing, a combination of bit data OBa and OBb of one-level read operations on the adjacent word lines WL(n−1) and WL(n+1) listed below is added to every data combination in the first soft-bit decoding processing.

(Example) "Bit data OBa of one-level read operation on adjacent word line WL(n−1)/bit data OBb of one-level read operation on adjacent word line WL(n+1)": "LLR value"

"11": "Nb1"
"10": "Nb2"
"01": "Nb3"
"00": "Nb4"

Thus, in the present LLR table, four combinations are added to every data combination in the first soft-bit decoding processing. Furthermore, an LLR value of a lower bit is allocated to each of the added four combinations. For example, the magnitude of the absolute values is set to "Nb1>Nb2=Nb3>Nb4". For example, a smaller absolute value of the LLR value indicates that the ratio of the erroneously read bits is lower in two neighboring states. The ECC circuit 260 uses such an LLR table to perform second soft-bit decoding processing on lower-page data.

[4-2] Advantageous Effects of Fourth Embodiment

As described above, the memory system 1 of the fourth embodiment performs, after the first soft-bit decoding processing described in the third embodiment is performed, second soft-bit decoding processing in each layer, which has a higher error correction capability than in the first soft-bit decoding processing. It is thus possible for the memory system 1 of the fourth embodiment to correct errors at a higher success rate than in the third embodiment and to retrieve data of a page in which the fail bit count FBC increases. As a result, the memory system 1 of the fourth embodiment is able to improve reliability of data stored in the memory system 1 compared to the third embodiment.

[5] Fifth Embodiment

The memory system 1 of the fifth embodiment differs from the memory system 1 of the first embodiment in the number of stacks of the memory cell transistors MC. Furthermore, in the fifth embodiment, the relationship between the stack location of the memory cell transistors MC and the signal DQ is fixed. In the following, differences of the semiconductor system 1 of the fifth embodiment from the first to fourth embodiments will be described.

[5-1] Configuration

[5-1-1] Structure of Memory Cell Array 18

Figure 43:
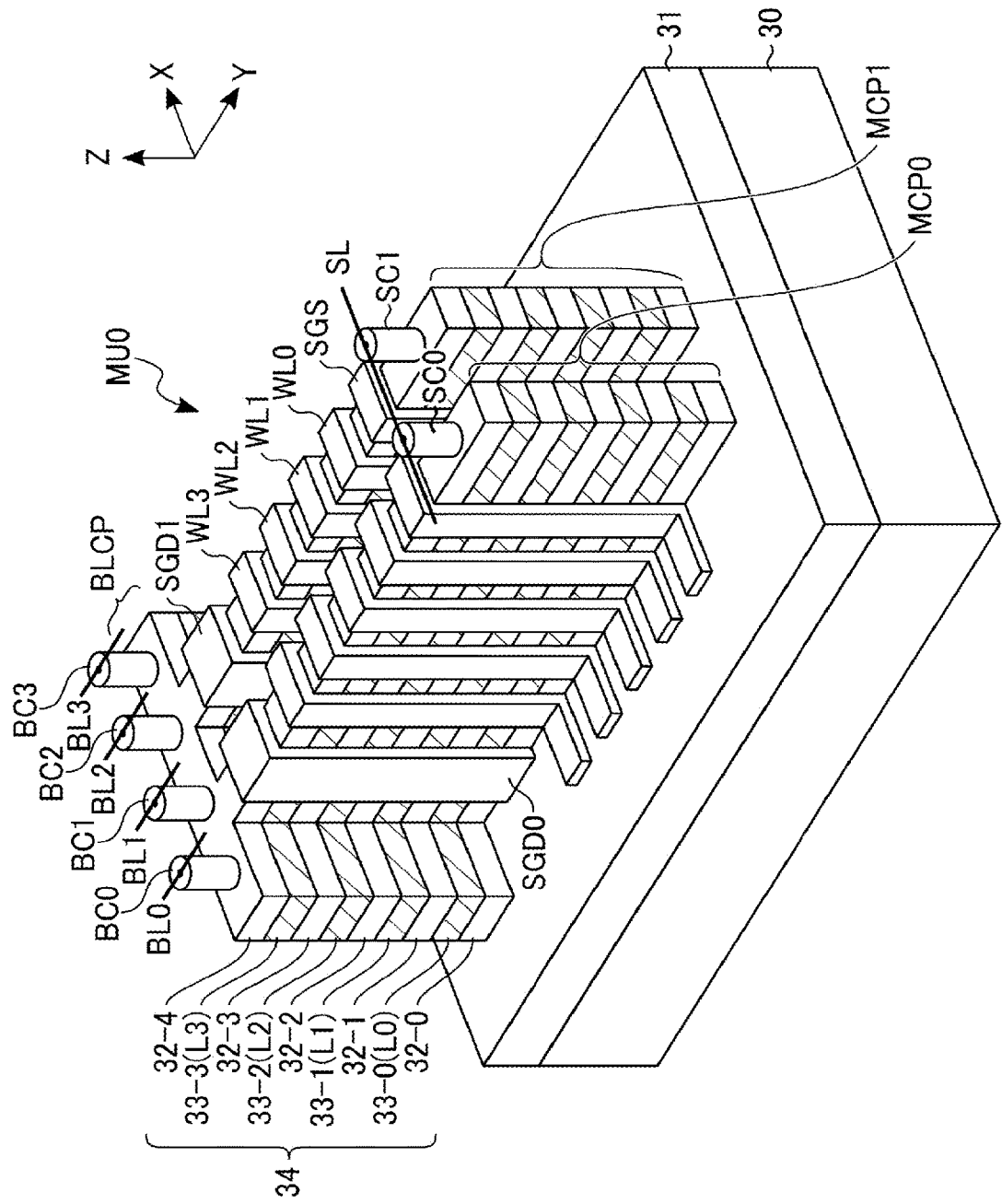
FIG. 43 is a perspective view showing a configuration example of a memory cell array included in the memory device of the memory system according to the fifth embodiment.

FIG. 43 is a perspective view showing a configuration example of the memory cell array 18 included in the memory device 100 of the memory system 1 according to the fifth embodiment. FIG. 43 shows an area that includes a multi-layer body 34 corresponding to a single memory unit MU0. As shown in FIG. 43, the multi-layer body 34 in the fifth embodiment includes a semiconductor layer 33-3 and an insulating layer 32-4 in addition to those layers included in the multi-layer body 34 of the first embodiment. The semiconductor layer 33-3 is provided on the insulating layer 32-3. An insulating layer 32-4 is provided on the uppermost semiconductor layer 33-3. That is, the multi-layer body 34 in the fifth embodiment includes five insulating layers 32 and four semiconductor layers 33. Hereinafter, the interconnect layers that include the semiconductor layers 33-0 through 33-3 respectively will be referred to as "layer L0", "layer L1", "layer L2", and "layer L3".

The semiconductor layers 33-0 through 33-3 of each memory cell part MCP correspond to the NAND strings NS0 through NS3, respectively. The bit lines and the NAND strings NS are coupled to each other via the semiconductor layers 33 and the contact plugs BC of the bit-line connecting part BLCP. Specifically, the bottoms of the contact plugs BC0 through BC3 are electrically coupled to the semiconductor layers 33-0 through 33-3, respectively. The bit lines BL0 through BL3 are electrically coupled via the upper surfaces of the contact plugs BC0 through BC3. Each contact plug BC is electrically insulated from the semiconductor layers 33 other than the semiconductor layer 33 electrically coupled at the bottom.

The side surface or bottom surface of the contact plug SC0 is electrically coupled to each of the semiconductor layers 33-0 through 33-3 of the other side of the memory cell part MCP0. The side surface or bottom surface of the contact plug SC1 is electrically coupled to each of the semiconductor layers 33-0 through 33-3 of the other side of the memory cell part MCP1. The source line SL is electrically coupled via the upper surfaces of the contact plugs SC0 and SC1. On the side and upper surfaces of the multi-layer body 34, a tunnel insulating film, a charge storage layer, and a block insulating film are stacked (illustrations thereof are omitted). Similarly to the first embodiment, the select gate line SGS, the word lines WL0 through WL3, and the select gate lines SGD are, in this order toward the bit-line connecting part BLCP side, arranged between the part to which the contact plug SC of the memory cell MCP is coupled and the bit-line connecting part BLCP.

[5-1-2] Configuration of Sense Amplifier Module 21 and Data Register 22

FIG. 44 is a block diagram showing an example of configurations of the sense amplifier module 21 and the data register 22 included in the memory device 100 of the memory system 1 according to the fifth embodiment. As shown in FIG. 44, in the memory device 100 of the fifth embodiment, the sequencer 15 generates four types of control signals, STB0 to STB3, in accordance with the number of the layers of the memory cell transistors MC.

Specifically, the sequencer 15 generates the control signals STB0 through STB3 associated with the layers L0 through L3. Then, the sequencer 15 inputs the control signal STB0 to the sensing circuit SA of a sense amplifier unit SAU(k×4) coupled to a bit line BL(k×4); the control signal STB1 to the sensing circuit SA of a sense amplifier unit SAU(1+k×4) coupled to a bit line BL(1+k×4); the control signal STB2 to the sensing circuit SA of a sense amplifier unit SAU(2+k×4) coupled to a bit line BL(2+k×4); the control signal STB3 to the sensing circuit SA of a sense amplifier unit SAU(3+k×4) coupled to a bit line BL(3+k×4). The other hardware configurations of the memory system 1 of the fifth embodiment are similar to those of the memory system 1 of the first embodiment.

[5-2] Operation

[5-2-1] Relationship Between Signal DQ and Memory Cell Array 18

FIG. 45 is a table showing an example of output signals output from the memory device to the memory controller in a read operation in the memory system 1 according to the fifth embodiment. FIG. 45 shows read data allocated to the output signal (signal DQ[7:0]) in each output cycle of read data. The data D0 through data D39 each indicate data read respectively from the memory cell transistors MC coupled to the bit lines BL0 through BL39.

As shown in FIG. 45, in the first cycle of read data output, the signals DQ0 through DQ7 are stored in the data D0 through D7, respectively. In the second cycle of read data output, the signals DQ0 through DQ7 are stored in the data D8 through D15, respectively. In the third cycle of read data output, the signals DQ0 through DQ7 are stored in the data D16 through D23, respectively. In the fourth cycle of read data output, the signals DQ0 through DQ7 are stored in the data D24 through D31, respectively. In the fifth cycle of read data output, the signals DQ0 through DQ7 are stored in the data D32 through D39, respectively. Thereafter the data is output from the memory device 100 to the memory controller 200 in a similar manner.

In the present example, the data D(k×4) (k is an integer equal to or greater than 0) corresponds to read data from the memory cell transistors MC provided in the layer L0, namely read data from the memory cell transistors MC included in the NAND string NS0. The data D(1+k×4) corresponds to read data from the memory cell transistors MC provided in the layer L1, namely read data from the memory cell transistors MC included in the NAND string NS1. The data D(2+k×4) corresponds to read data from the memory cell transistors MC provided in the layer L2, namely read data from the memory cell transistors MC included in the NAND string NS2. The data D(3+k×4) corresponds to read data from the memory cell transistors MC provided in the layer L3, namely read data from the memory cell transistors MC included in the NAND string NS3.

Thus, the allocation of signals DQ in which read data is output may be fixed. Furthermore, in the fifth embodiment, the correspondence between the output read data and the layer L is cyclic in the sequence of the layer L0 to the layer L3. Thus, the CPU 230 is able to know which layer L the received read data corresponds to through ascertaining via which signal DQ the read data is received.

[5-2-2] Optimal Value Calculation in Each Layer

FIG. 46 is a table showing an example of read data targeted for counting in each layer in the memory system 1 according to the fifth embodiment. The content of the table shown in the upper part of FIG. 46 is the same as that shown in FIG. 45. The lower part of FIG. 46 indicates combinations of a layer targeted for counting and read data.

As shown in the lower part of FIG. 46, if the layer targeted for counting is "L0", the CPU 230 extracts the (1+k×4)-th read data (k is an integer equal to or greater than 0) in the order of outputting read data. Specifically, the CPU 230 extracts the data D0, D4, D8, D12, D16, D20, D24, D28, . . . as read data targeted for counting in the layer L0. In other words, the path to which the read data of the layer L0 is output is fixed to either the signal DQ0 or DQ4.

If the layer targeted for counting is "L1", the CPU 230 extracts the (2+k×4)-th read data in the order of outputting read data. Specifically, the CPU 230 extracts data D1, D5, D9, D13, D17, D21, D25, D29, . . . as read data targeted for counting in the layer L1. In other words, the path to which the read data of the layer L1 is output is fixed to either the signal DQ1 or DQ5.

If the layer targeted for counting is "L2", the CPU 230 extracts the (3+k×4)-th read data in the order of outputting read data. Specifically, the CPU 230 extracts the data D2, D6, D10, D14, D18, D22, D26, D30, . . . as read data targeted for counting in the layers L2. In other words, the path to which the read data of the layer L2 is output is fixed to either the signal DQ2 or DQ6.

If the layer targeted for counting is "L3", the CPU 230 extracts the (4+k×4)-th read data in the order of outputting read data. Specifically, the CPU 230 extracts the data D3, D7, D11, D15, D19, D23, D27, D31, . . . as read data targeted for counting in the layers L3. In other words, the path to which the read data of the layer L3 is output is fixed to either the signal DQ3 or DQ7.

As described above, the CPU 230 extracts read data for each layer in accordance with the order of outputting data so as to extract the read data of each layer. Furthermore, in the fifth embodiment, the relationship between the layers of the memory cell transistors MC and the signal DQ is fixed. Thus, the CPU 230 can easily collect read data of each layer by allocating data to the signals DQ.

[5-2-3] Optimal Value Read Operation

FIG. 47 is a table showing an example of read data merged by a read operation in the memory system 1 according to the fifth embodiment. FIG. 47 shows read data of a first eight bits allocated to the output signal (signal DQ[7:0]) in each layer targeted for an optimal value read operation. To the read data of the layers L0 "_L0" is added. To the read data of the layers L1 "_L1" is added. To the read data of the layers L2 "_L2" is added. To the read data of the layers L3 "_L3" is added. The merged data is a combination of read results merged by the CPU 230 in the optimal value read operation in each layer. As shown in FIG. 47, the CPU 230 synthesizes read results of the optimal value read operations.

In the present example, the (1+k×4)-th read data (k is an integer equal to or greater than 0) in the order of outputting read data corresponds to the layer L0. For this reason, the CPU 230 extracts data D0_L0, data D4_L0, . . . from the read results of the optimal value read operations in the layer L0 and stores the data in the merged data.

In the present example, the read data to be output (2+k×4)-th in the order of outputting read data corresponds to the layers L1. For this reason, the CPU 230 extracts data D1_L1, data D5_L1, . . . from the read results of the optimal value read operations in the layer L1 and stores the data in the merged data.

In the present example, the (3+k×4)-th read data in the order of outputting read data corresponds to the layer L2. For this reason, the CPU 230 extracts data D2_L2, data D6_L2, . . . from the read results of the optimal value read operations in the layer L2 and stores the data in the merged data.

In the present example, the (4+k×4)-th read data in the order of outputting read data corresponds to the layer L3. For this reason, the CPU 2330 extracts data D3_L3, data D7_L3, . . . from the read results of the optimal value read operations in the layer L3 and stores the data in the merged data.

The CPU 230 generates merged data as described above, and the ECC circuit 260 refers to the generated merged data and performs hard-decision decoding processing S32. If there are multiple layers having the same correction values of the read voltages, the CPU 230 may integrate optimal value read operations for the multiple layers and perform a single operation. In this case, the number of times of optimal value read operations performed by the CPU 230 becomes smaller than the number of multi-layer bodies of the memory cell transistors MC.

The CPU 230 may extract a result using the same read voltage as the optimal value read operation from the data of the tracking read operation stored in the buffer memory 240. In this case, the CPU 230 can reduce the number of times of performing the optimal value read operations and can enhance the speed of the retry sequence processing.

[5-3] Advantageous Effects of Fifth Embodiment

As described above, the memory system 1 of the fifth embodiment fixes the correspondence between the stack location (layer) of the memory cell transistors MC and the signal DQ[7:0]. It is thereby possible for the memory system 1 of the fifth embodiment to easily control the memory controller 200 when the operations described in the first to fourth embodiments are performed. As a result, the memory system 1 of the fifth embodiment can lower the difficulty in designing the memory controller 200 and can suppress the cost of manufacturing the memory system 1.

If the correspondence between the stack location of the memory cell transistors MC and the signal DQ is fixed, each of the number of stacks of memory cell transistors MC and the number of the signals DQ may be different to those in the examples. Even in such cases, the memory system 1 can achieve the same advantageous effects described in the fifth embodiment.

[6] Others

In the foregoing embodiments, in a read operation using the correction values of each layer, the CPU 230 may apply a plurality of read voltages to which the correction values of each layer are applied and perform determination processing in each layer. For example, the sequencer 15 sequentially applies the following voltages to a selected word line WLsel: the read voltage R1 to which the correction value of the layer L0 is applied; the read voltage R1 to which the correction value of the layer L1 is applied; and the read voltage R1 to which the correction value of the layer L2 applied. The sequencer 15 then asserts the control signal STB0 while the read voltage R1 to which the correction value of the layer L0 is applied is being applied to the selected word line WLsel; the control signal STB1 while the read voltage R1 to which the correction value of the layer L1 is applied is being applied to the selected word line WLsel; and the control signal STB2 while the read voltage R1 to which the correction value of the layer L2 is applied is being applied to the selected word line WLsel. The CPU 230 may thereby perform, in the R1 read operation, a determination process in which the correction values COL differing among the layers are applied. For the other read voltages the CPU 230 may similarly perform a determination operation in which the correction values COL differing between layers are applied.

In the first embodiment, the command sequence shown in FIG. 16 for example is used as a command sequence of a patrol read operation (read operation) in step S11. As the command sequence for a shift read operation in, for example, step S23 of the first embodiment, steps S102 and S201 of the second embodiment, or step S301 of the third embodiment, the command sequence shown in FIG. 17 is used, for example. As the command sequence for a one-level read operation in, for example, step S100 of the second embodiment and step S400 of the fourth embodiment, the command sequence shown in FIG. 27 is used, for example.

Each command used in the descriptions of the read operation, the shift read operation, and the one-level read operation may be replaced with a different command as appropriate. Any command may be used as long as the command has the functions described in the foregoing embodiments. In the command sequence in the shift read operation or the one-level read operation, the memory device 100 may temporarily shift to a busy state after receiving "XXh", "ZZh", "P0", "P1", "P2", or "P3".

In the foregoing embodiments, the correction operation in the patrol operation is not necessarily performed on all the word lines WL, as long as the operation is performed on at least representative word lines WL that are stationarily set.

In this case, the correction values of the read voltages corresponding to the word lines WL for which the correction operation is omitted are determined based on results of the correction operation performed on the representative word lines WL, for example. Since the failure detection by the patrol operation, on the other hand, is performed for the purpose of physical failures in adjacent word lines WLs, such as shortcuts, it is preferable if the failure detection is performed to all the word lines WL.

In the foregoing embodiments, the case is described in which a tracking read operation, first soft bit decoding processing, and second soft bit decoding processing are performed by the memory system 1 in a retry sequence of a patrol operation; however, the embodiments are not limited to this case. For example, the memory system 1 may perform the operations described in the second through fourth embodiments when the retry sequence of the read operation based on an instruction from the host device 2 is performed.

In the foregoing embodiments, if a patrol read operation in which a word line WL is selected is performed in units of pages, both of a page for which error correction was successful and a page for which error correction failed may occur in some cases. In this case, the memory system 1 may perform a retry sequence on a page for which error correction has failed, using correction values based on the correction values of a page for which error correction was successful.

In the third and fourth embodiments, the case is described where the shift amounts of the read voltages in a negative direction and positive direction are uniform in a soft-bit read operation; however, the embodiments are not limited to this case. For example, the width of the shift amount of the read voltage in the soft-bit read operation may not be uniform. Any read voltage may be used as the read voltage used in the read operation for soft-bit data, as long as it is a voltage value used in pre-evaluation and an appropriate LLR value is set for each divided area of a threshold distribution in the divided LLR table.

In the correction operation in the foregoing embodiments, the read page data and the corrected page data are temporarily stored in the RAM 220 or the buffer memory 240 of the memory controller 200, for example. The memory controller 200 may have a counter for counting differences in these temporarily stored page data items, namely the fail bit count. Each operation of the memory controller 200 in the foregoing embodiments may be realized through executing a firmware held in an ROM (read only memory), etc. in the memory controller 200 by the CPU 230, or through a dedicated circuit.

In the foregoing embodiments, the case in which a TLC scheme is adopted as a data storage scheme is described; however, the embodiments are not limited thereto. For example, the operations described in each of the first through fifth embodiments may be performed in the case where the memory cell transistors MC store 1-bit, 2-bit, 4-bit, or larger data.

In the present specification, "soft bit decoding processing" may include a read operation based on the LLR table. It is preferable that a read voltage that corresponds to a valley portion between two neighboring states calculated by a correction operation be used in the "optimal value read operation"; however, any read operation may be adopted as long as at least correction values are applied in the operation. In other words, an optimal value read operation may be any read operation as long as the correction value table is updated by the correction operation of the first embodiment or the tracking read operation of the second embodiment.

In the present description, the term "coupled" means an electrical coupling, and does not exclude a coupling with an element being interposed in the coupling, for example. The "H"-level of a voltage indicates a level at which an n-channel MOS transistor is turned to an on state and a p-channel MOS transistor is turned to an off state. The "L"-level of a voltage indicates a level at which a p-channel MOS transistor is turned to an on state and an n-channel MOS transistor is turned to an off state.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a memory device that includes first and second memory cells, a first word line, and first and second bit lines, the first memory cell and the second memory cell being stacked above a substrate, the first memory cell being provided on a first layer, the second memory cell being provided on a second layer different from the first layer, the first word line being coupled to the first memory cell and the second memory cell, the first bit line being coupled to the first memory cell, and the second bit line being coupled to the second memory cell; and
a memory controller that controls the memory device, the memory controller including a storage circuit storing a correction value table, the correction value table storing a first correction value of a read voltage associated with the first layer and a second correction voltage of a read voltage associated with the second layer, wherein
the memory controller:
selects the first word line and instructs the memory device to perform, with different amounts of shift of read voltages, a read operation multiple times for first-page data which is a set of first-bit data;
calculates a first shift amount of a read voltage optimized for the first layer and a second shift amount of a read voltage optimized for the second layer based on a plurality of first-page data received from the memory device through the read operation performed multiple times; and
selects the first word line and instructs the memory device to read the first-page data using a first read voltage to which the first shift amount is applied and to read the first-page data using a second read voltage to which the second shift amount is applied,
the memory device applies the first read voltage to the first word line to read the first-page data using the first read voltage,
the memory device applies the second read voltage to the first word line to read the first-page data using the second read voltage, and
the memory controller further:
extracts a first data set corresponding to the first layer from the first-page data that is read through using the first read voltage,
extracts a second data set corresponding to the second layer from the first-page data that is read through using the second read voltage,
generates a third data set by combining the first data set and the second dataset: and
performs hard bit decoding on the third data set.

2. The memory system of claim 1, wherein the memory controller further:
selects the first word line and instructs the memory device to perform a read operation for the first-page data using a third read voltage, which is the first read voltage shifted in a negative direction, and performs a read operation for the first-page data using a fourth read voltage, which is the first read voltage shifted in a positive direction;
extracts a fourth data set corresponding to the first layer from the first page data using the third read voltage, extracts a fifth data set corresponding to the second layer from the first page data using the fourth read voltage, and generates a sixth data set obtained by combining the fourth data set with the fifth data set;
selects the first word line and instructs the memory device to perform a read operation for the first-page data with a use of a fifth read voltage, which is the second read voltage shifted in a negative direction, and performs a read operation for the first-page data with a use of a sixth read voltage, which is the second read voltage shifted in a positive direction;
extracts a seventh data set corresponding to the first layer from the first-page data using the fifth read voltage, extracts an eighth data set corresponding to the second layer from the first-page data using the sixth read voltage, and generates a ninth data set by combining the seventh data set with the eighth data set; and
performs soft bit decoding using the third data set, the sixth data set, and the ninth data set.

3. The memory system of claim 2, wherein the memory device further includes:
third and fourth memory cells each coupled to the first bit line and provided in a first direction parallel to a surface of the substrate, with the memory cell being interposed between third and fourth memory cells;
fifth and sixth memory cells each coupled to the second bit line and provided in the first direction, with the second memory cell being interposed therebetween;
a second word line coupled to the third and fifth memory cells; and
a third word line coupled to the fourth and sixth memory cells, and
the memory controller further:
selects the first word line and instructs the memory device to read data using a third voltage between a first voltage and a second voltage included in a set of read voltages for the first-page data;
selects the second word line and instructs the memory device to read data using a fourth voltage;
selects the third word line and instructs the memory device to read data using a fifth voltage; and
performs second soft bit decoding using data obtained by combining the third data set, the sixth data set, the ninth data set, a tenth data set read through a use of the third voltage, an eleventh data set read through a use of the fourth voltage, and data set read through a use of the fifth voltage.

4. The memory system of claim 2, wherein
the memory device applies the third read voltage to the first word line to read the first-page data using the third read voltage, the memory device applies the fourth read voltage to the first word line to read the first-page data using the fourth read voltage, the memory device applies the fifth read voltage to the first word line to read the first-page data using the fifth read voltage, and the memory device applies the sixth read voltage to the first word line to read the first-page data using the sixth read voltage.

5. The memory system of claim 1, wherein of the first-page data that has been read by the memory device, the memory controller regards data received first in an order as data corresponding to the first layer, and data received second in the order as data corresponding to the second layer.

6. The memory system of claim 1, further comprising:
a first signal line and a second signal line that couple the memory device to the memory controller and that are used to receive and transmit data, wherein
of the first page data that has been read from the memory device, the controller regards data received through the first signal line as data corresponding to the first layer and data received through the second signal line as data corresponding to the second layer.

7. The memory system of claim 1, wherein
the memory device further includes a first multi-layer body having a part extended in a second direction and a first conductive layer,
the first multi-layer body includes a first semiconductor layer and a second semiconductor layer above the first semiconductor layer, the first semiconductor layer and the second semiconductor layer are separately stacked above the substrate,
the first conductive layer has a part extended in a first direction intersecting the second direction in such a manner that it covers a side surface and an upper surface of the first multi-layer body, and is used as the first word line, and
the part in which the first semiconductor layer and the first conductive layer intersect with each other functions as the first memory cell, and the part in which the second semiconductor layer and the first conductive layer intersect with each other functions as the second memory cell.

8. The memory system of claim 7, wherein
the memory device further includes a first stacked film provided between the first multi-layer body and the first conductive layer in such a manner that the first stacked film covers a side surface and an upper surface of the first multi-layer body, and
the first stacked film includes a tunnel insulating film, a charge storage layer, and a block insulating film.

9. The memory system of claim 7, wherein
the memory device further includes a source line coupled to one end side of each of the first semiconductor layer and the second semiconductor layer,
the first bit line is coupled to an other end side of the first semiconductor layer, and
the second bit line is coupled to an other end of the second semiconductor layer.

10. The memory system of claim 7, wherein
the memory device further includes a first contact and a second contact,
the first contact is provided on the first semiconductor layer, and couples the first semiconductor layer to the first bit line, and the second contact is provided on the second semiconductor layer, and couples the second semiconductor layer to the second bit line.

11. The memory system of claim 10, wherein the first contact has a part provided penetrating the second semiconductor layer, the first contact and the second semiconductor layer are separated and insulated by an insulator.

12. The memory system of claim 7, wherein
the memory device further includes fifth and sixth memory cells, first through fourth select transistors, and first and second select gate lines,
the fifth memory cell and the sixth memory cell are coupled to the first word line,
the first select transistor is coupled between the first memory cell and the first bit line,
the second select transistor is coupled between the second memory cell and the second bit line,
the third select transistor is coupled between the fifth memory cell and the first bit line,
the fourth select transistor is coupled between the sixth memory cell and the second bit line,
the first select gate line is coupled to the first select transistor and the second select transistor, and
the second select gate line is coupled to the third select transistor and the fourth select transistor.

13. The memory system of claim 12, wherein
the memory device further includes a second multi-layer body having a part extended in the second direction and second and third conductive layers,
the second multi-layer body includes a third semiconductor layer and a fourth semiconductor layer above the third semiconductor layer, the third semiconductor layer and the fourth semiconductor layer are separately stacked above the substrate,
the first conductive layer further includes a part that covers a side surface and an upper surface of the second multi-layer body,
the second conductive layer has a part that covers a side surface and an upper surface of the first multi-layer body, is provided separately from the first conductive layer, and is used as the first select gate line,
the third conductive layer has a part that covers a side surface and an upper surface of the second multi-layer body, is provided separately from the first conductive layer, and is used as the second select gate line,
the part in which the third semiconductor layer and the first conductive layer intersect with each other functions as the fifth memory cell, and the part in which the fourth semiconductor layer and the first conductive layer intersect with each other functions as the sixth memory cell,
the part in which the first semiconductor layer and the second conductive layer intersect with each other functions as the first select transistor, and the part in which the second semiconductor layer and the second conductive layer intersect with each other functions as the second select transistor, and
the part in which the third semiconductor layer and the first conductive layer intersect with each other functions as the third select transistor, and the part in which the fourth semiconductor layer and the third conductive layer intersect with each other functions as the fourth select transistor.

14. The memory system of claim 13, wherein the memory device includes a first stacked film having a first part and a second part, the first part being provided between the first multi-layer body and the first conductive layer in such a manner that it covers a side surface and an upper surface of the first multi-layer body, the second part being provided between the second multi-layer body and the first conductive layer in such a manner that it covers a side surface and an upper surface of the second multi-layer body, and the first stacked film includes a tunnel insulating film, a charge storage layer, and a block insulating film.

15. The memory system of claim 14, wherein the memory device includes a second stacked film and a third stacked film, the second stacked film being provided between the first multi-layer body and the second conductive layer in such a manner that it covers a side surface and an upper surface of the first multi-layer body, the third stacked film being provided between the second multi-layer body and the third conductive layer in such a manner that it covers a side surface and an upper surface of the second multi-layer body, and the first stacked film, the second stacked film, and the third stacked film have a same layer structure.

* * * * *